United States Patent
Min et al.

(10) Patent No.: US 12,463,182 B2
(45) Date of Patent: Nov. 4, 2025

(54) LIGHT-EMITTING DIODE, AND DISPLAY DEVICE INCLUDING LIGHT-EMITTING DIODE

(71) Applicant: Samsung Display Co., Ltd., Yongin-si (KR)

(72) Inventors: Jung Hong Min, Yongin-si (KR); Dong Uk Kim, Yongin-si (KR); Hyung Rae Cha, Yongin-si (KR); Dae Hyun Kim, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 927 days.

(21) Appl. No.: 17/250,826

(22) PCT Filed: Mar. 7, 2019

(86) PCT No.: PCT/KR2019/002669
§ 371 (c)(1),
(2) Date: Mar. 5, 2021

(87) PCT Pub. No.: WO2020/050468
PCT Pub. Date: Mar. 12, 2020

(65) Prior Publication Data
US 2021/0202450 A1    Jul. 1, 2021

(30) Foreign Application Priority Data
Sep. 7, 2018    (KR) .......................... 10-2018-0107323

(51) Int. Cl.
*H01L 25/075*    (2006.01)
*G06F 3/147*    (2006.01)
(Continued)

(52) U.S. Cl.
CPC .......... *H01L 25/0753* (2013.01); *G06F 3/147* (2013.01); *H10D 86/40* (2025.01);
(Continued)

(58) Field of Classification Search
CPC ....... G09G 3/32; H01L 27/1214; H01L 33/30; H01L 2933/0016; H01L 33/0062; G06F 3/147
See application file for complete search history.

(56) References Cited

U.S. PATENT DOCUMENTS

| 5,316,967 A | 5/1994 | Kaneno et al. |
| 7,982,236 B2 | 7/2011 | Sano et al. |

(Continued)

FOREIGN PATENT DOCUMENTS

| CN | 101237013 A | 8/2008 |
| JP | 5-267780 A | 10/1993 |

(Continued)

OTHER PUBLICATIONS

International Search Report for corresponding Application No. PCT/KR2019/002669 dated Jun. 20, 2019, 4pp.

*Primary Examiner* — Ratisha Mehta
*Assistant Examiner* — Mikka Liu
(74) *Attorney, Agent, or Firm* — Womble Bond Dickinson (US) LLP

(57) ABSTRACT

A light emitting element includes a first semiconductor layer; an active layer on a surface of the first semiconductor layer; a second semiconductor layer on the active layer; an insulating film to enclose an outer periphery of each of the first semiconductor layer, the active layer, and the second semiconductor layer; and an electrode layer on the second semiconductor layer. The first semiconductor layer includes a first area that is covered by the insulating film, and a second area that is not covered by the insulating film. A (Continued)

perimeter of the outer periphery of the first semiconductor layer in the first area and a perimeter of the outer periphery of the first semiconductor layer in the second area are different from each other.

10 Claims, 57 Drawing Sheets

(51) Int. Cl.
  *H10D 86/40* (2025.01)
  *H10D 86/60* (2025.01)
  *H10H 20/01* (2025.01)
  *H10H 20/821* (2025.01)
  *H10H 20/824* (2025.01)
  *H10H 20/832* (2025.01)
  *H10H 20/833* (2025.01)
  *H10H 20/84* (2025.01)
  *H10H 20/857* (2025.01)

(52) U.S. Cl.
  CPC .......... *H10D 86/60* (2025.01); *H10H 20/013* (2025.01); *H10H 20/018* (2025.01); *H10H 20/821* (2025.01); *H10H 20/824* (2025.01); *H10H 20/832* (2025.01); *H10H 20/833* (2025.01); *H10H 20/84* (2025.01); *H10H 20/857* (2025.01); *H10H 20/032* (2025.01); *H10H 20/034* (2025.01)

(56) References Cited

U.S. PATENT DOCUMENTS

| | | | |
|---|---|---|---|
| 8,148,238 B2 | 4/2012 | Taniguchi et al. | |
| 8,228,270 B2* | 7/2012 | Park | G09G 3/3225 345/55 |
| 8,482,027 B2 | 7/2013 | Seo et al. | |
| 9,190,587 B2 | 11/2015 | Marutani et al. | |
| 9,329,433 B2 | 5/2016 | Negishi et al. | |
| 9,570,425 B2 | 2/2017 | Do | |
| 9,608,170 B2* | 3/2017 | Kitahama | H01L 33/38 |
| 9,887,252 B2* | 2/2018 | Park | H10K 50/84 |
| 10,026,777 B2 | 7/2018 | Kang | |
| 10,340,419 B2 | 7/2019 | Kim et al. | |
| 10,497,680 B2 | 12/2019 | Sung et al. | |
| 2008/0185606 A1* | 8/2008 | Sano | H01L 33/38 257/E33.072 |
| 2008/0291455 A1* | 11/2008 | Holland | G01N 21/31 356/445 |
| 2009/0206362 A1* | 8/2009 | Sung | H01L 33/0093 257/E33.026 |
| 2010/0197054 A1 | 8/2010 | Yonehara | |
| 2010/0270592 A1* | 10/2010 | Ahn | B82Y 20/00 257/E29.097 |
| 2011/0133221 A1 | 6/2011 | Choi et al. | |
| 2013/0049036 A1 | 2/2013 | Jeong | |
| 2015/0255668 A1 | 9/2015 | Pan et al. | |
| 2016/0148911 A1 | 5/2016 | Do | |
| 2016/0149085 A1* | 5/2016 | Kashimoto | H01L 33/385 438/47 |
| 2016/0197232 A1* | 7/2016 | Bour | H01L 33/06 257/13 |
| 2018/0175104 A1 | 6/2018 | Kang et al. | |
| 2018/0188606 A1* | 7/2018 | Lee | G02F 1/133608 |

FOREIGN PATENT DOCUMENTS

| | | |
|---|---|---|
| JP | 2011-192722 A | 9/2011 |
| JP | 2011-197347 A | 10/2011 |
| JP | 2014-56994 A | 3/2014 |
| JP | 2015-067530 A | 4/2015 |
| JP | 2018-029189 A | 2/2018 |
| KR | 10-1122608 B1 | 3/2012 |
| KR | 10-1317979 B1 | 10/2013 |
| KR | 10-2014-0006428 A | 1/2014 |
| KR | 10-1426434 B1 | 8/2014 |
| KR | 10-1436123 B1 | 11/2014 |
| KR | 10-2015-0139680 A | 12/2015 |
| KR | 10-2016-0072447 A | 6/2016 |
| KR | 10-2018-0009014 A | 1/2018 |
| KR | 10-1830950 B1 | 2/2018 |
| KR | 10-2018-0071465 A | 6/2018 |
| KR | 10-1874993 B1 | 7/2018 |
| WO | WO 96/28852 A1 | 9/1996 |

* cited by examiner

LIGHT-EMITTING DIODE, AND DISPLAY DEVICE INCLUDING LIGHT-EMITTING DIODE

CROSS-REFERENCE TO RELATED APPLICATIONS

This application is a National Phase Patent Application of International Application No. PCT/KR2019/002669, filed Mar. 7, 2019, which claims priority to and the benefit of Korean Patent Application No. 10-2018-0107323, filed Sep. 7, 2018, the entire content of all of which is incorporated herein by reference.

TECHNICAL FIELD

Various embodiments of the present disclosure relate to a light emitting element, and more particularly, to a subminiature light emitting element, a method of manufacturing the light emitting element, and a display device including the light emitting element.

BACKGROUND ART

A light emitting diode (LED) may have relatively satisfactory durability even under poor environmental conditions, and have excellent performances in terms of lifetime and luminance. Recently, research on the technology of applying such LEDs to various display devices has become appreciably more active.

As a part of such research, technologies related to fabricating a LED having a very small size corresponding to the micro scale or the nano scale using an inorganic crystalline structure, e.g., a structure obtained by growing a nitride-based semiconductor are being developed.

LEDs may be fabricated in a small size enough to form a pixel of a display panel, etc. After the LEDs are independently grown on a substrate, the grown LEDs may be separated and used to manufacture the display panel. An insulating film is formed on an outer periphery (e.g., an outer circumference or an outer peripheral surface) of the LED. In the process of forming the insulating film, the LED may be damaged, thus resulting in the failure of the LED.

An aspect of the present disclosure is to provide a method of manufacturing a light emitting element, which may reduce or minimize the occurrence of the failure when the light emitting element is manufactured.

Furthermore, another aspect of the present disclosure is to provide a light emitting element, which secures a contact area of a first semiconductor layer (or a first conductive semiconductor layer), thus improving a contact rate with an electrode.

Furthermore, a further aspect of the present disclosure is to provide a display device having the above-described light emitting element.

According to an aspect of the present disclosure, a light emitting element may include a first conductive semiconductor layer; an active layer on a surface of the first conductive semiconductor layer; a second semiconductor layer (or a second conductive semiconductor layer) on the active layer; an insulating film to enclose an outer periphery of each of the first conductive semiconductor layer, the active layer, and the second conductive semiconductor layer; and an electrode layer disposed on the second conductive semiconductor layer. The first conductive semiconductor layer may include a first area that is covered by the insulating film, and a second area that is not covered by the insulating film.

A perimeter of an outer periphery of the first conductive semiconductor layer in the first area and a perimeter of an outer periphery of the first conductive semiconductor layer in the second area may be different from each other.

The first conductive semiconductor layer, the active layer, the second conductive semiconductor layer, and the electrode layer may be sequentially stacked to form an emissive stack pattern. The insulating film may include an inner side surface that corresponds to a surface of the emissive stack pattern, and an outer side surface that is opposite to the inner side surface and does not correspond to the surface of the emissive stack pattern. Here, the outer periphery of the first conductive semiconductor layer in the first area may coincide with the inner side surface of the insulating film, and the outer periphery of the first conductive semiconductor layer in the second area may coincide with the outer side surface of the insulating film.

The perimeter of the outer periphery of the first conductive semiconductor layer in the second area may be larger than the perimeter of the outer periphery of the first conductive semiconductor layer in the first area.

A second surface of the first conductive semiconductor layer that is opposite to a first surface of the first conductive semiconductor layer and having no active layer may protrude downwards from a lower end of the insulating film to be exposed to an outside. The lower end of the insulating film may be closer to the active layer than the second surface of the first conductive semiconductor layer.

An upper end that is opposite to the lower end of the insulating film may be positioned at a same surface as a first surface of the electrode layer on which the second conductive semiconductor layer is not provided.

An upper end that is opposite to the lower end of the insulating film may protrude upwards from the first surface of the electrode layer on which the second conductive semiconductor layer is not provided. The first surface of the electrode layer may be closer to the active layer than the upper end of the insulating film.

The first conductive semiconductor layer may include at least one n-type semiconductor layer, and the second conductive semiconductor layer may include at least one p-type semiconductor layer.

The electrode layer may include a first electrode layer on the second conductive semiconductor layer, and a second electrode layer on the first electrode layer. The first electrode layer and the second electrode layer may include different materials.

The first electrode layer may include a transparent metal oxide, and the second electrode layer may include any one of chrome (Cr), aluminum (Al), titanium (Ti), or nickel (Ni).

The first electrode layer may include an ohmic layer in which Be is diffused, and the second electrode layer may include a transparent metal oxide.

The active layer may be configured to emit light having a wavelength of 400 nm to 900 nm, and may include at least one of GaInP, AlGaInP, GaAs, AlGaAs, InP, and InAs.

A method of manufacturing a light emitting element may include forming a sacrificial layer on a substrate; forming an emissive stack on the sacrificial layer, the emissive stack being formed by sequentially stacking a first conductive semiconductor layer, an active layer, a second conductive semiconductor layer, and an electrode layer; forming an emissive stack pattern by vertically etching the emissive stack to have a size corresponding to a micro scale or a nano scale, and exposing an area of the first conductive semiconductor layer to an outside; forming an insulating material layer on a surface of the emissive stack pattern and the area of the first conductive semiconductor layer exposed to the outside, and vertically etching the insulating material layer, thus forming an insulating film that encloses the surface of the emissive stack pattern; and separating the emissive stack pattern enclosed by the insulating film from the substrate, thus forming at least one light emitting element. In forming the insulating film, a portion of the sacrificial layer may be etched so that a portion of an outer periphery of the first conductive semiconductor layer is exposed.

The first conductive semiconductor layer may include a first area that is covered by the insulating film, and a second area that is not covered by the insulating film. A perimeter of an outer periphery of the first conductive semiconductor layer in the first area and a perimeter of an outer periphery of the first conductive semiconductor layer in the second area may be different from each other.

The insulating film may include an inner side surface that corresponds to a surface of the emissive stack pattern, and an outer side surface that is opposite to the inner side surface and does not correspond to the surface of the emissive stack pattern. The outer periphery of the first conductive semiconductor layer in the first area may coincide with the inner side surface of the insulating film, and the outer periphery of the first conductive semiconductor layer in the second area may coincide with the outer side surface of the insulating film.

Forming the emissive stack may include forming the first conductive semiconductor layer on the sacrificial layer; forming the active layer on the first conductive semiconductor layer; forming the second conductive semiconductor layer on the active layer; and forming the electrode layer on the second conductive semiconductor layer.

The first conductive semiconductor layer may include at least one n-type semiconductor layer, and the second conductive semiconductor layer may include at least one p-type semiconductor layer.

Forming the electrode layer may include forming a first electrode layer on the second conductive semiconductor layer; and forming a second electrode layer on the first electrode layer, the second electrode layer containing a material different from that of the first electrode layer.

The method may further include etching the second electrode layer to expose a surface of the first electrode layer, after separating the emissive stack pattern from the substrate to form at least one light emitting element.

The active layer may emit light having a wavelength of 400 nm to 900 nm, and may include at least one of GaInP, AlGaInP, GaAs, AlGaAs, InP, and InAs.

A display device may include a substrate including a display area and a non-display area; and a plurality of pixels the display area of the substrate, and including a plurality of sub-pixels, respectively. Each of the sub-pixels may include a pixel circuit layer including at least one transistor, and a display element layer including a unit emission area to emit light.

The display element layer may include at least one light emitting element on the substrate and to emit the light, first and second electrodes spaced from each other with the light emitting element being interposed therebetween, a first contact electrode electrically coupling the first electrode and a first end of the light emitting element, and a second contact electrode electrically coupling the second electrode and a second end of the light emitting element.

The light emitting element may include a first conductive semiconductor layer; an active layer on a surface of the first conductive semiconductor layer; a second conductive semiconductor layer on the active layer; an insulating film configured to enclose an outer periphery of each of the first conductive semiconductor layer, the active layer, and the second conductive semiconductor layer; and an electrode layer on the second conductive semiconductor layer.

The first conductive semiconductor layer may include a first area that is covered by the insulating film, and a second area that is not covered by the insulating film.

A perimeter of the outer periphery of the first conductive semiconductor layer in the first area and a perimeter of the outer periphery of the first conductive semiconductor layer in the second area may be different from each other.

Advantageous Effects

An embodiment of the present disclosure may provide a light emitting element and a method of manufacturing the light emitting element, in which a portion of an outer periphery (e.g., an outer circumference) of a first conductive semiconductor layer of a light emitting element grown on a substrate is exposed to an outside, thus further increasing a contact area with an electrode.

Furthermore, an embodiment of the present disclosure may provide a light emitting element and a method of manufacturing the light emitting element, in which an auxiliary electrode layer is formed above an electrode layer on a second semiconductor layer of the light emitting element, thus preventing damage to the electrode layer due to external factors in a manufacturing process and thereby reducing or minimizing failure.

Furthermore, an embodiment of the present disclosure may provide a display device including the light emitting element.

The embodiments of the present disclosure are not limited by the foregoing, and other various features may be included herein.

MODE FOR INVENTION

Figure 1A:
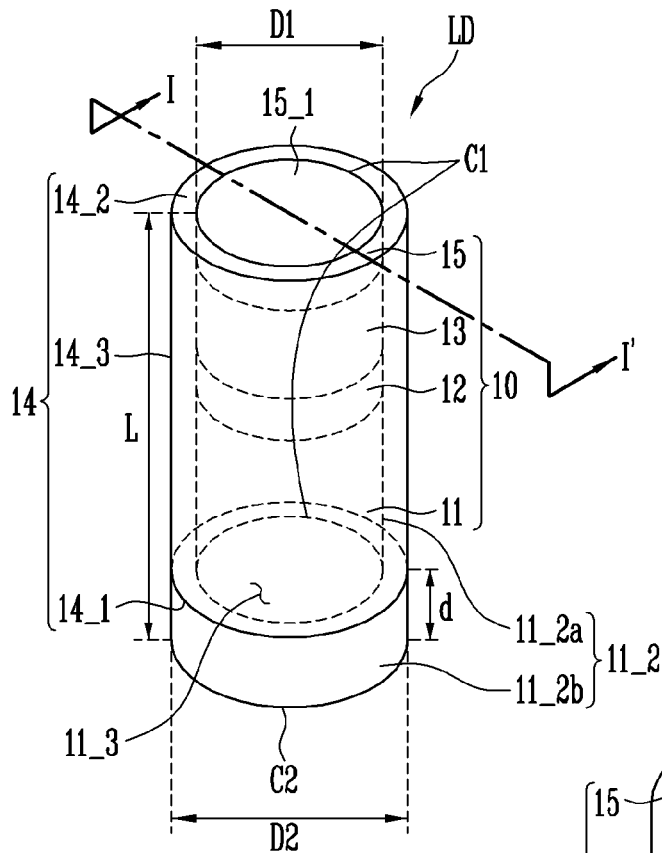
FIG. 1A is a perspective view illustrating a light emitting element in accordance with an embodiment of the present disclosure, when seen from above.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Example embodiments and corresponding details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural from as long as it is not specifically mentioned in a sentence.

Figure 1B:
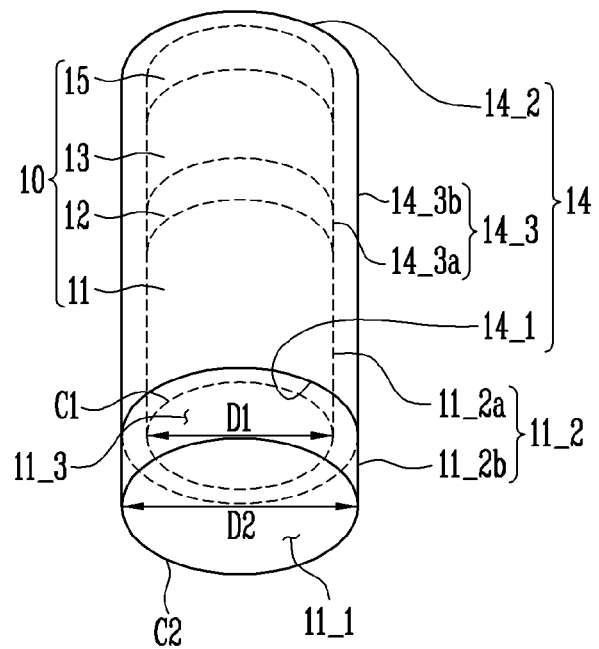
FIG. 1B is a perspective view illustrating the light emitting element of FIG. 1A, when seen from below.
Figure 1C:
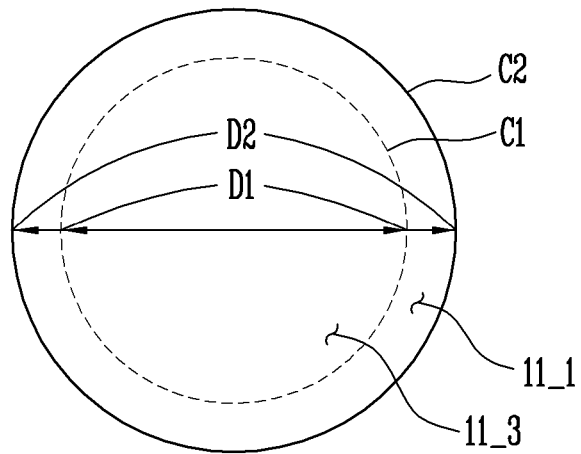
FIG. 1C is a schematic plan view illustrating the light emitting element of FIG. 1A, when seen from above.
Figure 1D:
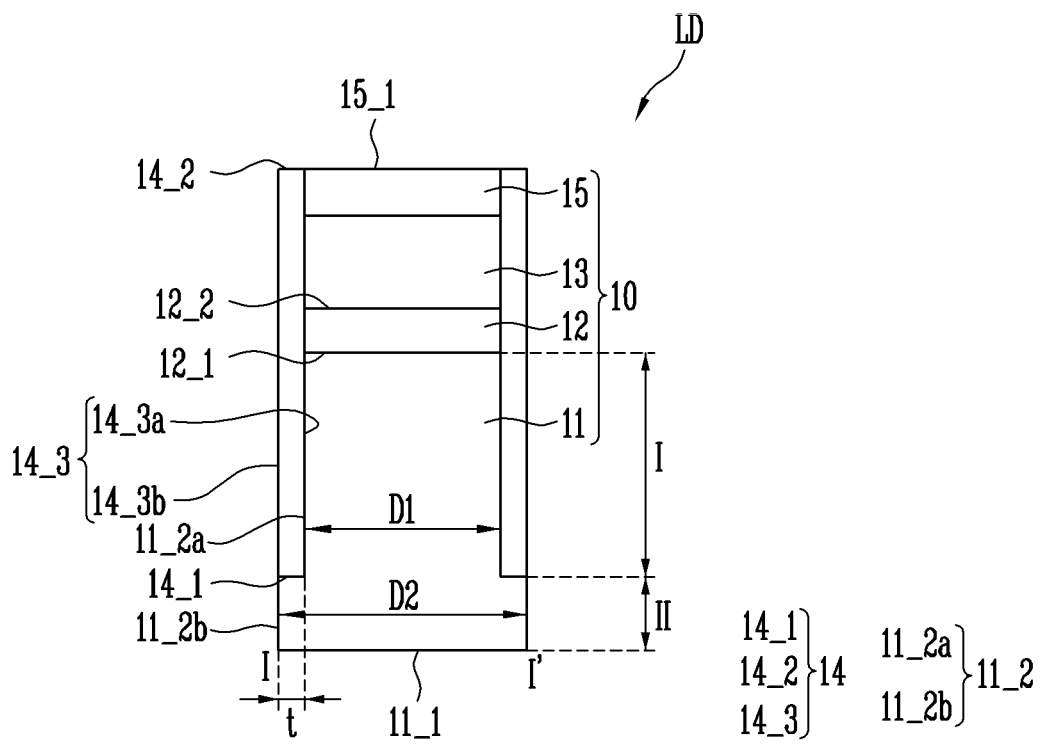
FIG. 1D is a sectional view taken along the line I-I' of FIG. 1A.

FIG. 1A is a perspective view illustrating a light emitting element in accordance with an embodiment of the present disclosure, when seen from above, FIG. 1B is a perspective view illustrating the light emitting element of FIG. 1A, when seen from below, FIG. 1C is a schematic plan view illustrating the light emitting element of FIG. 1A, when seen from above, and FIG. 1D is a sectional view taken along the line I-I' of FIG. 1A.

The light emitting element LD in accordance with an embodiment of the present disclosure is shown in FIGS. 1A to 1D as a cylindrical light emitting element. However, the type and/or shape of the light emitting element LD according to the present disclosure are not limited thereto.

Referring to FIGS. 1A to 1D, the light emitting element LD in accordance with the example embodiments of the present disclosure includes a first conductive semiconductor layer 11, a second conductive semiconductor layer 13, and an active layer 12 interposed between the first and second conductive semiconductor layers 11 and 13. In an embodiment, the light emitting element LD may include a stacked structure formed by successively stacking the first conductive semiconductor layer 11, the active layer 12, and the second conductive semiconductor layer 13 along a longitudinal direction L.

The light emitting element LD may be provided in the shape of a rod extending in one direction. If the direction in which the light emitting element LD extends is defined as a longitudinal direction L, the light emitting element LD may have a first end and a second end with respect to the longitudinal direction L. In an embodiment, one of the first and second conductive semiconductor layers 11 and 13 may be disposed on the first end of the light emitting element LD, and the other one of the first and second conductive semiconductor layers 11 and 13 may be disposed on the second end of the light emitting element LD.

The light emitting element LD may be a rod-type light emitting diode manufactured in the shape of a rod. In the present disclosure, the term "rod-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, a length L of the light emitting element LD may be greater than a diameter thereof (or a width of the cross-section thereof). Hereinafter, for convenience, the light emitting element LD having the cylindrical shape will be described, and the direction along which the length L of the light-emitting element LD is measured is referred to the longitudinal direction L.

In an embodiment, the light emitting element LD may have a small size corresponding to a nano scale or a micro scale, e.g., a diameter and/or a length L corresponding to a nano scale or micro scale range. However, in the present disclosure, the size of the light emitting element LD is not limited thereto. For example, the size of the light emitting element LD may be changed in various ways depending on design conditions of various devices, e.g., a display device, which employs, as a light source, a light emitting device using the light emitting element LD.

The first conductive semiconductor layer 11 may include, for example, at least one n-type semiconductor layer. For instance, the first conductive semiconductor layer 11 may include an n-type semiconductor layer which includes any one semiconductor material from among InAlGaN, GaN, AlGaN, InGaN, AlN, and InN, and is doped with a first conductive dopant such as Si, Ge, or Sn. However, the material forming the first conductive semiconductor layer 11 is not limited to this, and the first conductive semiconductor layer 11 may be formed of various other materials.

The active layer 12 may be disposed on the first conductive semiconductor layer 11 and have a single or multiple quantum well structure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field having a voltage (e.g., a set voltage or a predetermined voltage or more) is applied between the opposite ends of the light emitting element LD, the light emitting element LD emits light by coupling of electron-hole pairs in the active layer 12. Because light emission of the light emitting element LD may be controlled based on the foregoing principle, the light emitting element LD may be used as a light source of various light emitting devices as well as a pixel of the display device.

The active layer 12 may include a first surface 12_1 that is in contact with the first conductive semiconductor layer 11, and a second surface 12_2 that is in contact with the second conductive semiconductor layer 13.

The second conductive semiconductor layer 13 may be disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes at least one semiconductor material from among InAlGaN, GaN, AlGaN, InGaN, AlN, and InN, and is doped with a second conductive dopant such as Mg. However, the material forming the second conductive semiconductor layer 13 is not limited to this, and the second conductive semiconductor layer 13 may be formed of various other materials.

In an embodiment of the present disclosure, the light emitting element LD includes an electrode layer 15 disposed on the second conductive semiconductor layer 13. In other words, the light emitting element LD may include a stacked structure formed by successively stacking the first conductive semiconductor layer 11, the active layer 12, the second conductive semiconductor layer 13, and the electrode layer 15. In the following embodiment, the stacked structure including the first conductive semiconductor layer 11, the active layer 12, the second conductive semiconductor layer 13, and the electrode layer 15 is referred to as an emissive stack pattern 10.

Such an emissive stack pattern 10 may have a cylindrical shape, and the light emitting element LD may also have a cylindrical shape corresponding to that of the emissive stack pattern 10. Furthermore, each of the first conductive semiconductor layer 11, the active layer 12, the second conductive semiconductor layer 13, and the electrode layer 15 included in the emissive stack pattern 10 has a cylindrical shape.

The first conductive semiconductor layer 11 may be disposed on a first end of the light emitting element LD, and the electrode layer 15 may be disposed on a second end of the light emitting element LD. The light emitting element LD may include a lower surface 11_1 of the first conductive semiconductor layer 11 and an upper surface 15_1 of the electrode layer 15, which are positioned on the opposite ends of the light emitting element LD and are exposed to an outside. The lower surface 11_1 of the first conductive semiconductor layer 11 and the upper surface 15_1 of the electrode layer 15 may be surfaces which are in contact with an external conductive material to be electrically connected thereto. When the light emitting element LD has the cylindrical shape, the first conductive semiconductor layer 11 may be disposed on a lower portion of the cylinder and the electrode layer 15 may be disposed on an upper portion of the cylinder. When the light emitting element LD has the cylindrical shape, each of the lower surface 11_1 of the first conductive semiconductor layer 11 and the upper surface 15_1 of the electrode layer 15 may have a circular shape. In an embodiment, when the light emitting element LD has the shape of an elliptical cylinder, each of the lower surface 11_1 of the first conductive semiconductor layer 11 and the upper surface 15_1 of the electrode layer 15 may have an elliptical shape. Furthermore, in another embodiment, when the light emitting element LD has the shape of a polyprism, each of the lower surface 11_1 of the first conductive semiconductor layer 11 and the upper surface 15_1 of the electrode layer 15 may have a polygonal shape.

The electrode layer 15 may be an ohmic contact electrode electrically coupled to the second conductive semiconductor layer 13, but the present disclosure is not limited thereto. The electrode layer 15 may include metal or a metal oxide. For example, Cr, Ti, Al, Au, Ni, ITO, IZO, ITZO, and an oxide or alloy thereof may be used alone or in combination with each other. Furthermore, the electrode layer 15 may be substantially transparent or semitransparent. Thereby, light generated from the active layer 12 of the light emitting element LD may be emitted to the outside of the light emitting element LD after passing through the electrode layer 15.

Furthermore, in an embodiment, the light emitting element LD may further include an insulating film 14 provided on a surface of the emissive stack pattern 10. The insulating film 14 may include transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

The insulating film 14 may prevent the active layer 12 from short-circuiting due to making contact with a conductive material except the first conductive semiconductor layer 11 and the second conductive semiconductor layer 13. Because of the insulating film 14, occurrence of a defect on the surface of the light emitting element LD may be reduced or minimized, whereby the lifetime and efficiency of the light emitting element LD may be improved. In the case where a plurality of light emitting elements LD are disposed in close contact with each other, the insulating film 14 may prevent an undesired short-circuit from occurring between the light emitting elements LD.

The insulating film 14 may be formed on the surface of the emissive stack pattern 10 to enclose an outer periphery (or an outer circumference) of at least the active layer 12. In some embodiments, the insulating film 14 may further enclose an area of each of the first and second conductive semiconductor layers 11 and 13 and an outer periphery (or an outer circumference) of the electrode layer 15.

In an embodiment of the present disclosure, the insulating film 14 may expose at least one of both ends of the light emitting element LD having different polarities. The insulating film 14 may not cover but may expose a portion of the first conductive semiconductor layer 11 from among the first and second conductive semiconductor layers 11 and 13 that are positioned on both ends of the light emitting element LD in the longitudinal direction L.

The insulating film 14 includes a lower surface 14_1 that is parallel to the lower surface 11_1 of the first conductive semiconductor layer 11 in one direction (e.g. horizontal direction) crossing the longitudinal direction L of the light emitting element LD, an upper surface 14_2 that is opposite (or faces) the lower surface 14_1 in the longitudinal direction L, and a side surface 14_3 that covers a portion of a surface of the emissive stack pattern 10 in the longitudinal direction L. The lower surface 14_1 of the insulating film 14, the upper surface 14_2 of the insulating film 14, and the side surface 14_3 of the insulating film 14 may be continuously connected to each other.

The side surface 14_3 of the insulating film 14 may include an inner side surface 14_3a that is in direct contact with outer side the surface of the emissive stack pattern 10, and an outer side surface 14_3b that is opposite to (or faces) the inner side surface 14_3a and corresponds to an outermost side surface of the light emitting element LD. Here, the upper surface 14_2 of the insulating film 14 may be defined as an imaginary surface including a perimeter of an upper end of the insulating film 14, and the lower surface 14_1 of the insulating film 14 may be defined as an imaginary surface including a perimeter of a lower end of the insulating film 14.

In an embodiment of the present disclosure, the insulating film 14 may entirely enclose the outer periphery (or the outer circumference) of the electrode layer 15. In this case, the upper surface 14_2 of the insulating film 14 and the upper surface 15_1 of the electrode layer 15 may be provided on the same surface. However, the present disclosure is not limited thereto. In an embodiment, when the insulating film 14 partially encloses or does not enclose the outer periphery (or the outer circumference) of the electrode layer 15, the upper surface 14_2 of the insulating film 14 and the upper surface 15_1 of the electrode layer 15 may be provided on different surfaces.

In an embodiment of the present disclosure, the insulating film 14 does not cover the lower surface 11_1 of the first conductive semiconductor layer 11 positioned at the first end (e.g. a bottom of the cylinder) of the light emitting element LD and a portion of the outer periphery (or the outer circumference) 11_2 of the first conductive semiconductor layer 11. A portion of the outer periphery (or the outer circumference) 11_2 of the first conductive semiconductor layer 11 which is not covered by the insulating film 14 may extend continuously from the lower surface 11_1 of the first conductive semiconductor layer 11, and may extend upwards from the lower surface 11_1 of the first conductive semiconductor layer 11 in the longitudinal direction L of the light emitting element LD. The lower surface 11_1 of the first conductive semiconductor layer 11 and a portion of the outer periphery (or the outer circumference) 11_2, which are not covered by the insulating film 14 may be exposed to an outside. A remaining portion of the outer periphery 11_2 11_2 of the first conductive semiconductor layer 11 may be covered by the insulating film 14 excluding a portion of the outer periphery (or the outer circumference) 11_2, which is not covered by the insulating film 14.

In the following embodiment, for convenience, the remaining portion of the outer periphery (or the outer circumference) 11_2 of the first conductive semiconductor layer 11 covered by the insulating film 14 is referred to as a "first outer periphery" (or "a first outer circumference"), and another reference numeral "11_2a" is imparted to the first outer periphery (or the first outer circumference) so as to prevent the confusion of reference numerals. Furthermore, a portion of the outer periphery (or the outer circumference) 11_2 of the first conductive semiconductor layer 11 that is not covered by the insulating film 14 is referred to as a "second outer periphery" (or a "second outer circumference"), and another reference numeral "11_2b" is imparted to the second outer periphery (or the second outer circumference) so as to prevent the confusion of reference numerals.

In an embodiment of the present disclosure, the first outer periphery (or the first outer circumference) 11_2a of the first conductive semiconductor layer 11 may coincide with the inner side surface 14_3a of the insulating film 14, and the second outer periphery (or the second outer circumference) 11_2b of the first conductive semiconductor layer 11 may coincide with the outer side surface 14_3b of the insulating film 14.

In an embodiment of the present disclosure, the length of the side surface 14_3 of the insulating film 14 with respect to the longitudinal direction L of the light emitting element LD may be shorter than the length of the emissive stack pattern 10 including the first conductive semiconductor layer 11, the active layer 12, the second conductive semiconductor layer 13, and the electrode layer 15. However, the present disclosure is not limited thereto. In an embodiment, the length of the side surface 14_3 of the insulating film 14 may be longer than the length of the emissive stack pattern 10 with respect to the longitudinal direction L of the light emitting element LD.

The lower surface 14_1 of the insulating film 14 and the lower surface 11_1 of the first conductive semiconductor layer 11 may be parallel to each other in the horizontal direction crossing the longitudinal direction L (e.g. vertical direction) while being spaced from each other by a distance d (e.g., a set distance or a predetermined distance d). In an embodiment of the present disclosure, the lower surface 11_1 of the first conductive semiconductor layer 11 may protrude downwards from the lower surface 14_1 of the insulating film 14. In such a case, the lower surface 11_1 of the first conductive semiconductor layer 11 and the second outer periphery (or the second outer circumference) 11_2b of the first conductive semiconductor layer 11 continuously extending from the lower surface 11_1 may be exposed to an outside. The lower surface 14_1 of the insulating film 14 may be relatively closer to the active layer 12 than the lower surface 11_1 of the first conductive semiconductor layer 11 in the longitudinal direction L.

In an embodiment of the present disclosure, the first conductive semiconductor layer 11 may be divided into a first area I which is covered by the insulating film 14 and a second area II which is not covered by the insulating film 14. The first area I and the second area II may be divided based on the lower surface 14_1 of the insulating film 14. In an embodiment of the present disclosure, an interface 11_3 may be provided between the first area I and the second area II. The interface 11_3 may be an imaginary surface including the perimeter of the inner side surface 14_3a of the insulating film 14 at a boundary between the first outer periphery (or the first outer circumference) 11_2a of the first conductive semiconductor layer 11 and the second outer periphery (or the second outer circumference) 11_2b of the first conductive semiconductor layer 11. Such an interface 11_3 may have a circular shape, and a perimeter C1 of the interface 11_3 may be the same as a surface perimeter C1 of the emissive stack pattern 10 enclosed by the inner side surface 14_3a of the insulating film 14.

The first area I of the first conductive semiconductor layer 11 may be an area from the upper surface of the first conductive semiconductor layer 11 coming into contact with a surface 12_1 of the active layer 12 to the lower surface 14_1 of the insulating film 14 in the longitudinal direction L of the light emitting element LD. The second area II of the first conductive semiconductor layer 11 may mean an area from the lower surface 14_1 of the insulating film 14 to the lower surface 11_1 of the first conductive semiconductor layer 11.

As described above, in an embodiment of the present disclosure, the second outer periphery (or the second outer circumference) 11_2b of the first conductive semiconductor layer 11 coincides with the outer side surface 14_3b of the insulating film 14 in the second area II, and the first outer periphery (or the first outer circumference) 11_2a of the first conductive semiconductor layer 11 coincides with the inner side surface 14_3a of the insulating film 14 in the first area I. Thus, a perimeter of the outer periphery (or the outer circumference) 11_2 of the first conductive semiconductor layer 11 may be different in the first area I from that in the second area II.

Because the first outer periphery (or the first outer circumference) 11_2a of the first conductive semiconductor layer 11 coincides with the inner side surface 14_3a of the insulating film 14 in the first area I, the perimeter of the first outer periphery (or the first outer circumference) 11_2a may be the same as the perimeter C1 of the interface 11_3 or the surface perimeter C1 of the emissive stack pattern 10 enclosed by the inner side surface 14_3a of the insulating film 14. Because the second outer periphery (or the second outer circumference) 11_2b of the first conductive semiconductor layer 11 is continuous with the lower surface 11_1 of the first conductive semiconductor layer 11 in the second area II, the perimeter of the second outer periphery (or the second outer circumference) 11_2b may be the same as the perimeter C2 of the lower surface 11_1 of the first conductive semiconductor layer 11. In other words, the perimeter of the first outer periphery (or the first outer circumference) 11_2a of the first conductive semiconductor layer 11 may correspond to the perimeter C1 of the interface 11_3 or the surface perimeter C1 of the emissive stack pattern 10 enclosed by the inner side surface 14_3a of the insulating film 14, and the perimeter of the second outer periphery (or the second outer circumference) 11_2b of the first conductive semiconductor layer 11 may correspond to the perimeter C2 of the lower surface 11_1 of the first conductive semiconductor layer 11.

In an embodiment of the present disclosure, the perimeter of the second outer periphery (or the second outer circumference) 11_2b of the first conductive semiconductor layer 11 is larger than the perimeter of the first outer periphery (or the first outer circumference) 11_2a of the first conductive semiconductor layer 11. This is because the second outer periphery (or the second outer circumference) 11_2b of the first conductive semiconductor layer 11 coincides with the outer side surface 14_3b of the insulating film 14 in the second area II and thereby its perimeter is enlarged by a thickness t of the side surface 14_3 of the insulating film 14 compared to the first outer periphery (or the first outer circumference) 11_2a of the first conductive semiconductor layer 11 of the first area I coinciding with the inner side surface 14_3a of the insulating film 14.

Furthermore, in an embodiment of the present disclosure, because the perimeter of the second outer periphery (or the second outer circumference) 11_2b of the first conductive semiconductor layer 11 is larger than the perimeter of the first outer periphery (or the first outer circumference) 11_2a of the first conductive semiconductor layer 11, a diameter D2 of the lower surface 11_1 of the first conductive semiconductor layer 11 may be larger than a diameter D1 of the emissive stack pattern 10 enclosed by the insulating film 14 or the diameter D1 of the interface 11_3. When the light emitting element LD has the cylindrical shape, the diameter D2 of the lower surface 11_1 of the first conductive semiconductor layer 11 may be a straight line passing through a center, and may be defined as a line connecting two points on the perimeter C2 of the lower surface 11_1. Furthermore, the diameter D1 of the emissive stack pattern 10 or the diameter D1 of the interface 11_3 may be defined as a line connecting two points on the surface perimeter C1 of the emissive stack pattern 10 or the perimeter C1 of the interface 11_3.

As described above, when the insulating film 14 does not completely cover the outer periphery (or the outer circumference) 11_2 of the first conductive semiconductor layer 11 but exposes the lower surface 11_1 of the first conductive semiconductor layer 11 and the second outer periphery (or the second outer circumference) 11_2b extending from the lower surface 11_1, the exposure area of the first conductive semiconductor layer 11 may be increased. If the exposure area of the first conductive semiconductor layer 11 increases, a contact area with the conductive material may be increased. Thus, the first conductive semiconductor layer 11 and the conductive material may be electrically and/or physically stably coupled to each other.

The light emitting element LD may be employed as a light source for various display devices. The light emitting element LD may be fabricated through a surface treatment process.

FIGS. 2A-2J are sectional views sequentially illustrating a method of manufacturing the light emitting element of FIGS. 1A-1D.

Referring to FIGS. 1A, 1B, 1C, 1D, and 2A, a substrate 1 configured to support the light emitting element LD is prepared.

The substrate 1 may be a GaAs, GaP, or InP substrate. The substrate 1 may be a wafer for epitaxial growth. The substrate 1 may include a ZnO substrate having a GaAs layer on a surface. Furthermore, the Ge substrate having the GaAs layer on the surface and an Si substrate having the GaAs layer on an Si wafer with a buffer layer being interposed therebetween may also be applied.

A commercially available mono-crystal substrate manufactured by a known manufacturing method may be used as the substrate 1. When a selection ratio for manufacturing the light emitting element LD is satisfied and the epitaxial growth is smoothly performed, the material of the substrate 1 is not limited thereto. In the following embodiment, the substrate 1 is described as being the GaAs substrate made of GaAs. Here, GaAs may be a material whose wavelength is changed according to temperature.

In some embodiments the surface of the substrate 1, that is epitaxially grown, is smooth. The size and diameter of the substrate 1 may vary depending on a product to which the substrate 1 is applied, and may be manufactured in a form capable of reducing bending caused by a stacked structure due to epitaxial growth. The shape of the substrate 1 is not limited to a circular shape, and may have a polygonal shape such as a rectangle.

Referring to FIGS. 1A, 1B, 1C, 1D, 2A, and 2B, a sacrificial layer 3 is formed on the substrate 1. The sacrificial layer 3 may be formed on the substrate 1 by a metalorganic chemical vaper deposition (MOCVD method), a molecular beam epitaxy (MBE) method, a vapor phase epitaxy (VPE) method, a liquid-phase epitaxy (LPE) method, or the like.

The substrate 1 and the sacrificial layer 3 may be disposed to come into contact with each other. The sacrificial layer 3 may be positioned between the light emitting element LD and the substrate 1 in the process of manufacturing the light emitting element LD to physically separate the light emitting element LD from the substrate 1.

The sacrificial layer 3 may have various structures, i.e. a single layer structure or a multilayer structure. The sacrificial layer 3 may be a layer which is removed in a final manufacturing process of the light emitting element LD. When the sacrificial layer 3 is removed, interlayer separation may be performed above and under the sacrificial layer 3. The method of removing the sacrificial layer 3 will be described below with reference to FIG. 2J.

In an embodiment of the present disclosure, the sacrificial layer 3 may be formed of GaAs, AlAs, or AlGaAs. In the following embodiment, the sacrificial layer 3 is described as being made of GaAs.

Referring to FIGS. 1A, 1B, 1C, 1D, and 2A to 2C, the first conductive semiconductor layer 11 is formed on the sacrificial layer 3. Similar to the sacrificial layer 3, the first conductive semiconductor layer 11 may be formed through the epitaxial growth, and be formed by the MOCVD method, the MBE method, the VPE method, the LPE method or the like. In an embodiment, an additional semiconductor layer for improving crystallinity, such as a buffer layer and an undoped semiconductor layer, may be further formed between the first conductive semiconductor layer 11 and the sacrificial layer 3.

The first conductive semiconductor layer 11 may include semiconductor material composed of Group III (Ga, Al, In)-Group V (P, As) materials, and may include a semiconductor layer doped with a first conductive dopant such as Si, Ge, or Sn. For example, the first conductive semiconductor layer 11 may include at least one semiconductor material from among GaP, GaAs, GaInP, and AlGaInP doped with Si. In other words, the first conductive semiconductor layer 11 may include at least one n-type semiconductor layer. The material forming the first conductive semiconductor layer 11 is not limited to this, and the first conductive semiconductor layer 11 may be formed of various other materials.

In some embodiments, when the light emitting element LD includes a conductive material layer (not shown) that is in contact with the lower surface 11_1 of the first conductive semiconductor layer 11, the conductive material layer may be formed before the first conductive semiconductor layer 11 is formed on the sacrificial layer 3.

Referring to FIGS. 1A, 1B, 1C, 1D, and 2A-2D, the active layer 12 is formed on the first conductive semiconductor layer 11. The active layer 12 is an area in which electrons and holes are recombined. As the electrons and the holes are recombined, the active layer may be transferred to a low energy level status and emit light having a wavelength corresponding thereto.

The active layer 12 may be formed on the first conductive semiconductor layer 11 and have a single or multiple quantum well structure. The location of the active layer 12 may be changed in various ways depending on the type of the light emitting element LD.

The active layer 12 may include at least one of GaInP, AlGaInP, GaAs, AlGaAs, InGaAs, InGaAsP, InP, and InAs. The active layer 12 may emit light having a wavelength of 400 nm to 900 nm. The active layer 12 may use a double heterostructure. In an embodiment, a cladding layer (not shown) doped with the conductive dopant may be further formed on the upper surface 12_2 and/or the lower surface 12_1 of the active layer 12.

Referring to FIGS. 1A, 1B, 1C, 1D, and 2A-2E, the second conductive semiconductor layer 13 is formed on the active layer 12. The second conductive semiconductor layer 13 may include a semiconductor layer of a type different from that of the first conductive semiconductor layer 11. The second conductive semiconductor layer 13 may include semiconductor material composed of Group III (Ga, Al, In)-Group V (P, As) materials, and may include a semiconductor layer doped with a second conductive dopant such as Mg. For example, the second conductive semiconductor layer 13 may include at least one semiconductor material from among GaP, GaAs, GaInP, and AlGaInP doped with Mg. In other words, the second conductive semiconductor layer 13 may include a p-type semiconductor layer. The material forming the second conductive semiconductor layer 13 is not limited to this, and the second conductive semiconductor layer 13 may be formed of various other materials.

Referring to FIGS. 1A, 1B, 1C, 1D, and 2A-2F, the electrode layer 15 is formed on the second conductive semiconductor layer 13. The electrode layer 15 may include metal or metal oxide. For example, the electrode layer 15 may use Cr, Ti, Al, Au, Ni, ITO, IZO, ITZO, oxide or alloy thereof alone or in combination. In an embodiment of the present disclosure, the electrode layer 15 may be made of transparent metal oxide such as indium tin oxide ITO so as to reduce or minimize the loss of light generated from the active layer 12 and emitted to the outside of the light emitting element LD and improve current spreading effects from the outside conductive material (not shown) to the second conductive semiconductor layer 13.

As described above, the first conductive semiconductor layer 11, the active layer 12, the second conductive semiconductor layer 13, and the electrode layer 15 which are sequentially stacked on the substrate 1 form an emissive stack LD'.

Referring to FIGS. 1A, 1B, 1C, 1D, and 2A-2G, after a mask (not shown) is disposed on the emissive stack LD', a first etching process is performed to pattern the emissive stack LD' at a nano-scale or micro-scale interval, thus forming a plurality of emissive stack patterns 10.

In an embodiment of the present disclosure, the mask may include a plurality of openings (not shown), and an area of the emissive stack LD' corresponding to the openings may be etched to form a groove HM exposing an area A of the first conductive semiconductor layer 11 to an outside. An area of the emissive stack LD' which corresponds to the opening of the mask is etched, and an area of the emissive stack LD' which does not correspond to the opening of the mask is not etched. In an embodiment, the reverse thereof is also possible. In other words, an area of the emissive stack LD' which corresponds to the opening of the mask may not be etched, and an area of the emissive stack LD' which does not correspond to the opening of the mask may be etched.

The groove HM may have a shape that is recessed from the upper surface 15_1 of the electrode layer 15 of each emissive stack pattern 10 to the area A of the first conductive semiconductor layer 11 in a vertical direction.

The first etching may use a dry etching method such as reactive ion etching (RIE), reactive ion beam etching (RIBE), or inductively coupled plasma reactive ion etching (ICP-RIE). Unlike the wet etching method, the dry etching method allows anisotropic etching to be suitable for forming the emissive stack patterns 10. In other words, in the wet etching method, isotropic etching is performed, so that etching is performed in all direction. In contrast, in the dry etching method, etching may be mainly performed in a depth direction to form the groove HM, so that the size and spacing of the groove HM may be formed in a desired pattern.

In an embodiment of the present disclosure, each of the emissive stack patterns 10 may have a nano-scale or micro-scale size.

After the first etching process is performed, residues (not shown) remaining on the emissive stack pattern 10 may be removed through the conventional wet etching or dry etching method. However, the present disclosure may remove the residues through a conventional removal method without being limited thereto. Here, the residues may include an etching mask, an insulating material and others, which are required in the mask process.

Referring to FIGS. 1A, 1B, 1C, 1D, and 2A-2H, an insulating material layer 14' is formed on the emissive stack patterns 10 and an area A of the first conductive semiconductor layer 11. The insulating material layer 14' may include an upper insulating material layer 14b, a side insulating material layer 14a, and a lower insulating material layer 14c. The upper insulating material layer 14b may completely cover an upper surface of each of the emissive stack patterns 10. In other words, the upper insulating material layer 14b may completely cover an upper surface 15_1 of the electrode layer 15. The side insulating material layer 14a may completely cover a side surface of each of the emissive stack patterns 10. The lower insulating material layer 14c may completely cover the area A of the first conductive semiconductor layer 11 exposed to the outside by the groove HM.

The upper insulating material layer 14b, the side insulating material layer 14a, and the lower insulating material layer 14c may be continuously coupled to each other on the substrate 1.

Although a method of forming the insulating material layer 14' may use a method of applying insulating material onto the emissive stack patterns 10 attached to the substrate 1, the present disclosure is not limited thereto. The material used as the insulating material layer 14' may include any one material selected from a group consisting of $SiO_2$, $Si_3N_4$, $Al_2O_3$ and $TiO_2$, but is not limited thereto. For example, an $Al_2O_3$ film may be formed through atomic layer deposition (ALD), and a thin film may be formed using chemical adsorption and desorption by supplying a trimethyl aluminum (TMA) and $H_2O$ source in a pulse form. A thickness of the insulating material layer 14' may range from 30 nm to 150 nm, but is not limited thereto.

Referring to FIGS. 1A, 1B, 1C, 1D, and 2A-2I, a second etching process is performed to remove a portion of the insulating material layer 14' formed on the substrate 1, thus forming the insulating film 14.

Through the second etching process, the upper insulating material layer 14b and the lower insulating material layer 14c may be removed, so that the insulating film 14 including only the side insulating material layer 14a that covers the side of each emissive stack pattern 10 may be finally formed. Through the second etching process, the upper insulating material layer 14b may be removed, so that the upper surface 15_1 of the electrode layer 15 may be exposed to an outside. In this case, the upper surface 14_2 of the insulating film 14 and the upper surface 15_1 of the electrode layer 15 may be provided on the same surface.

Furthermore, through the second etching process, a portion of the sacrificial layer 3 may be removed, so that at least one uneven pattern 3' may be formed on a surface of the sacrificial layer 3 and a portion of the outer periphery 11_2 of the first conductive semiconductor layer 11 may be exposed to the outside.

A portion of the outer periphery (or the outer circumference) 11_2 of the first conductive semiconductor layer 11 exposed to the outside may coincide with the outer side surface 14_3b of the insulating film 14, and may extend from the outer side surface 14_3b of the insulating film 14. A remaining portion of the outer periphery (or the outer circumference) 11_2 of the first conductive semiconductor layer 11 covered by the insulating film 14 may coincide with the inner side surface 14_3a of the insulating film 14, and may come into contact with the inner side surface 14_3a of the insulating film 14. Thus, the portion of the outer periphery (or the outer circumference) 11_2 of the first conductive semiconductor layer 11 that is not covered by the insulating film 14 and the remaining portion of the outer periphery (or the outer circumference) 11_2 of the first conductive semiconductor layer 11 that is covered by the insulating film 14 may have different perimeters. For example, the perimeter of the portion of the outer periphery (or the outer circumference) 11_2 of the first conductive semiconductor layer 11 exposed to the outside may be larger than the perimeter of the remaining portion of the outer periphery (or the outer circumference) 11_2 of the first conductive semiconductor layer 11 that is covered by the insulating film 14. The perimeter of the portion of the outer periphery (or the outer circumference) 11_2 of the first conductive semiconductor layer 11 exposed to the outside may correspond to the perimeter C2 of the lower surface 11_1 of the first conductive semiconductor layer 11, and the perimeter of the remaining portion of the outer periphery (or the outer circumference) 11_2 of the first conductive semiconductor layer 11 may correspond to the surface perimeter C1 of the emissive stack pattern 10 covered by the insulating film 14.

The uneven pattern 3' may include an uneven lower surface 3_2, an uneven upper surface 3_1, and an uneven side surface 3_3. The uneven upper surface 3_1 may be a surface coming into contact with the lower surface 11_1 of the first conductive semiconductor layer 11. The uneven lower surface 3_2 may be a surface that is exposed to the outside by removing a portion of the sacrificial layer 3 through the second etching process, and may be closer to the substrate 1 than the uneven upper surface 3_1 in the longitudinal direction L of the light emitting element LD. The uneven side surface 3_3 may be a connecting surface that is perpendicular to the uneven upper surface 3_1 and the uneven lower surface 3_2. Furthermore, the uneven side surface 3_3 may extend to a portion of the outer periphery (or the outer circumference) 11_2 of the first conductive semiconductor layer 11.

As a portion of each of the insulating material layer 14' and the sacrificial layer 3 is removed and thus a portion of the outer periphery (or the outer circumference) 11_2 of the first conductive semiconductor layer 11 is exposed to the outside by the second etching process, the lower surface 11_1 of the first conductive semiconductor layer 11 may be positioned closer to the substrate 1 than the lower surface 14_1 of the insulating film 14. Furthermore, the lower surface 14_1 of the insulating film 14 may be positioned closer to the active layer 12 than the lower surface 11_1 of the first conductive semiconductor layer 11. A distance difference d between the lower surface 14_1 of the insulating film 14 and the lower surface 11_1 of the first conductive semiconductor layer 11 may be within about 100 nm, but is not limited thereto.

The light emitting elements LD enclosed by the insulating film 14 may be formed on the substrate 1 by performing the second etching process.

Referring to FIGS. 1A, 1B, 1C, 1D, and FIGS. 2A-2J, the light emitting elements LD are separated from the substrate 1 using a chemical lift-off (CLO) method. The chemical lift-off may be performed by removing the sacrificial layer 3 including the uneven pattern 3'.

Through the above-described manufacturing process, each of the finally manufactured light emitting elements LD may be shaped such that the lower surface 11_1 of the first conductive semiconductor layer 11 and a portion of the outer periphery (or the outer circumference) 11_2 thereof are exposed to the outside.

Figure 3A:
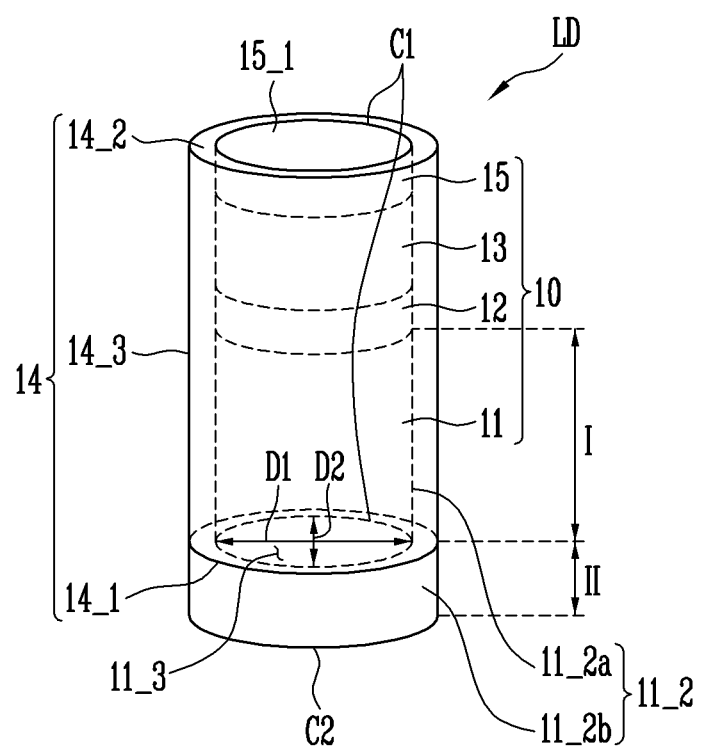
FIG. 3A is a perspective view illustrating a light emitting element in accordance with an embodiment of the present disclosure, when seen from above.
Figure 3B:
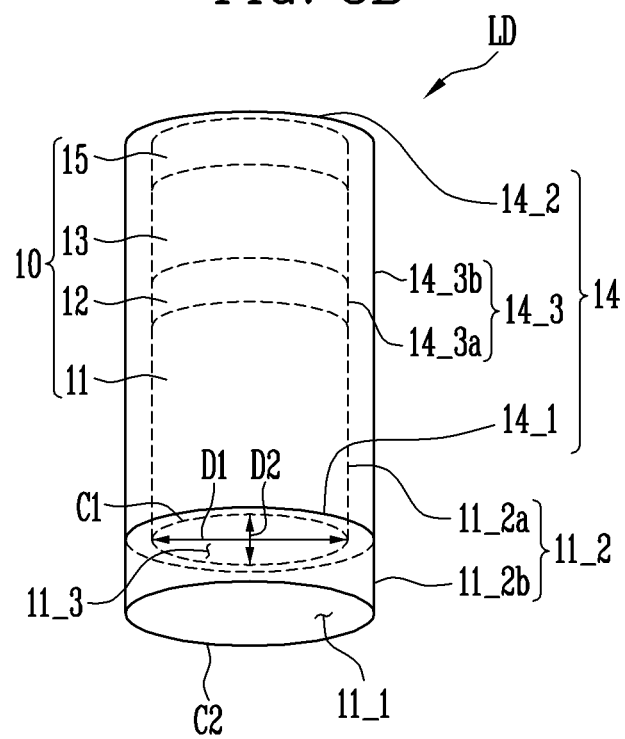
FIG. 3B is a perspective view illustrating the light emitting element of FIG. 3A, when seen from below.
Figure 3C:
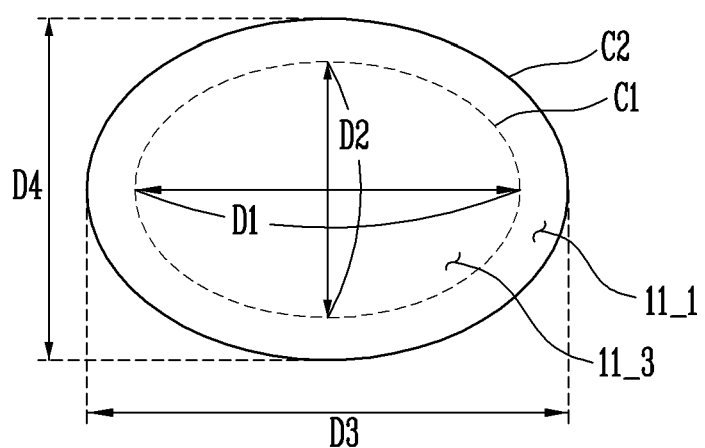
FIG. 3C is a schematic plan view illustrating the light emitting element of FIG. 3A, when seen from above.
Figure 4A:
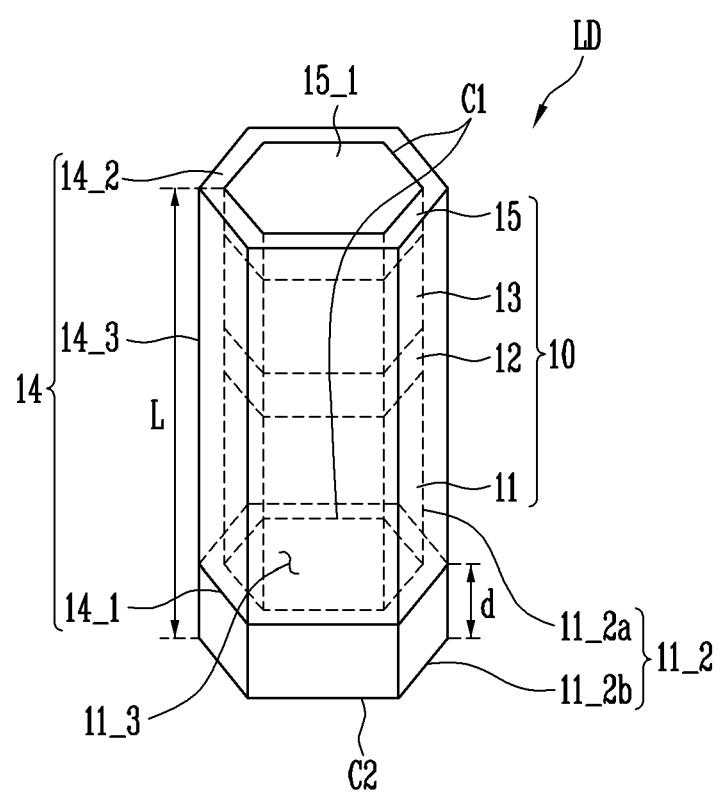
FIG. 4A is a perspective view illustrating a light emitting element having a shape different from that of the light emitting element of FIG. 3A, when seen from above.
Figure 4B:
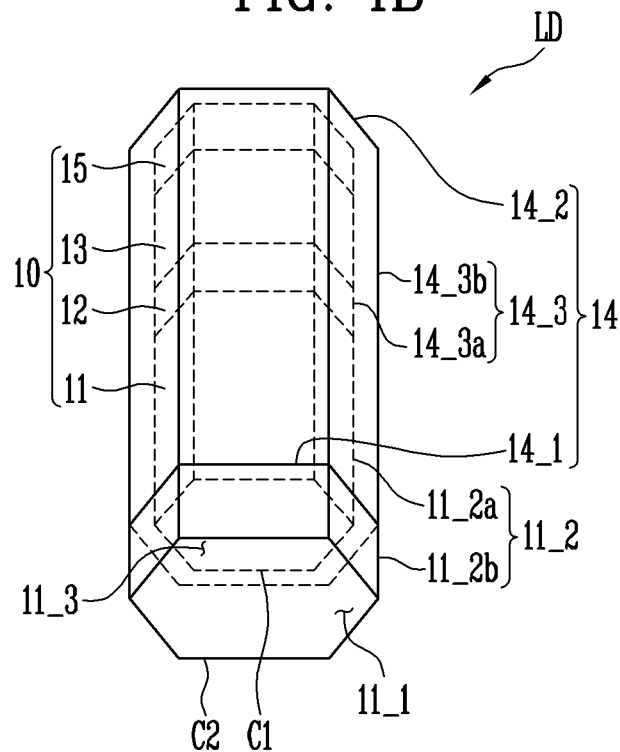
FIG. 4B is a perspective view illustrating the light emitting element of FIG. 4A, when seen from below.
Figure 4C:
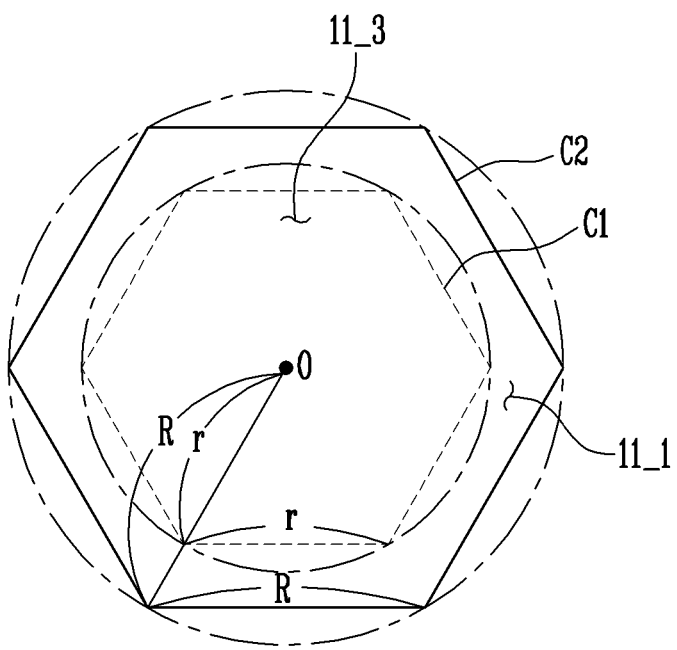
FIG. 4C is a schematic plan view illustrating the light emitting element of FIG. 4A, when seen from above.

FIG. 3A is a perspective view illustrating a light emitting element in accordance with an embodiment of the present disclosure, when seen from above, FIG. 3B is a perspective view illustrating the light emitting element of FIG. 3A, when seen from below, FIG. 3C is a schematic plan view illustrating the light emitting element of FIG. 3A, when seen from above, FIG. 4A is a perspective view illustrating a light emitting element having a shape different from that of the light emitting element of FIG. 3A, when seen from above, FIG. 4B is a perspective view illustrating the light emitting element of FIG. 4A, when seen from below, and FIG. 4C is a schematic plan view illustrating the light emitting element of FIG. 4A, when seen from above.

The light emitting element shown in FIGS. 3A, 3B, 3C, 4A, 4B, and 4C may have substantially the same or similar configuration as the light emitting element of FIGS. 1A-1D except that it has a different shape.

Thus, in order to avoid redundant explanation, the description of the light emitting element of FIGS. 3A, 3B, 3C, 4A, 4B, and 4C will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 3A, 3B, 3C, 4A, 4B, and 4C, the light emitting element LD in accordance with an embodiment of the present disclosure may include an emissive stack pattern 10 formed by stacking a first conductive semiconductor layer 11, an active layer 12, a second conductive semiconductor layer 13, and an electrode layer 15. Furthermore, the light emitting element LD may further include an insulating film 14 provided on a surface of the emissive stack pattern 10.

The insulating film 14 does not cover the lower surface 11_1 of the first conductive semiconductor layer 11 located at one end of the light emitting element LD and the second outer periphery (or the second outer circumference) 11_2b of the first conductive semiconductor layer 11. The first conductive semiconductor layer 11 may be divided into a first area I whose outer periphery (or the outer circumference) 11_2 is covered by the insulating film 14 and a second area II whose outer periphery (or the outer circumference) 11_2 is not covered by the insulating film 14.

An interface 11_3 may be provided between the first area I and the second area II. The interface 11_3 may be an imaginary surface including the perimeter C1 of the inner side surface 14_3a of the insulating film 14 at a boundary between the second outer periphery (or the second outer circumference) 11_2b of the first conductive semiconductor layer 11 that is not covered by the insulating film 14 and the first outer periphery (or the first outer circumference) 11_2a of the first conductive semiconductor layer 11 that is covered by the insulating film 14.

In an embodiment of the present disclosure, the emissive stack pattern 10 may have various shapes. For example, as illustrated in FIGS. 3A-3C, the emissive stack pattern 10 may have the shape of an elliptical cylinder. In this case, each of the lower surface 11_1 of the first conductive semiconductor layer 11, the upper surface 15_1 of the electrode layer 15, and the interface 11_3 may have an elliptical shape. Furthermore, the light emitting element LD may also have the shape of an elliptical cylinder corresponding to that of the emissive stack pattern 10.

The perimeter C1 of each of the interface 11_3 and the upper surface 15_1 of the electrode layer 15 may be the same as the surface perimeter C1 of the emissive stack pattern 10 enclosed by the inner side surface 14_3a of the insulating film 14. Here, the perimeter C1 of the interface 11_3 may be a perimeter of the first outer periphery (or the first outer circumference) 11_2a of the first conductive semiconductor layer 11 covered by the insulating film 14.

The perimeter C1 of the interface 11_3 may be determined by its diameter. When the interface 11_3 has an elliptical shape, the perimeter C1 of the interface 11_3 may be determined by a first diameter D1 (e.g., a line connecting two points on an elliptical periphery (or circumference) to have the longest distance) in a major-axis direction, and a second diameter D2 (e.g., a line connecting two points on the elliptical periphery (or circumference) to have the shortest distance) in a minor-axis direction. As a result, the perimeter of the first outer periphery (or the first outer circumference) 11_2a of the first conductive semiconductor layer 11 covered by the insulating film 14 may be determined by the first and second diameters D1 and D2 of the interface 11_3.

A perimeter of a portion of the second outer periphery (or the second outer circumference) 11_2b of the first conductive semiconductor layer 11 which is not covered by the insulating film 14 may be the same as a perimeter C2 of the lower surface 11_1 of the first conductive semiconductor layer 11. In an embodiment of the present disclosure, the lower surface 11_1 of the first conductive semiconductor layer 11 has a third diameter D3 (e.g., a line connecting two points on an elliptical periphery (or circumference) to have the longest distance) in the major-axis direction, and a fourth diameter D4 (e.g., a line connecting two points on the elliptical periphery (or circumference) to have the shortest distance) in the minor-axis direction. In this case, the perimeter C2 of the lower surface 11_1 of the first conductive semiconductor layer 11 may be determined by the third diameter D3 and the fourth diameter D4.

In an embodiment of the present disclosure, the perimeter of the second outer periphery (or the second outer circumference) 11_2b of the first conductive semiconductor layer 11 may correspond to the perimeter C2 of the lower surface 11_1 of the first conductive semiconductor layer 11, and the perimeter of the first outer periphery (or the first outer circumference) 11_2a of the first conductive semiconductor layer 11 may correspond to the perimeter C1 of the interface 11_3.

For example, the perimeter of the second outer periphery (or the second outer circumference) 11_2b of the first conductive semiconductor layer 11 may be wider than that of the first outer periphery (or the first outer circumference) 11_2a by a thickness t (see FIG. 1D) of the side surface 14_3 of the insulating film 14. In other words, the perimeter of the second outer periphery (or the second outer circumference) 11_2b of the first conductive semiconductor layer 11 that is not covered by the insulating film 14 may be larger than the perimeter of the first outer periphery (or the first outer circumference) 11_2a of the first conductive semiconductor layer 11 that is covered by the insulating film 14. As a result, the third diameter D3 of the lower surface 11_1 of the first conductive semiconductor layer 11 may be larger than the first diameter D1 of the interface 11_3, and the fourth diameter D4 of the lower surface 11_1 of the first conductive semiconductor layer 11 may be larger than the second diameter D2 of the interface 11_3.

Meanwhile, in an embodiment, the emissive stack pattern 10 may have may have a polygonal column shape, for example, a hexagonal column shape, as illustrated in FIGS. 4A-4C. In other words, the emissive stack pattern 10 may have the hexagonal column shape such that each of the lower surface 11_1 of the first conductive semiconductor layer 11, the upper surface 15_1 of the electrode layer 15, and the interface 11_3 has a hexagonal shape. Furthermore, the light emitting element LD may also have the hexagonal column shape corresponding to that of the emissive stack pattern 10. In an embodiment of the present disclosure, each of the lower surface 11_1 of the first conductive semiconductor layer 11, the upper surface 15_1 of the electrode layer 15, and the interface 11_3 may have a regular hexagonal shape.

The perimeter C1 of the interface 11_3 may be determined by its diameter. When the interface 11_3 has the regular hexagonal shape, the perimeter C1 of the interface 11_3 may be determined by a radius r of a circumscribed circle of the interface 11_3. Here, the radius r of the circumscribed circle of the interface 11_3 may be the same as a length r of one side of the interface 11_3 having the regular hexagonal shape. The perimeter C1 of the interface 11_3 may be a value obtained by multiplying the radius r of the circumscribed circle of the interface 11_3 by 6. As a result, the perimeter of the first outer periphery (or the first outer circumference) 11_2a of the first conductive semiconductor layer 11 covered by the insulating film 14 may be determined by the radius r of the circumscribed circle of the interface 11_3.

The perimeter of the second outer periphery (or the second outer circumference) 11_2b of the first conductive semiconductor layer 11 which is not covered by the insulating film 14 may be the same as the perimeter C2 of the lower surface 11_1 of the first conductive semiconductor layer 11. In an embodiment of the present disclosure, the perimeter C2 of the lower surface 11_1 of the first conductive semiconductor layer 11 may be determined by its diameter. When the lower surface 11_1 of the first conductive semiconductor layer 11 has the regular hexagonal shape, the perimeter C2 of the lower surface 11_1 may be determined by the radius R of the circumscribed circle of the lower surface 11_1. Here, the radius R of the circumscribed circle of the lower surface 11_1 of the first conductive semiconductor layer 11 may be the same as the length R of one side of the lower surface 11_1 having the regular hexagonal shape. The perimeter C2 of the lower surface 11_1 of the first conductive semiconductor layer 11 may be a value obtained by multiplying the radius R of the circumscribed circle of the lower surface 11_1 by 6. As a result, the perimeter of a portion of the second outer periphery (or the second outer circumference) 11_2b of the first conductive semiconductor layer 11 which is not covered by the insulating film 14 may be determined by the radius R of the circumscribed circle of the lower surface 11_1 of the first conductive semiconductor layer 11.

In an embodiment of the present disclosure, the length of one side (or the radius R of the circumscribed circle) of the lower surface 11_1 of the first conductive semiconductor layer 11 may be larger than the length of one side (or the radius r of the circumscribed circle) of the interface 11_3. Thereby, the perimeter C2 of the lower surface 11_1 of the first conductive semiconductor layer 11 may be larger than the perimeter C1 of the interface 11_3. Therefore, the perimeter of the second outer periphery (or the second outer circumference) 11_2b of the first conductive semiconductor layer 11 that is not covered by the insulating film 14 may be larger than the perimeter of the first outer periphery (or the first outer circumference) 11_2a of the first conductive semiconductor layer 11 that is covered by the insulating film 14.

Figure 5A:
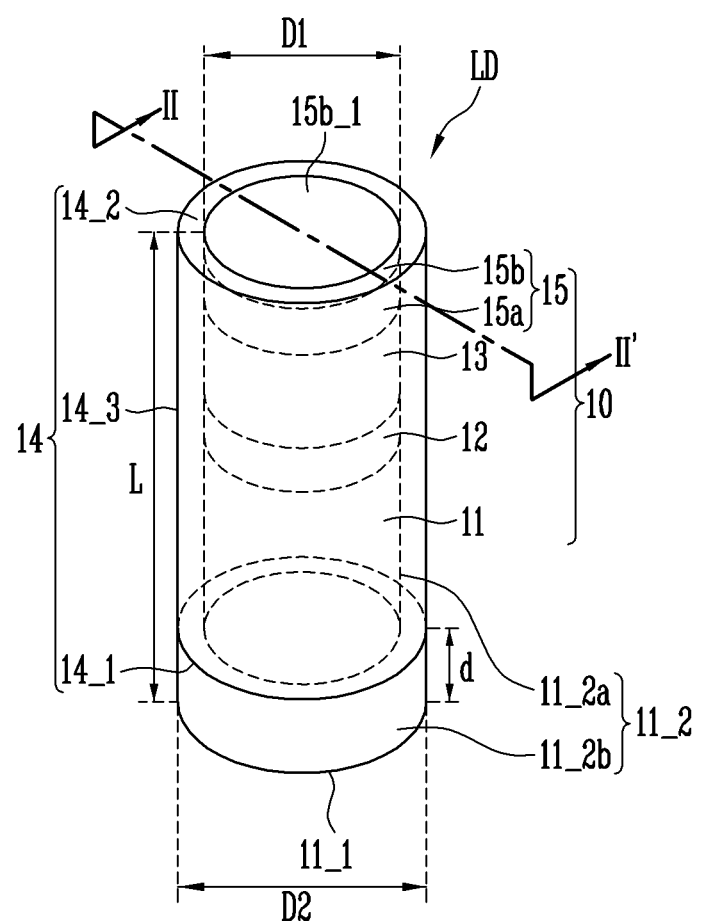
FIG. 5A is a perspective view illustrating a light emitting element in accordance with an embodiment of the present disclosure.
Figure 5B:
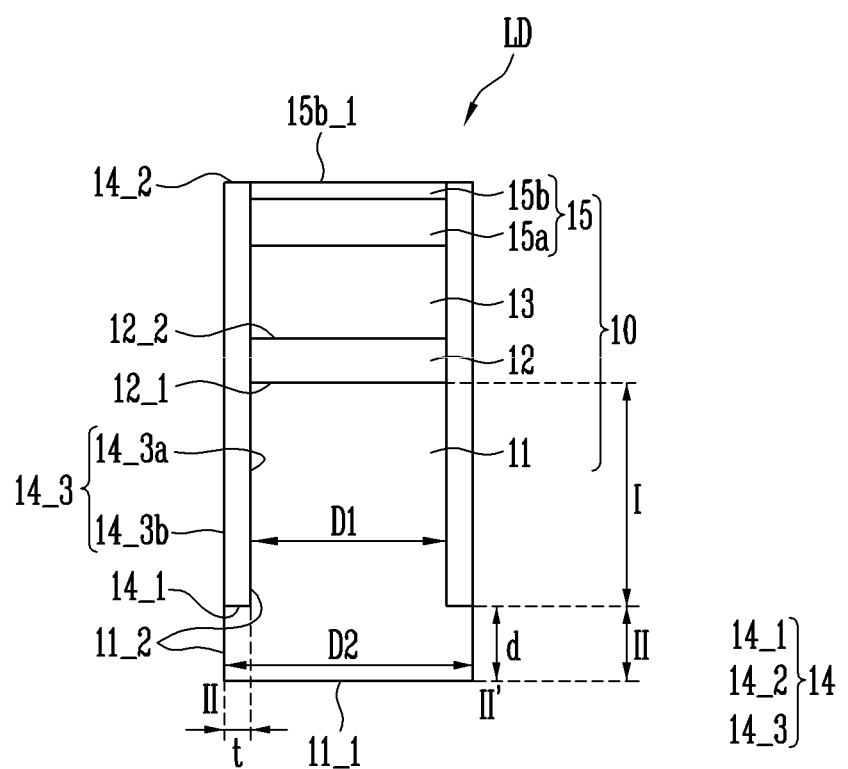
FIG. 5B is a sectional view taken along the line II-II' of FIG. 5A.
Figure 6A:
FIGS. 6A-6K are sectional views sequentially illustrating a method of manufacturing the light emitting element of FIGS. 5A and 5B.
Figure 6B:
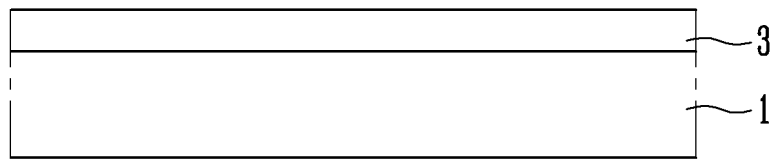
Figure 6C:
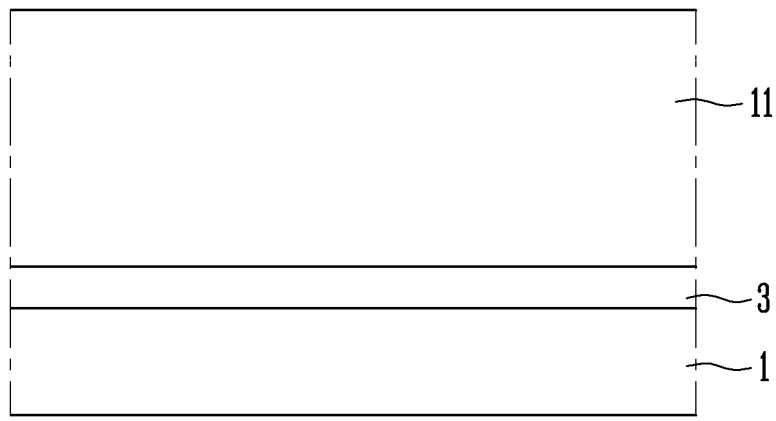
Figure 6D:
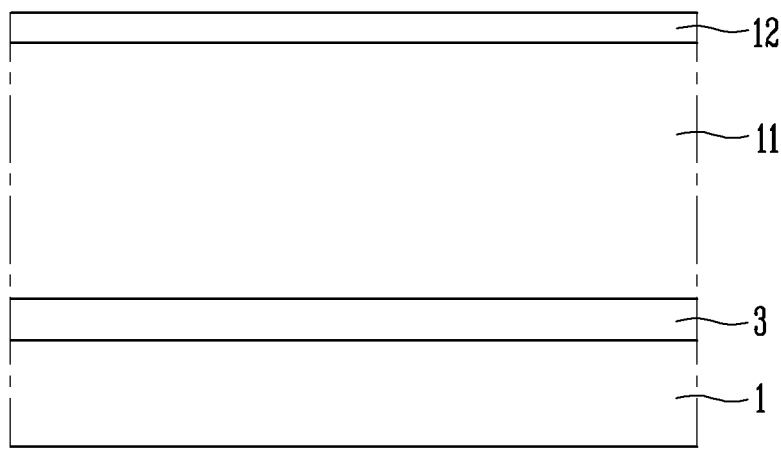
Figure 6E:
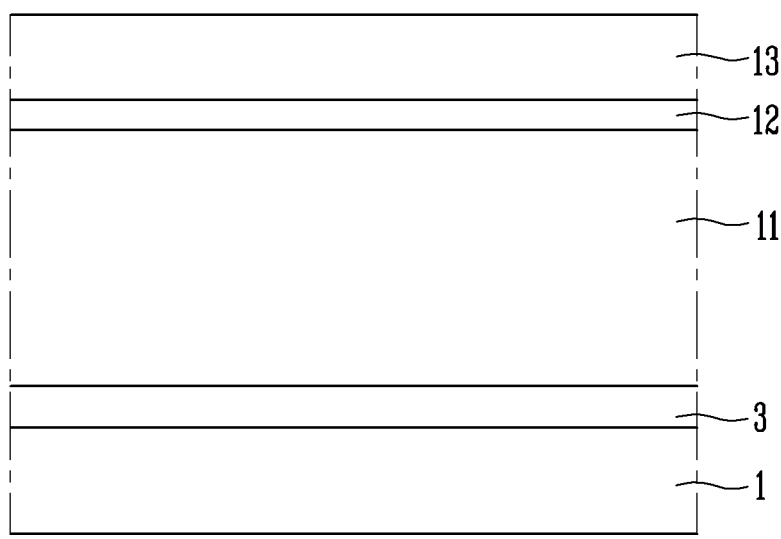
Figure 6F:
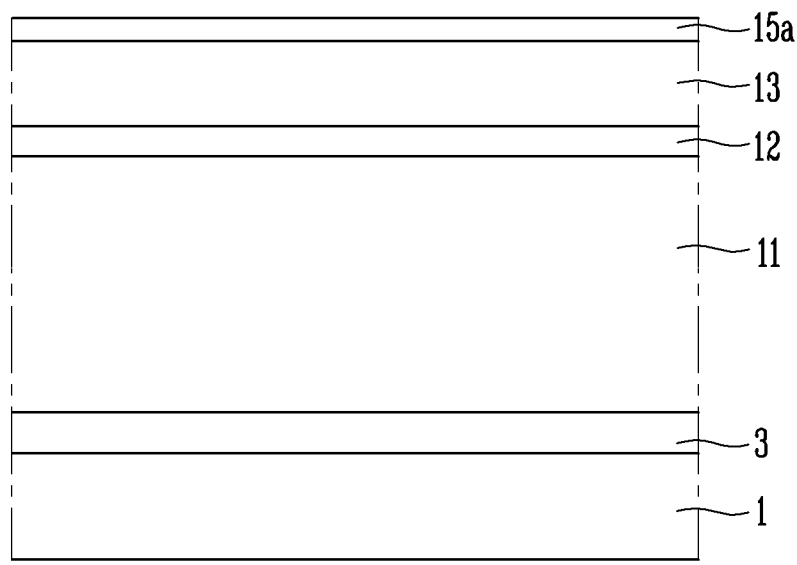
Figure 6G:
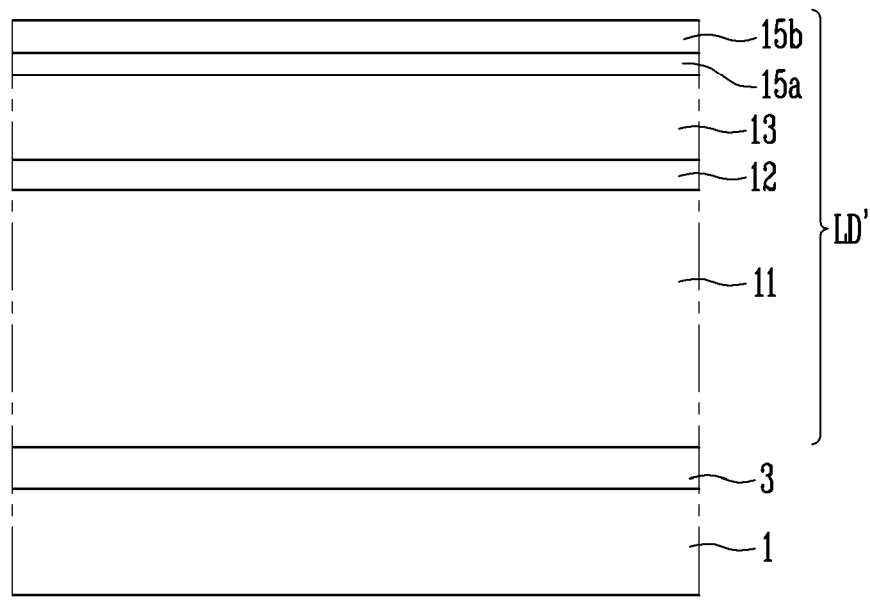
Figure 6H:
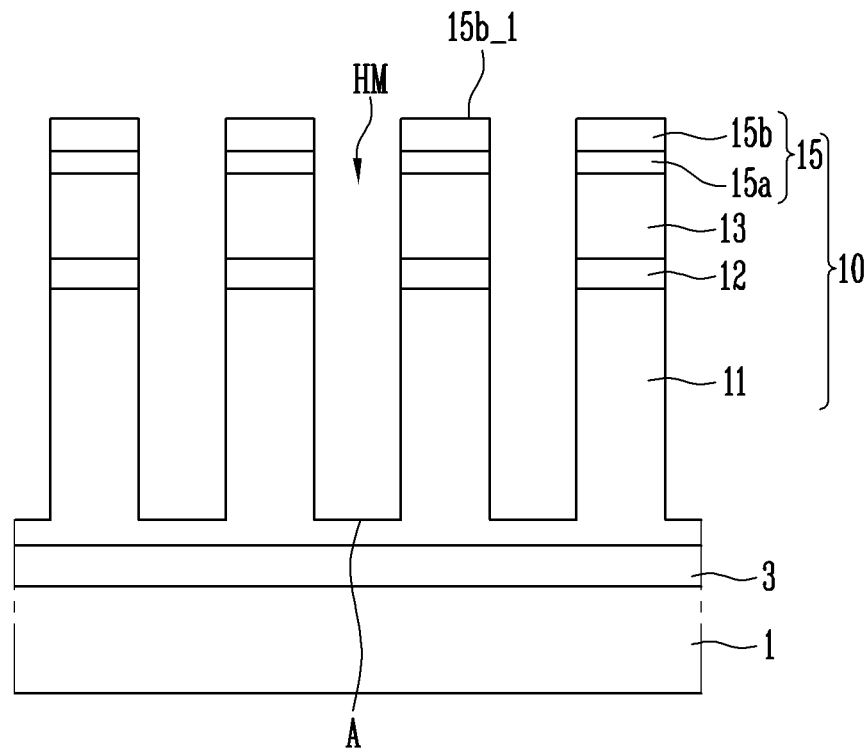
Figure 6I:
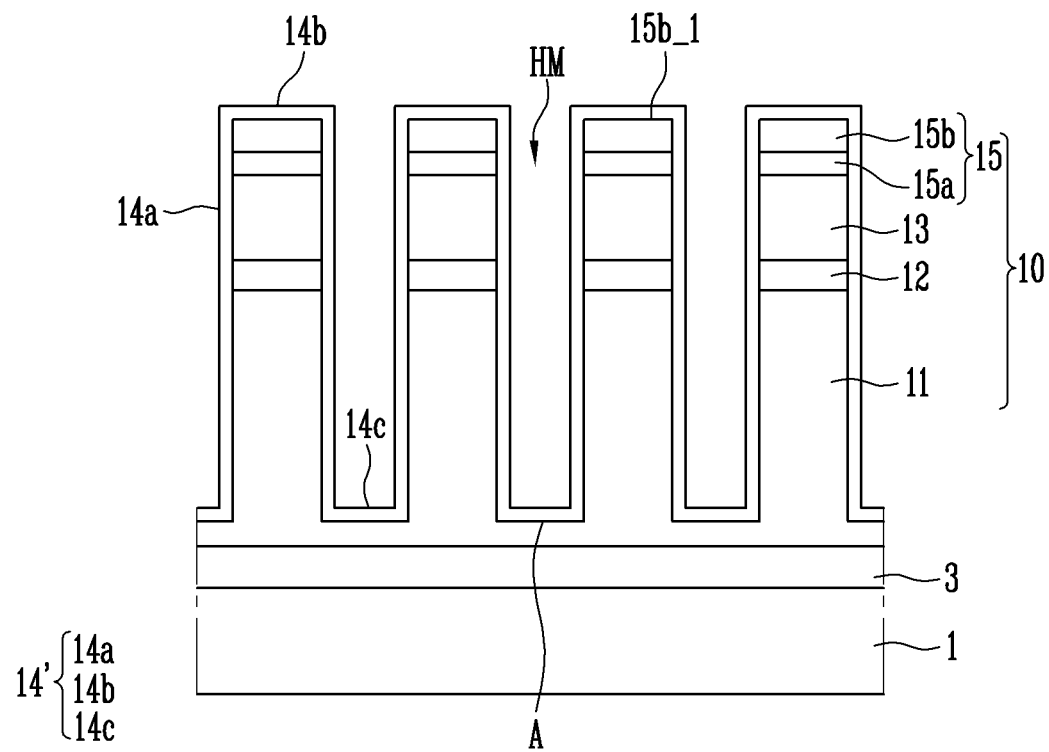
Figure 6J:
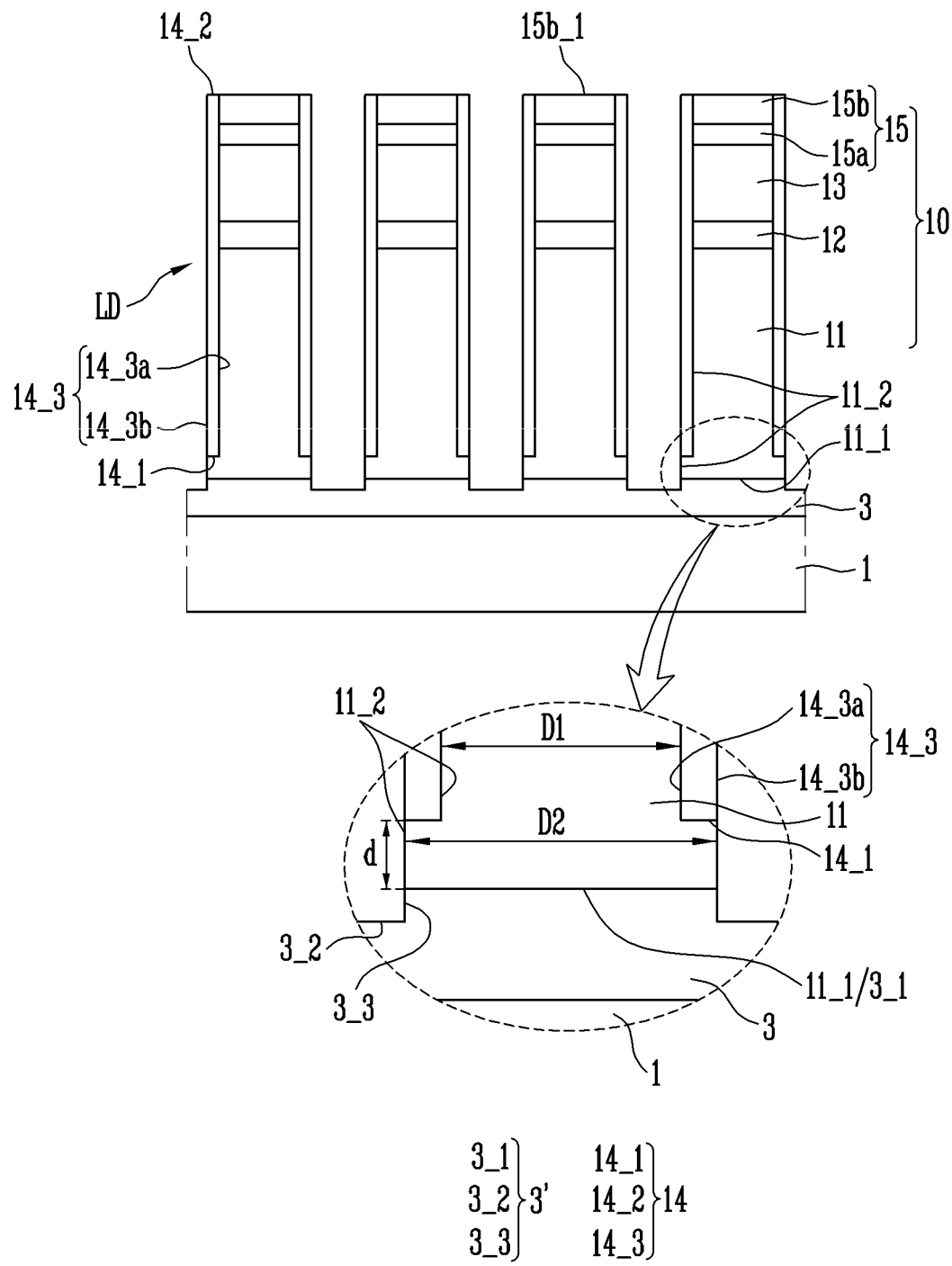
Figure 6K:
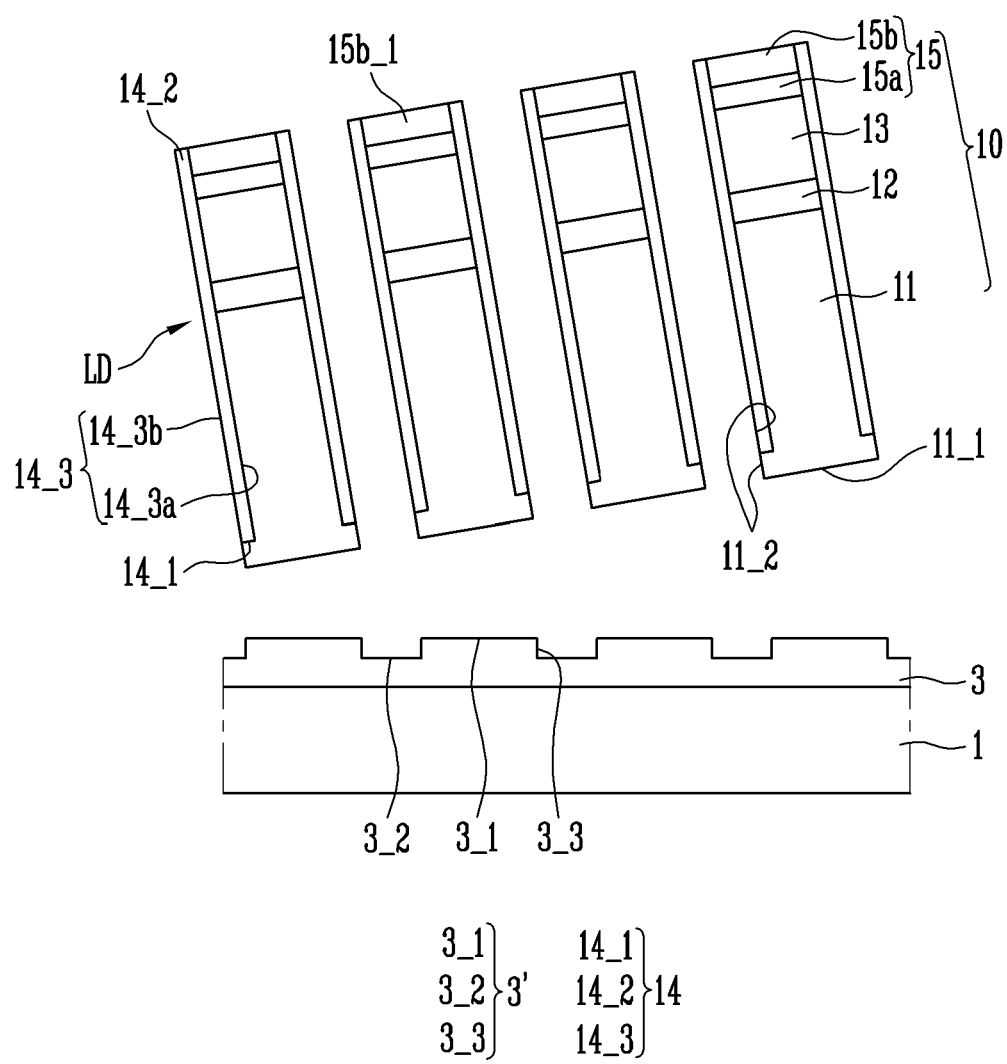

FIG. 5A is a perspective view illustrating a light emitting element in accordance with an embodiment of the present disclosure, and FIG. 5B is a sectional view taken along line II-II' of FIG. 5A.

The light emitting element shown in FIGS. 5A and 5B may have substantially the same or similar configuration as the light emitting element of FIGS. 1A-1D except that an additional electrode layer is disposed above the electrode layer.

Therefore, to avoid redundant explanation, the description of the light emitting element of FIGS. 5A and 5B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

In FIG. 5B, a portion of the outer periphery (or the outer circumference) 11_2 of the first conductive semiconductor layer 11 that is not covered by the insulating film is the second outer periphery (or the second outer circumference) 11_2b of the first conductive semiconductor layer 11 in FIG. 5A, and a remaining portion of the outer periphery (or the outer circumference) 11_2 of the first conductive semiconductor layer that is covered by the insulating film 14 is the first outer periphery (or the first outer circumference) 11_2a of the first conductive semiconductor layer in FIG. 5A.

Referring to FIGS. 5A and 5B, the light emitting element LD in accordance with an embodiment of the present disclosure may include an emissive stack pattern 10 formed by sequentially stacking a first conductive semiconductor layer 11, an active layer 12, a second conductive semiconductor layer 13, and an electrode layer 15 in the longitudinal direction L. Furthermore, the light emitting element LD may further include an insulating film 14 provided on a surface of the emissive stack pattern 10. When the emissive stack pattern 10 has a cylindrical shape, the light emitting element LD may also have a cylindrical shape corresponding to that of the emissive stack pattern 10.

The electrode layer 15 may include a first electrode layer 15a disposed on the second conductive semiconductor layer 13 and a second electrode layer 15b disposed on the first electrode layer 15a. In this case, the first conductive semiconductor layer 11 may be disposed on a first end (e.g. the bottom of the cylinder) of the light emitting element LD, and the second electrode layer 15b may be disposed on a second end (e.g. the top of the cylinder) of the light emitting element LD. In other words, the light emitting element LD may include the lower surface 11_1 of the first conductive semiconductor layer 11 and the upper surface 15b_1 of the second electrode layer 15b, which are positioned on the opposite ends of the light emitting element LD and are exposed to the outside. The lower surface 11_1 of the first conductive semiconductor layer 11 and the upper surface 15b_1 of the second electrode layer 15b may be surfaces which are in contact with an external conductive material to be electrically connected thereto.

The first electrode layer 15a may include metal or a metal oxide. For example, Cr, Ti, Al, Au, Ni, ITO, IZO, ITZO, and an oxide or alloy thereof may be used alone or in combination with each other.

When the active layer 12 of the light emitting element LD emits blue-based and/or green-based light in the wavelength range of 400 nm to 580 nm, the first electrode layer 15a may be made of a transparent metal oxide such as indium tin oxide (ITO). Furthermore, when the active layer 12 of the light emitting element LD emits red-based and/or infrared-based light in the wavelength range of 580 nm to 900 nm, the first electrode layer 15a may be made of an opaque metal oxide such as Cr, Ti, Al, or Ni. In an embodiment, the first electrode layer 15a may be selectively made of a transparent metal oxide such as indium tin oxide (ITO) or an opaque metal according to the color of light that is finally emitted from the light emitting element LD.

The second electrode layer 15b may cover the first electrode layer 15a to protect the first electrode layer 15a from the outside, thereby preventing damage to the first electrode layer 15a. The second electrode layer 15b may be made of metal including Cr, Al, Ti, and Ni, and may have a thickness of 10 nm to 100 nm.

The insulating film 14 may include the lower surface 14_1, the upper surface 14_2, and the side surface 14_3, and the side surface 14_3 of the insulating film 14 may include an inner side surface 14_3a and an outer side surface 14_3b.

In an embodiment of the present disclosure, the insulating film 14 does not cover the lower surface 11_1 of the first conductive semiconductor layer 11 positioned on the first end (e.g. a bottom of the cylinder) of the light emitting element LD and the second outer periphery (or the second outer circumference) 11_2b of the first conductive semiconductor layer 11. The lower surface 11_1 of the first conductive semiconductor layer 11 and the second outer periphery (or the second outer circumference) 11_2b which are not covered by the insulating film 14 may be exposed to the outside. The first outer periphery (or the first outer circumference) 11_2a excluding the second outer periphery (or the second outer circumference) 11_2b of the first conductive semiconductor layer 11 may be covered by the insulating film 14.

The second outer periphery (or the second outer circumference) 11_2b of the first conductive semiconductor layer 11 that is not covered by the insulating film 14 may coincide with the outer side surface 14_3b of the insulating film 14, and may extend to the outer side surface 14_3b. Furthermore, the first outer periphery (or the first outer circumference) 11_2a of the first conductive semiconductor layer 11 that is covered by the insulating film 14 may coincide with the inner side surface 14_3a of the insulating film 14, and may come into contact with the inner side surface 14_3a. Thus, the perimeter of the second outer periphery (or the second outer circumference) 11_2b of the first conductive semiconductor layer 11 may be larger than the perimeter of the first outer periphery (or the first outer circumference) 11_2a of the first conductive semiconductor layer 11, and the first conductive semiconductor layer 11 may be implemented to have different perimeters depending on whether the first conductive semiconductor layer is covered by the insulating film 14 or not.

In an embodiment of the present disclosure, the lower surface 14_1 of the insulating film 14 and the lower surface 11_1 of the first conductive semiconductor layer 11 may be parallel to each other in the horizontal direction while being spaced from each other by a distance d (e.g., a set distance or a predetermined distance d). The upper surface 14_2 of the insulating film 14 and the upper surface 15b_1 of the second electrode layer 15b may be positioned at the same plane.

FIGS. 6A-6K are sectional views sequentially illustrating a method of manufacturing the light emitting element of FIGS. 5A and 5B.

The method of manufacturing the light emitting element illustrated in FIGS. 6A to 6E may be substantially the same as the method of manufacturing the light emitting element illustrated in FIGS. 2A-2E. Therefore, to avoid redundant explanation, the description of the method of manufacturing the light emitting element of FIGS. 6A-6E will be focused on differences from that of the foregoing embodiments.

Components which are not separately explained in the following description of the present embodiment comply with that of the foregoing embodiments. The same reference numeral will be used to designate the same component, and a similar reference numeral will be used to designate a similar component.

Referring to FIGS. 5A, 5B, and 6A-6E, the sacrificial layer 3 is formed on the substrate 1, the first conductive semiconductor layer 11 is formed on the sacrificial layer 3, the active layer 12 is formed on the first conductive semiconductor layer 11, and the second conductive semiconductor layer 13 is formed on the active layer 12.

The substrate 1 may be a GaAs substrate formed of GaAs, and the sacrificial layer 3 may be formed of GaAs, AlAs or AlGaAs.

The first conductive semiconductor layer 11 may include at least one n-type semiconductor layer, the active layer 12 may include at least one of GaInP, AlGaInP, GaAs, AlGaAs, InGaAs, InGaAsP, InP, and InAs, and the second conductive semiconductor layer 13 may include at least one p-type semiconductor layer.

Referring to FIGS. 5A, 5B, and 6A-6F, the first electrode layer 15a is formed on the second conductive semiconductor layer 13. The first electrode layer 15a may be an ohmic contact electrode electrically coupled to the second conductive semiconductor layer 13. In an embodiment of the present disclosure, the first electrode layer 15a may be made of transparent metal oxide such as indium tin oxide ITO so as to reduce or minimize the loss of light generated from the active layer 12 and emitted to the outside of the light emitting element LD and improve current spreading effects from the outside conductive material (not shown) to the second conductive semiconductor layer 13, but the present disclosure is not limited thereto. In an embodiment, the first electrode layer 15a may be made of opaque metal.

Referring to FIGS. 5A, 5B, and 6A-6G, the second electrode layer 15b is formed on the first electrode layer 15a. The second electrode layer 15b covers the first electrode layer 15a to protect the first electrode layer 15a when the first and second etching processes that will be described below are performed. To this end, the second electrode layer 15b may use material that has high resistance to etching.

The material having high resistance to etching may, for example, include at least one selected from a group consisting of lithium (Li), beryllium (Be), boron (B), sodium (Na), magnesium (Mg), aluminum (Al), silicon (Si), indium (In), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), yttrium (Y), zirconium (Zr), niobium (Nb), molybdenum (Mo), ruthenium (Ru), rhodium (Rh), indium (In), Tin (Sn), tellurium (Te), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

As described above, the first conductive semiconductor layer 11, the active layer 12, the second conductive semiconductor layer 13, the first electrode layer 15a, and the second electrode layer 15b which are sequentially stacked on the substrate 1 form an emissive stack LD'.

Referring to FIGS. 5A, 5B, and 6A-6H, after the mask (not shown) having the plurality of openings is disposed above the emissive stack LD', the first etching process is performed to pattern the emissive stack LD' at the nano-scale or micro-scale interval, thus forming the plurality of emissive stack patterns 10.

In the first etching process, an area of the emissive stack LD' corresponding to the openings of the mask may be etched, thus forming the groove HM that causes the area A of the first conductive semiconductor layer 11 to be exposed to the outside. The groove HM may have a shape that is recessed from the upper surface of each emissive stack pattern 10 to the area A of the first conductive semiconductor layer 11 in the vertical direction. Here, the upper surface of each emissive stack pattern 10 may be the upper surface 15b_1 of the second electrode layer 15b.

In an embodiment of the present disclosure, each of the emissive stack patterns 10 may have a nano-scale or micro-scale size.

Referring to FIGS. 5A, 5B, and 6A-6I, the insulating material layer 14' is formed on the emissive stack patterns 10 and the area A of the first conductive semiconductor layer 11. The insulating material layer 14' may include an upper insulating material layer 14b that completely covers the upper surface of each of the emissive stack patterns 10, a side insulating material layer 14a that completely covers the side surface of each of the emissive stack patterns 10, and a lower insulating material layer 14c that completely covers the area A of the first conductive semiconductor layer 11.

Referring to FIGS. 5A, 5B, and 6A-6J, the second etching process is performed to form the insulating film 14. Through the second etching process, the insulating film 14 including only the side insulating material layer 14a that covers the side surface of each emissive stack pattern 10 may be finally formed. Through the second etching process, the upper insulating material layer 14b may be removed, so that the upper surface 15b_1 of the second electrode layer 15b may be exposed to the outside. In this case, the upper surface 14_2 of the insulating film 14 and the upper surface 15b_1 of the second electrode layer 15b may be provided at the same surface.

Furthermore, through the second etching process, a portion of the sacrificial layer 3 may be removed, so that at least one or more uneven patterns 3' may be formed on a surface of the sacrificial layer 3 and a portion of the outer periphery (or the outer circumference) 11_2 of the first conductive semiconductor layer 11 may be exposed to the outside.

In some embodiments, the second etching process may be performed through the dry etching method using at least one etching gas selected from a group consisting of $BCl_3$, $SiCl_4$, $Cl_2$, HBr, $SF_6$, $CF_4$, $C_4F_8$, $CH_4$, $CHF_3$, $NF_3$, CFCs (chlorofluorocarbons), $H_2$, and $O_2$. It is preferable that at least inert gas selected from $N_2$, Ar, and He be further added to the etching gas.

Because the second electrode layer 15b containing the material having high resistance to etching is disposed to be the uppermost layer of each emissive stack pattern 10, the first electrode layer 15a located under the second electrode layer 15b may not be affected by the etching gas used in the second etching process. In other words, as the second electrode layer 15b may be disposed above the first electrode layer 15a to protect the first electrode layer 15a, it is possible to prevent the first electrode layer 15a from being damaged by the etching gas. In an embodiment, a portion of the upper surface 15b_1 of the second electrode layer 15b may be removed in the second etching process.

A portion of the outer periphery (or the outer circumference) 11_2 of the first conductive semiconductor layer 11 exposed to the outside may coincide with the outer side surface 14_3b of the insulating film 14, and a remaining portion of the outer periphery (or the outer circumference) 11_2 of the first conductive semiconductor layer 11 covered by the insulating film 14 may coincide with the inner side surface 14_3a of the insulating film 14.

As a portion of each of the insulating material layer 14' and the sacrificial layer 3 is removed and thus a portion of the outer periphery (or the outer circumference) 11_2 of the first conductive semiconductor layer 11 is exposed to the outside by the second etching process, the lower surface 11_1 of the first conductive semiconductor layer 11 may be positioned closer to the substrate 1 than the lower surface 14_1 of the insulating film 14. A distance difference d between the lower surface 14_1 of the insulating film 14 and the lower surface 11_1 of the first conductive semiconductor layer 11 may be within about 100 nm, but is not limited thereto.

The light emitting elements LD enclosed by the insulating film 14 may be formed on the substrate 1 by performing the second etching process.

Referring to FIGS. 5A, 5B, and 6A-6K, the light emitting elements LD are separated from the substrate 1 using the chemical lift-off (CLO) method. The chemical lift-off may be performed by removing the sacrificial layer 3 including the uneven pattern 3'.

In some embodiments, the chemical lift-off may be performed through a wet etching method. In this case, because the second electrode layer 15b containing the material having high resistance to etching is disposed to be the uppermost layer of each emissive stack pattern 10, the first electrode layer 15a located under the second electrode layer 15b may not be affected by etchant used in the chemical lift-off. In other words, as the second electrode layer 15b may be disposed above the first electrode layer 15a to protect the first electrode layer 15a, it is possible to reduce damage to the first electrode layer 15a due to the etchant. In an embodiment, the second electrode layer 15b may be removed from each light emitting element LD. In such a case, the second electrode layer 15b may be removed after or before the chemical lift-off process.

Figure 7A:
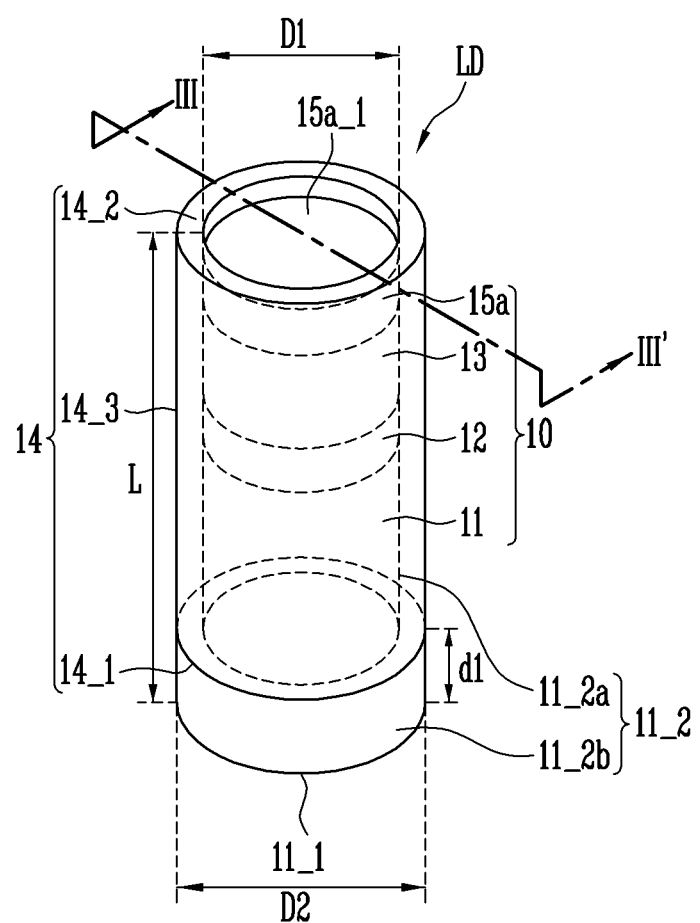
FIG. 7A is a perspective view illustrating a light emitting element in accordance with an embodiment of the present disclosure.
Figure 7B:
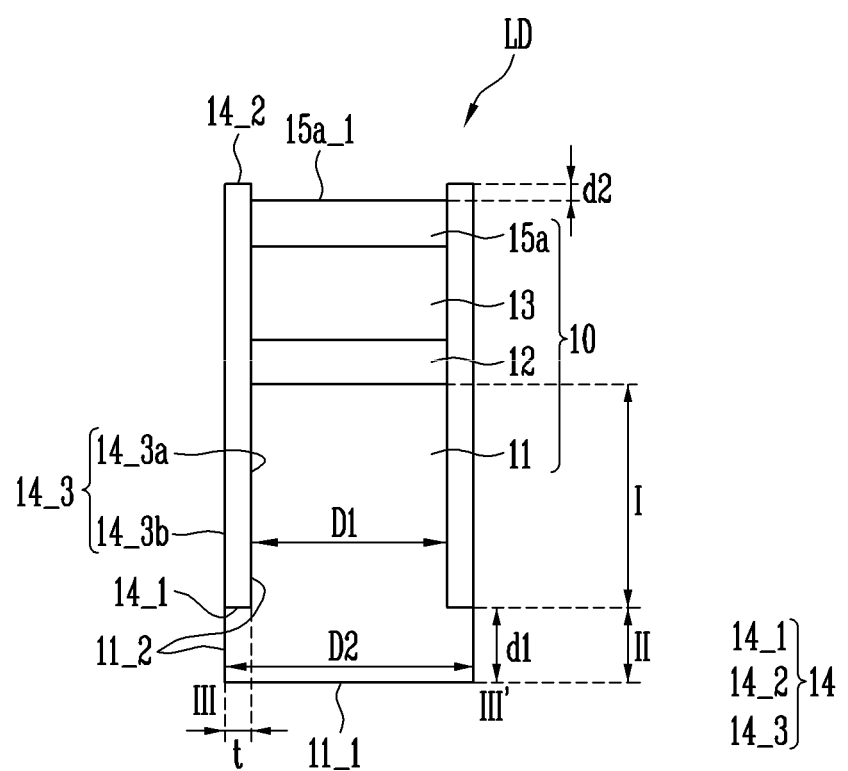
FIG. 7B is a sectional view taken along the line III-III' of FIG. 7A.
Figure 8A:
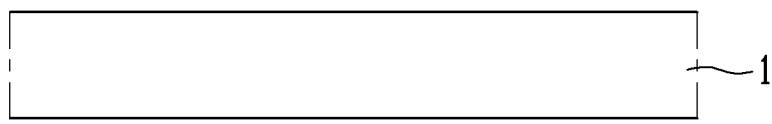
FIGS. 8A-8L are sectional views sequentially illustrating a method of manufacturing the light emitting element of FIGS. 7A and 7B.
Figure 8B:
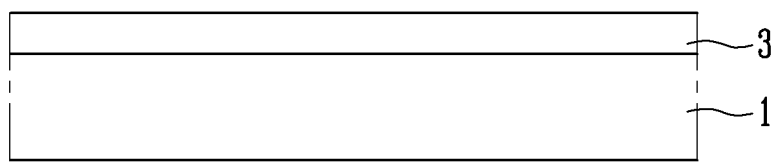
Figure 8C:
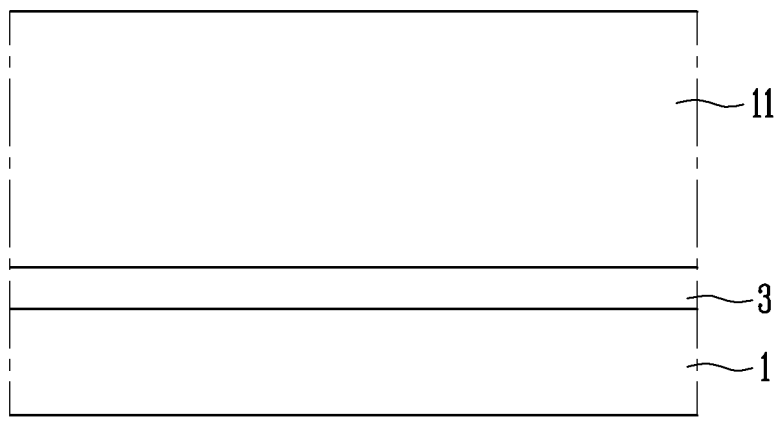
Figure 8D:
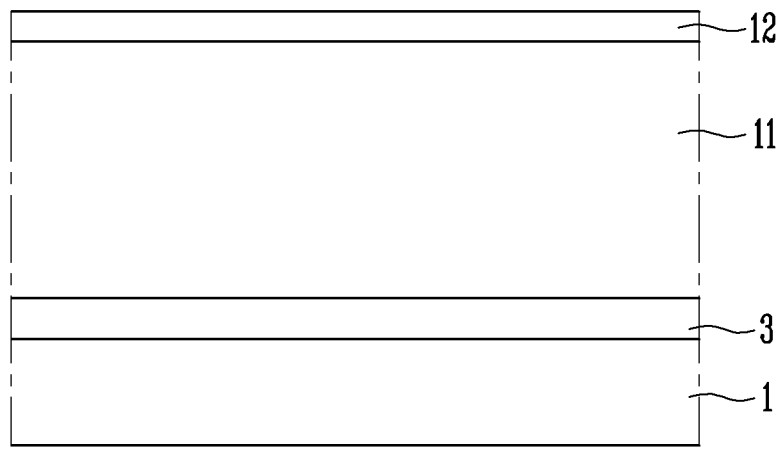
Figure 8E:
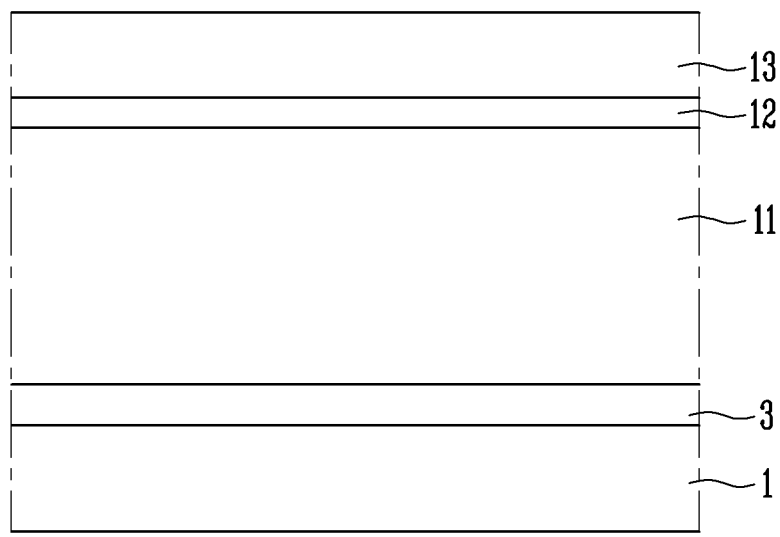
Figure 8F:
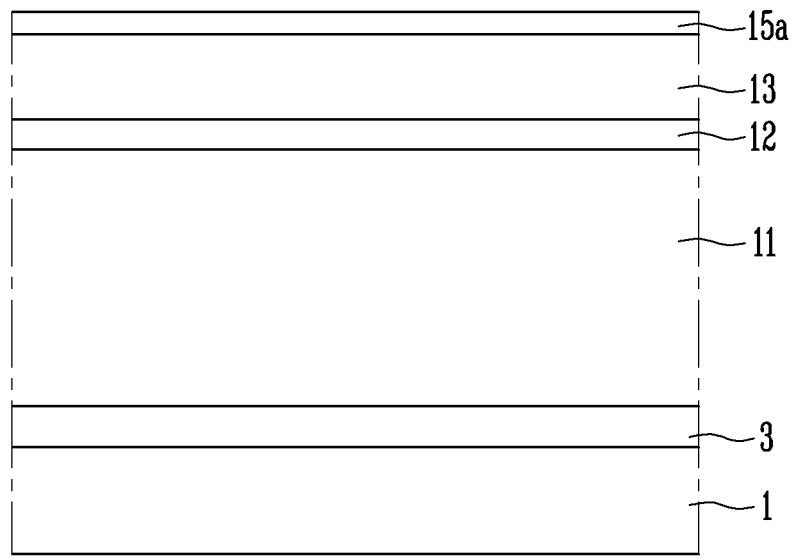
Figure 8G:
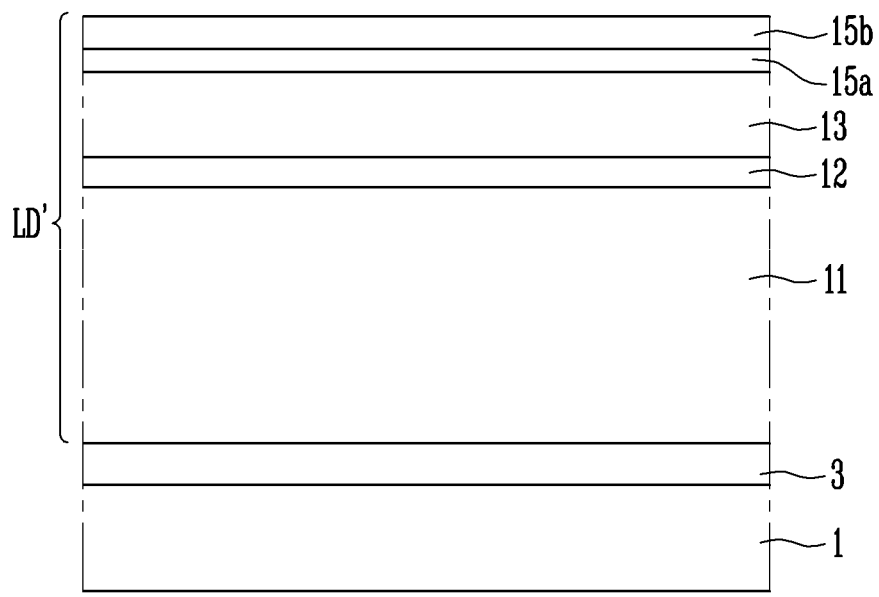
Figure 8H:
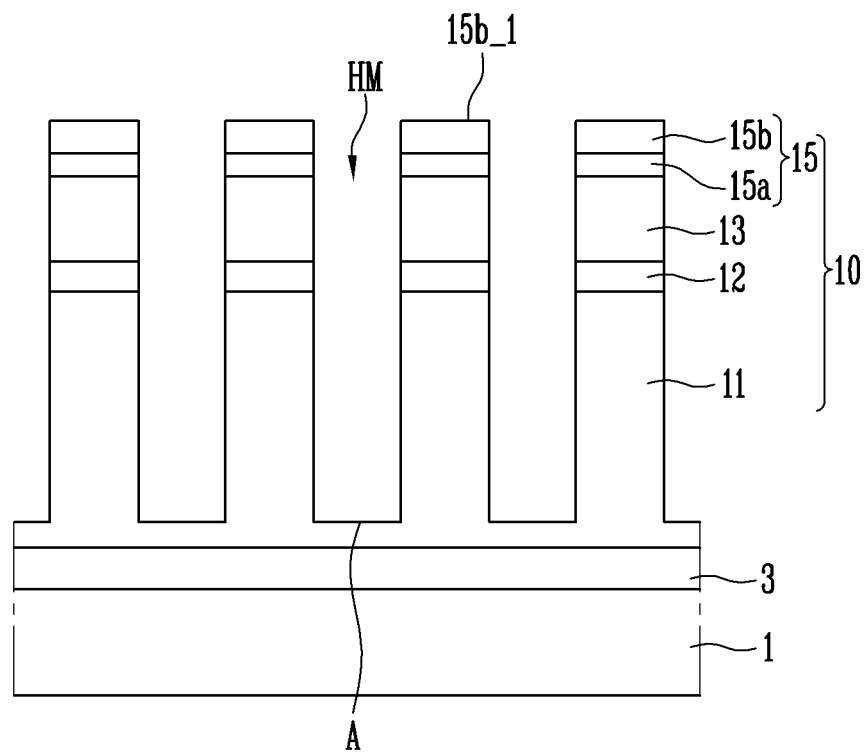
Figure 8I:
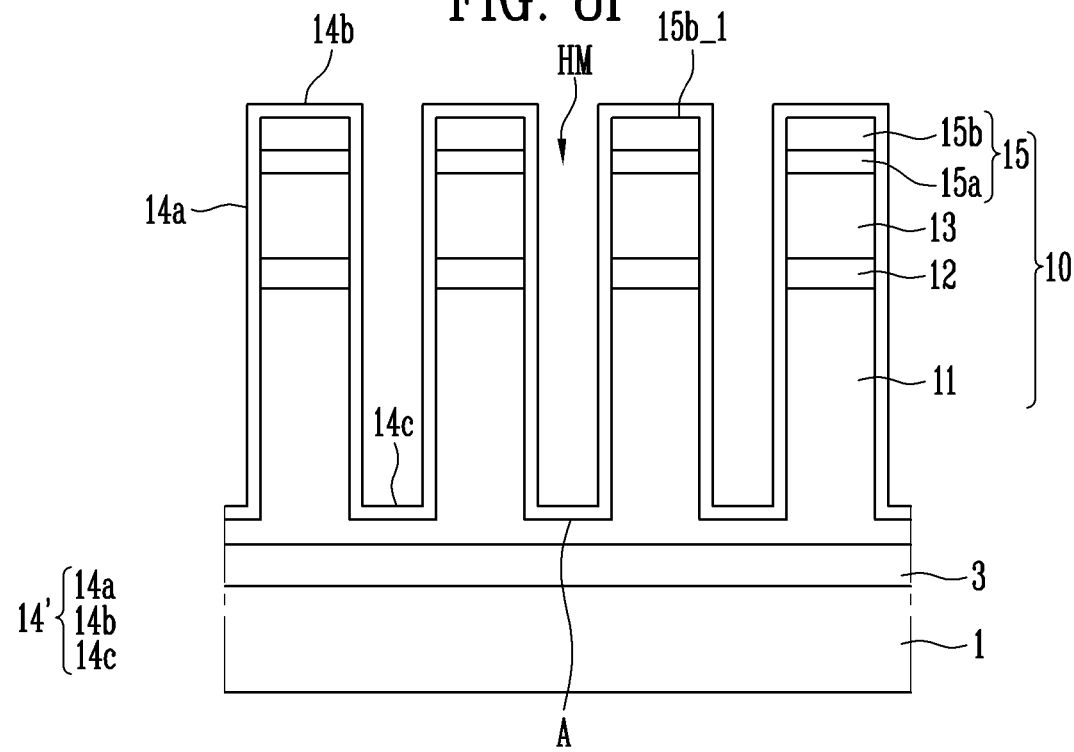
Figure 8J:
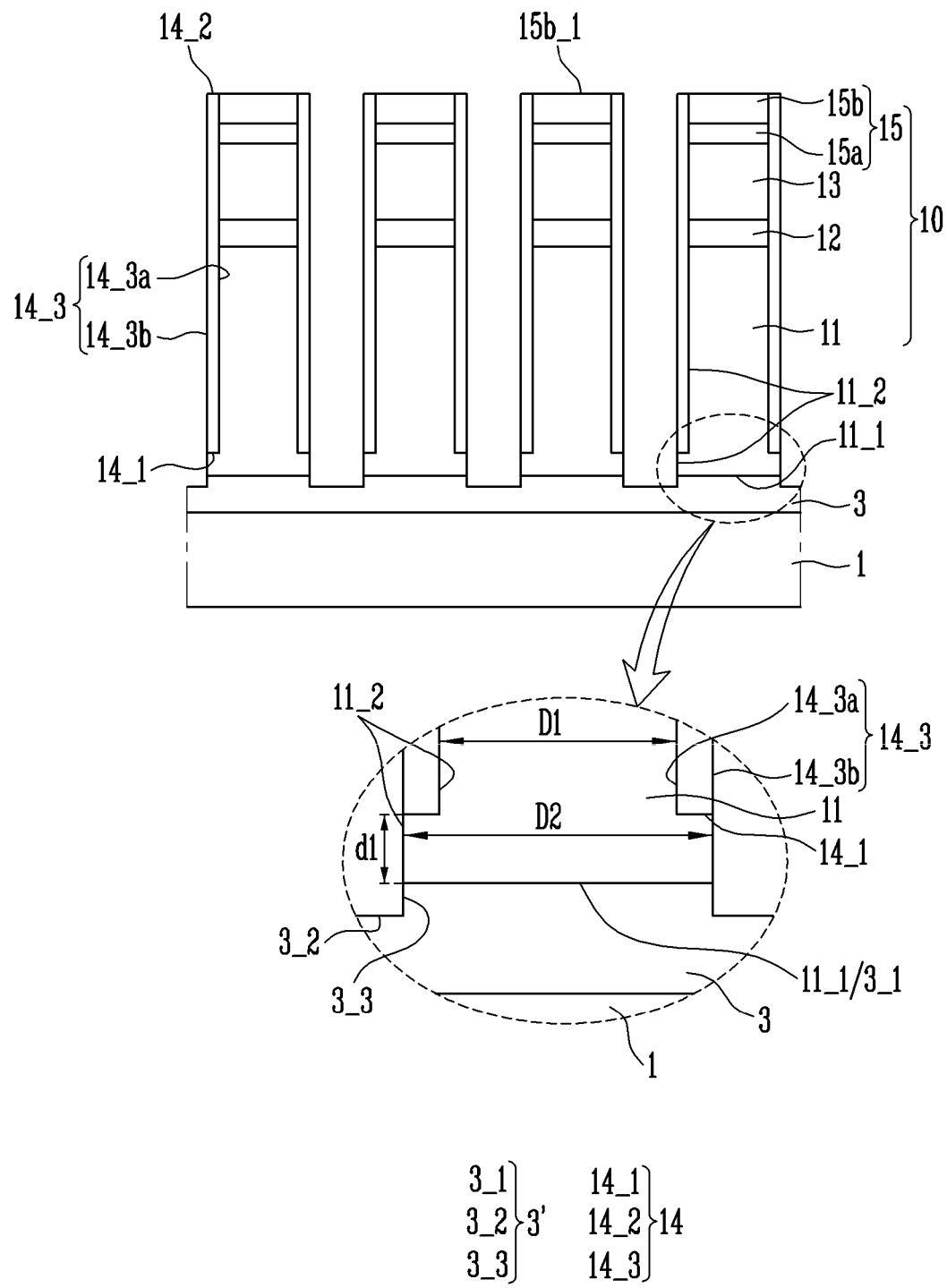
Figure 8K:
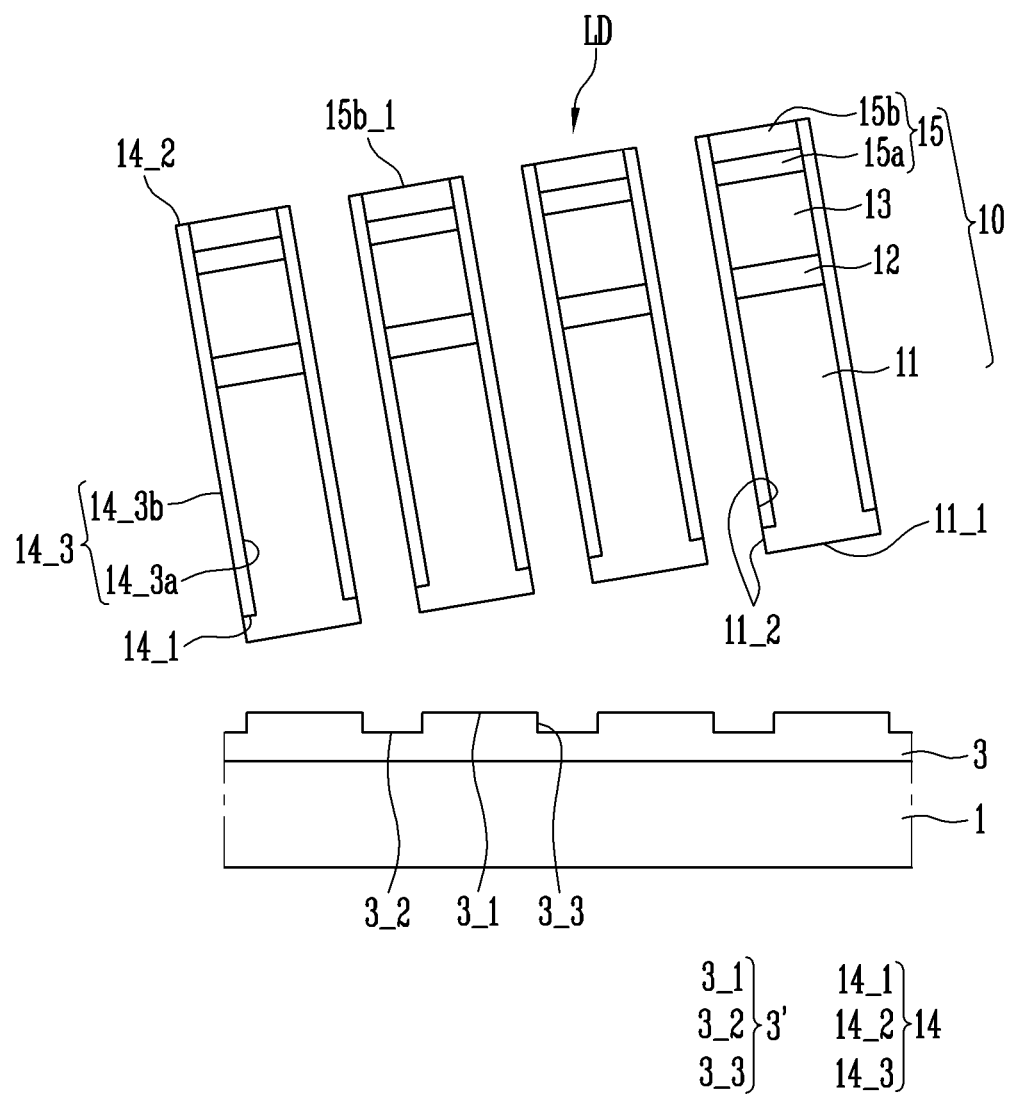
Figure 8L:
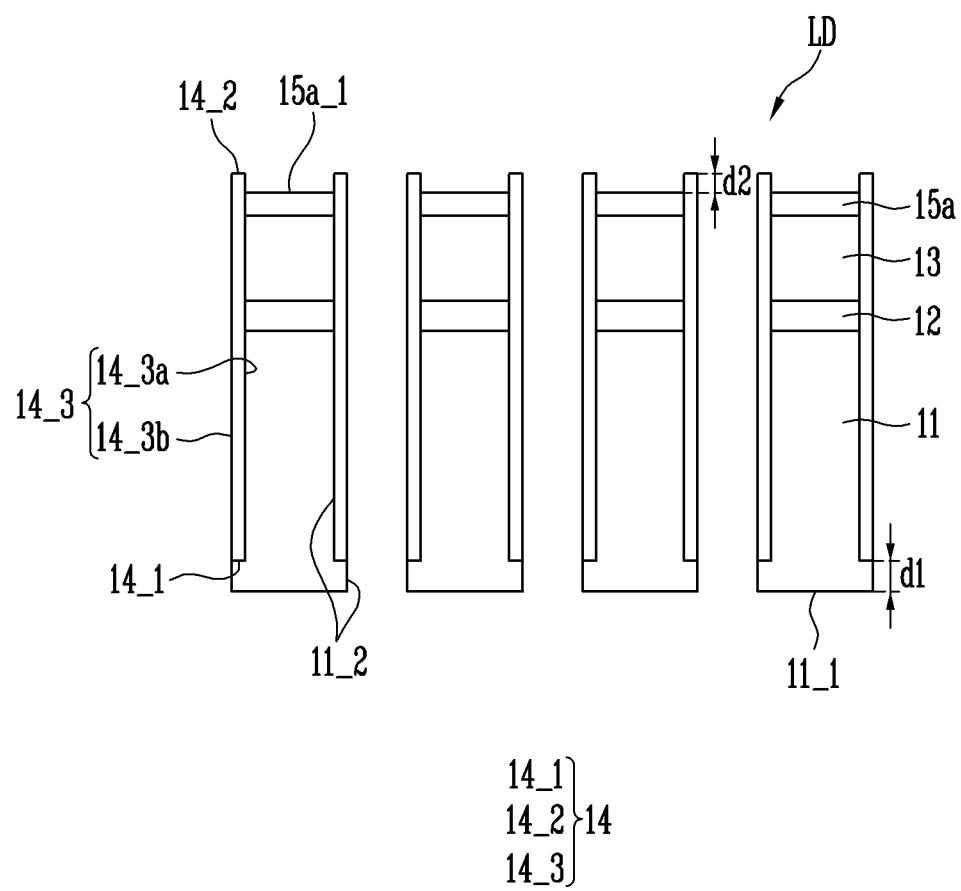

FIG. 7A is a perspective view illustrating a light emitting element in accordance with an embodiment of the present disclosure, and FIG. 7B is a sectional view taken along the line III-III' of FIG. 7A.

The light emitting element illustrated in FIGS. 7A and 7B may have substantially the same or similar configuration as the light emitting element of FIGS. 5A and 5B except that the upper surface of the electrode layer on the second conductive semiconductor layer and the upper surface of the insulating film are not disposed on the same surface.

Therefore, to avoid redundant explanation, the description of the light emitting element of FIGS. 7A and 7B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

In FIG. 7B, a portion of the outer periphery (or the outer circumference) 11_2 of the first conductive semiconductor layer 11 that is not covered by the insulating film is the second outer periphery (or the second outer circumference) 11_2b of the first conductive semiconductor layer in FIG. 7A, and a remaining portion of the outer periphery (or the outer circumference) 11_2 of the first conductive semiconductor layer 11 that is covered by the insulating film is the first outer periphery (or the first outer circumference) 11_2a of the first conductive semiconductor layer in FIG. 7A.

Referring to FIGS. 7A and 7B, the light emitting element LD in accordance with an embodiment of the present disclosure may include an emissive stack pattern 10 formed by sequentially stacking a first conductive semiconductor layer 11, an active layer 12, a second conductive semiconductor layer 13, and a first electrode layer 15a in the longitudinal direction L. Furthermore, the light emitting element LD may further include an insulating film 14 provided on an outer surface of the emissive stack pattern 10.

In an embodiment of the present disclosure, the first conductive semiconductor layer 11 may be disposed on a first end (e.g. the bottom of the cylinder) of the light emitting element LD, and the first electrode layer 15a may be disposed on a second end (e.g. the top of the cylinder) of the light emitting element LD. In other words, the light emitting element LD may include the lower surface 11_1 of the first conductive semiconductor layer 11 and the upper surface 15a_1 of the first electrode layer 15a, which are positioned on the opposite ends of the light emitting element LD and are exposed to the outside. The lower surface 11_1 of the first conductive semiconductor layer 11 and the upper surface 15a_1 of the first electrode layer 15a may be surfaces which are in contact with an external conductive material to be electrically connected thereto.

The first electrode layer 15a corresponding to the first electrode layer 15a of FIG. 5A may include metal or a metal oxide. For example, Cr, Ti, Al, Au, Ni, ITO, IZO, ITZO, and an oxide or alloy thereof may be used alone or in combination with each other. In an embodiment of the present disclosure, the first electrode layer 15a may be made of transparent metal oxide such as indium tin oxide ITO.

The insulating film 14 does not cover the lower surface 11_1 of the first conductive semiconductor layer 11 positioned on the first end (e.g. the bottom of the cylinder) of the light emitting element LD and the second outer periphery (or the second outer circumference) 11_2b of the first conductive semiconductor layer 11. The lower surface 11_1 of the first conductive semiconductor layer 11 and the second outer periphery (or the second outer circumference) 11_2b of the first conductive semiconductor layer 11 which are not covered by the insulating film 14 may be exposed to the outside. The first outer periphery (or the first outer circumference) 11_2a of the first conductive semiconductor layer 11 excluding the second outer periphery (or the second outer circumference) 11_2b of the first conductive semiconductor layer 11 may be covered by the insulating film 14.

The second outer periphery (or the second outer circumference) 11_2b of the first conductive semiconductor layer 11 that is not covered by the insulating film 14 may coincide with the outer side surface 14_3b of the insulating film 14, and may extend to the outer side surface 14_3b. Furthermore, the first outer periphery (or the first outer circumference) 11_2a of the first conductive semiconductor layer 11 that is covered by the insulating film 14 may coincide with the inner side surface 14_3a of the insulating film 14, and may come into contact with the inner side surface 14_3a.

In some embodiments of the present disclosure, the lower surface 14_1 of the insulating film 14 and the lower surface 11_1 of the first conductive semiconductor layer 11 may be parallel to each other in the horizontal direction while being spaced from each other by a distance d1 (e.g., a set distance or a predetermined distance d1). The lower surface 11_1 of the first conductive semiconductor layer 11 may protrude downwards from the lower surface 14_1 of the insulating film 14. In this case, the lower surface 14_1 of the insulating film 14 may be disposed closer to the active layer 12 than the lower surface 11_1 of the first conductive semiconductor layer 11.

Furthermore, the insulating film 14 may include the upper surface 14_2 that completely covers the first electrode layer 15a and protrudes upwards from the upper surface 15a_1 of the first electrode layer 15a in the longitudinal direction L. In an embodiment of the present disclosure, the upper surface 14_2 of the insulating film 14 and the upper surface 15a_1 of the first electrode layer 15a may be parallel to each other in the horizontal direction while being spaced from each other by a distance d2 (e.g., a set distance or a predetermined distance d2). The upper surface 14_2 of the insulating film 14 may protrude upwards from the upper surface 15a_1 of the first electrode layer 15a. In this case, the upper surface 15a_1 of the first electrode layer 15a may be disposed closer to the active layer 12 than the upper surface 14_2 of the insulating film 14.

In an embodiment of the present disclosure, a distance d2 between the upper surface 14_2 of the insulating film 14 and the upper surface 15a_1 of the first electrode layer 15a may be smaller than a distance d1 between the lower surface 14_1 of the insulating film 14 and the lower surface 11_1 of the first conductive semiconductor layer 11, but the present disclosure is not limited thereto. In an embodiment, the distance d2 between the upper surface 14_2 of the insulating film 14 and the upper surface 15a_1 of the first electrode layer 15a may be the same as the distance d1 between the lower surface 14_1 of the insulating film 14 and the lower surface 11_1 of the first conductive semiconductor layer 11.

FIGS. 8A-8L are sectional views sequentially illustrating a method of manufacturing the light emitting element of FIGS. 7A and 7B.

The method of manufacturing the light emitting element illustrated in FIGS. 8A to 8K may be substantially the same as the method of manufacturing the light emitting element illustrated in FIGS. 6A to 6K. Therefore, to avoid redundant explanation, differences from the foregoing embodiments will be mainly described. Components which are not separately explained in the following description of the present embodiment comply with that of the foregoing embodiments. The same reference numeral will be used to designate the same component, and a similar reference numeral will be used to designate a similar component.

Referring to FIGS. 7A, 7B, and 8A-8G, the first conductive semiconductor layer 11, the active layer 12, the second conductive semiconductor layer 13, the first electrode layer 15a, and the second electrode layer 15b are sequentially formed on the substrate 1. In an embodiment of the present disclosure, the sacrificial layer 3 may be formed between the substrate 1 and the first conductive semiconductor layer 11.

The first conductive semiconductor layer 11, the active layer 12, the second conductive semiconductor layer 13, the first electrode layer 15a, and the second electrode layer 15b which are sequentially stacked on the substrate 1 form the emissive stack LD'. The second electrode layer 15b may contain material that has high resistance to etching.

Referring to FIGS. 7A, 7B, and 8A-8H, after the mask (not shown) having the plurality of openings is disposed above the emissive stack LD', the first etching process is performed to pattern the emissive stack LD' at the nano-scale or micro-scale interval, thus forming the plurality of emissive stack patterns 10.

In the first etching process, an area of the emissive stack LD' may be etched, thus forming the groove HM that causes the area A of the first conductive semiconductor layer 11 to be exposed to the outside.

Referring to FIGS. 7A, 7B, and 8A-8I, the insulating material layer 14' is formed on the emissive stack patterns 10 and the area A of the first conductive semiconductor layer 11.

Referring to FIGS. 7A, 7B, and 8A-8J, the second etching process is performed to form the insulating film 14. Through the second etching process, the insulating film 14 including only the side insulating material layer 14a that covers the side surface of each emissive stack pattern 10 may be finally formed. Through the second etching process, the upper surface 15b_1 of the second electrode layer 15b may be exposed to the outside.

Because the second electrode layer 15b containing the material having high resistance to etching is disposed to be the uppermost layer of each emissive stack pattern 10, the first electrode layer 15a located under the second electrode layer 15b may not be affected by the etching gas used in the second etching process.

Through the second etching process, a portion of the sacrificial layer 3 may be removed, so that at least one or more uneven patterns 3' may be formed on a surface of the sacrificial layer 3 and a portion of the outer periphery (or the outer circumference) 11_2 of the first conductive semiconductor layer 11 may be exposed to the outside. A portion of the outer periphery (or the outer circumference) 11_2 of the first conductive semiconductor layer 11 exposed to the outside may coincide with the outer side surface 14_3b of the insulating film 14, and a remaining portion of the outer periphery (or the outer circumference) 11_2 of the first conductive semiconductor layer 11 covered by the insulating film 14 may coincide with the inner side surface 14_3a of the insulating film 14.

The light emitting elements LD enclosed by the insulating film 14 may be formed on the substrate 1 by performing the second etching process.

Referring to FIGS. 7A, 7B, and 8A-8K, the light emitting elements LD are separated from the substrate 1 using the chemical lift-off (CLO) method.

Through the above-described manufacturing process, each of the manufactured light emitting elements LD may be shaped such that the lower surface 11_1 of the first conductive semiconductor layer 11, a portion of the outer periphery (or the outer circumference) 11_2 thereof, and the upper surface 15b_1 of the second electrode layer 15b are exposed to the outside.

Referring to FIGS. 7A, 7B, and 8A-8L, a third etching process is performed to remove the second electrode layer 15b and thereby expose the upper surface 15a_1 of the first electrode layer 15a.

As the second electrode layer 15b is removed and thereby the upper surface 15a_1 of the first electrode layer 15a is exposed to the outside due to the third etching process, the upper surface 15a_1 of the first electrode layer 15a may be positioned closer to the substrate 1 than the upper surface 14_2 of the insulating film 14. Here, a distance difference d2 between the upper surface 14_2 of the insulating film 14 and the upper surface 15a_1 of the first electrode layer 15a may be within about 100 nm, but is not limited thereto. In an embodiment of the present disclosure, the distance difference d2 between the upper surface 14_2 of the insulating film 14 and the upper surface 15a_1 of the first electrode layer 15a may be the same as the thickness of the second electrode layer 15b that is removed in the third etching process. The thickness of the second electrode layer 15b may be about 10 nm to 100 nm.

As described above, the third etching process of removing the second electrode layer 15b may be performed after the process of separating the light emitting elements LD from the substrate 1 through the chemical lift-off (CLO) method, but the present disclosure is not limited thereto. In an embodiment, the third etching process of removing the second electrode layer 15b may be performed before the process of separating the light emitting elements LD from the substrate 1 through the chemical lift-off (CLO) method.

Figure 9A:
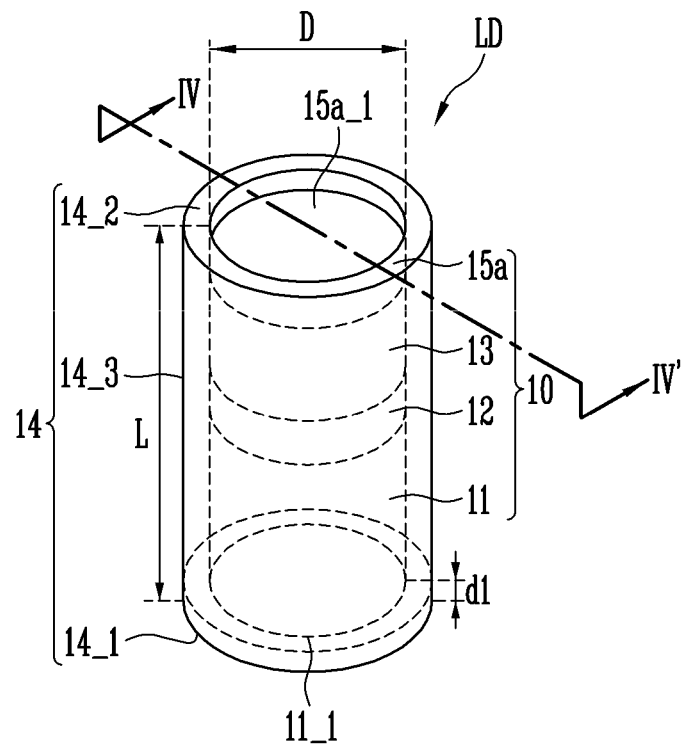
FIG. 9A is a perspective view illustrating a light emitting element in accordance with an embodiment of the present disclosure.
Figure 9B:
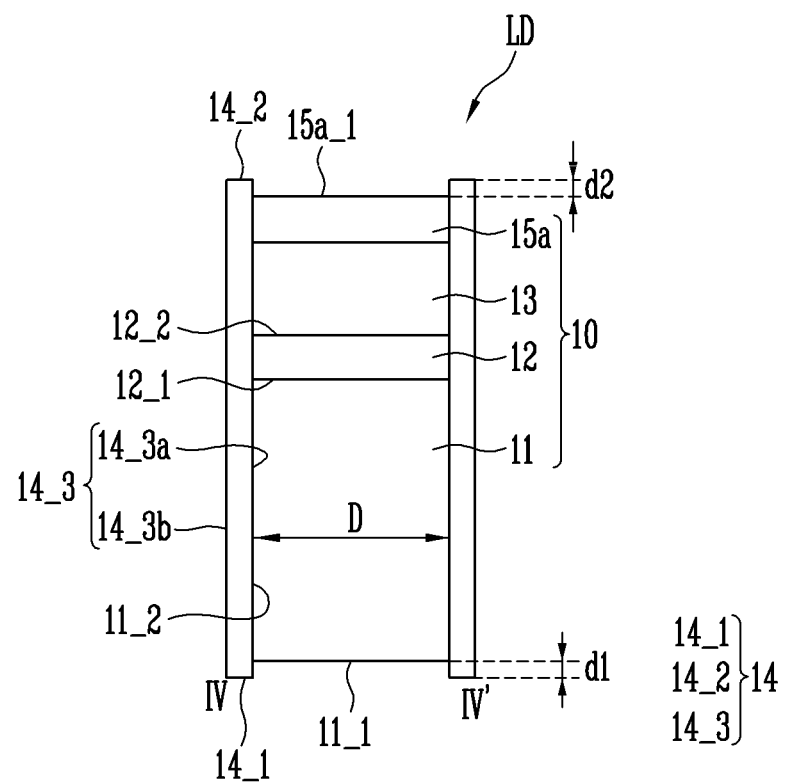
FIG. 9B is a sectional view taken along the line IV-IV' of FIG. 9A.
Figure 10A:
FIGS. 10A-10L are sectional views sequentially illustrating a method of manufacturing the light emitting element of FIGS. 9A and 9B.
Figure 10B:
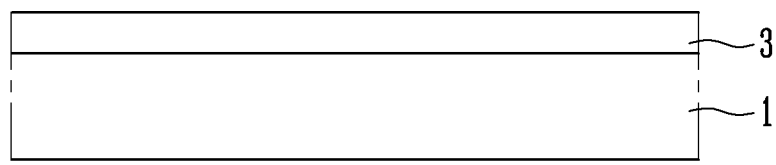
Figure 10C:
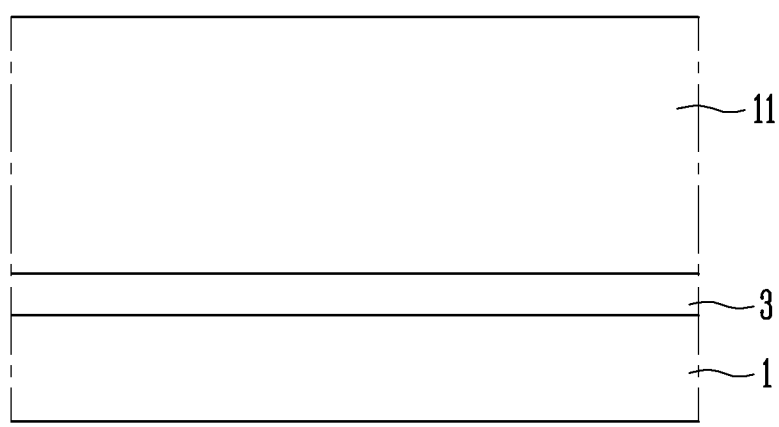
Figure 10D:
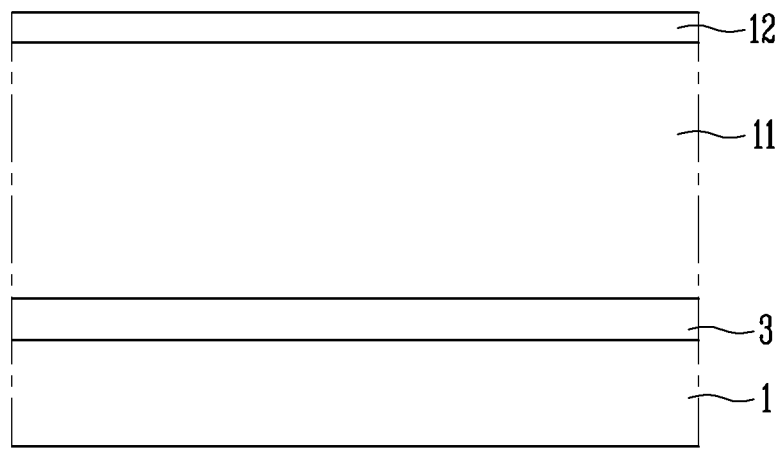
Figure 10E:
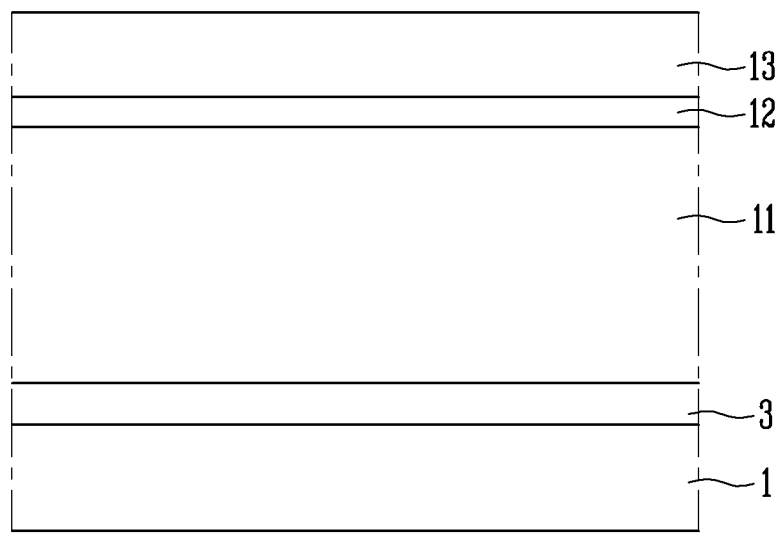
Figure 10F:
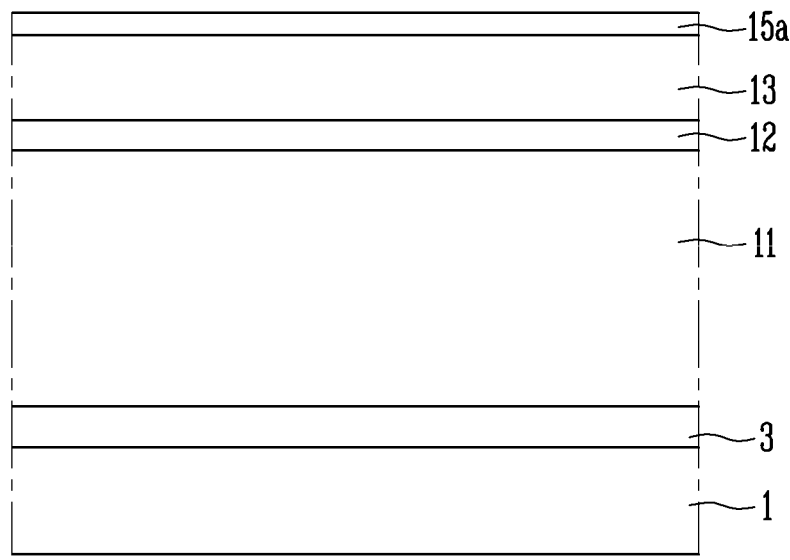
Figure 10G:
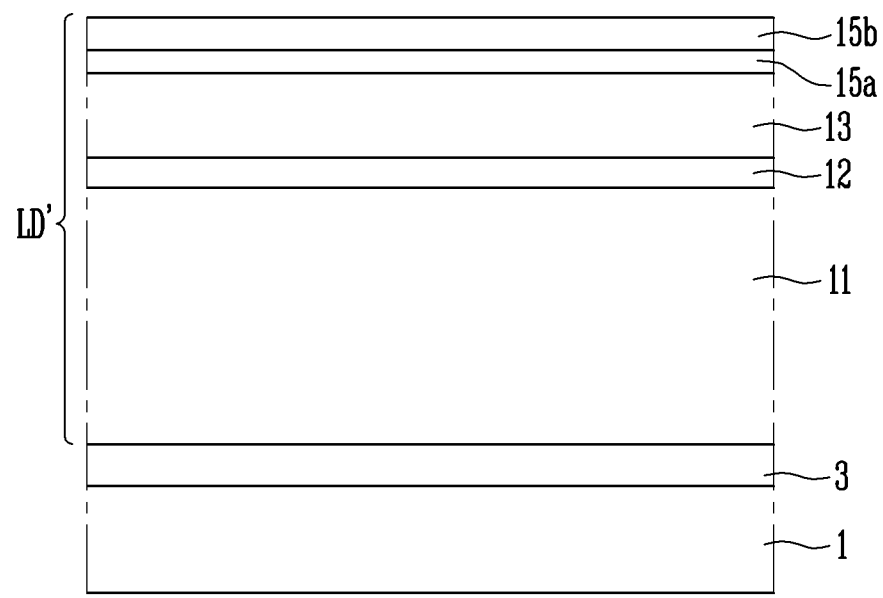
Figure 10H:
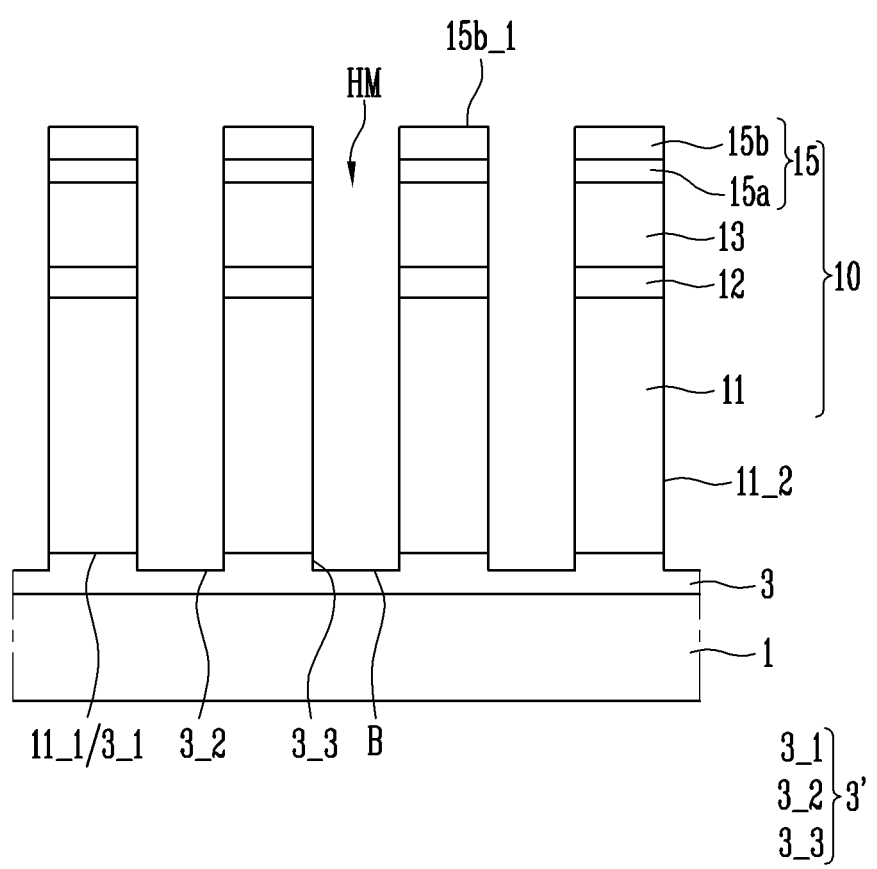
Figure 10I:
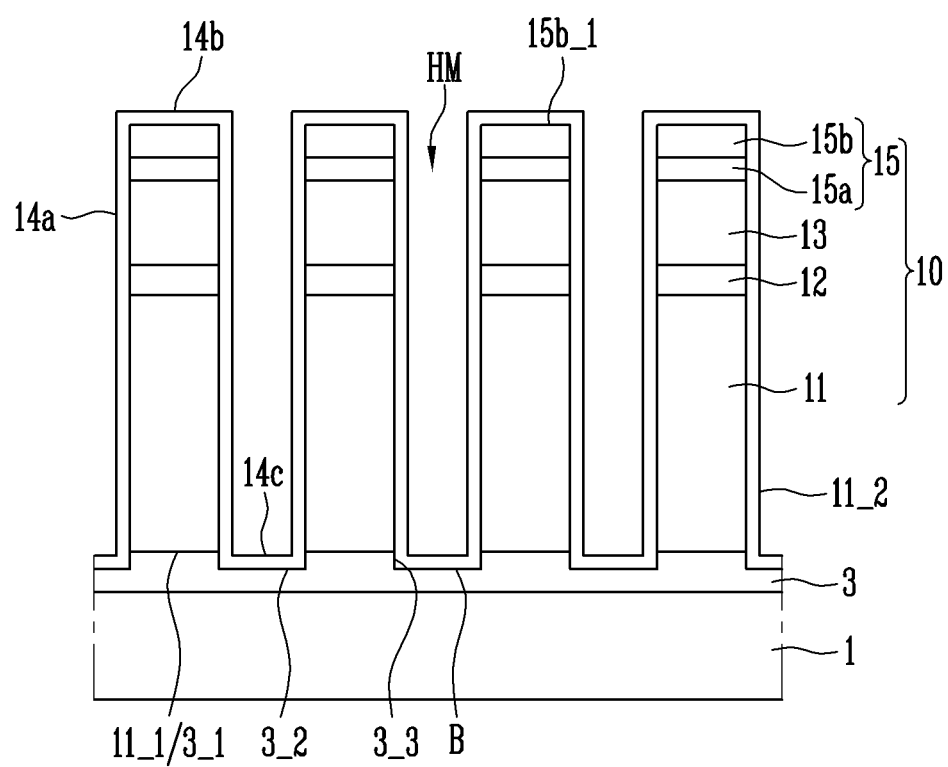
Figure 10J:
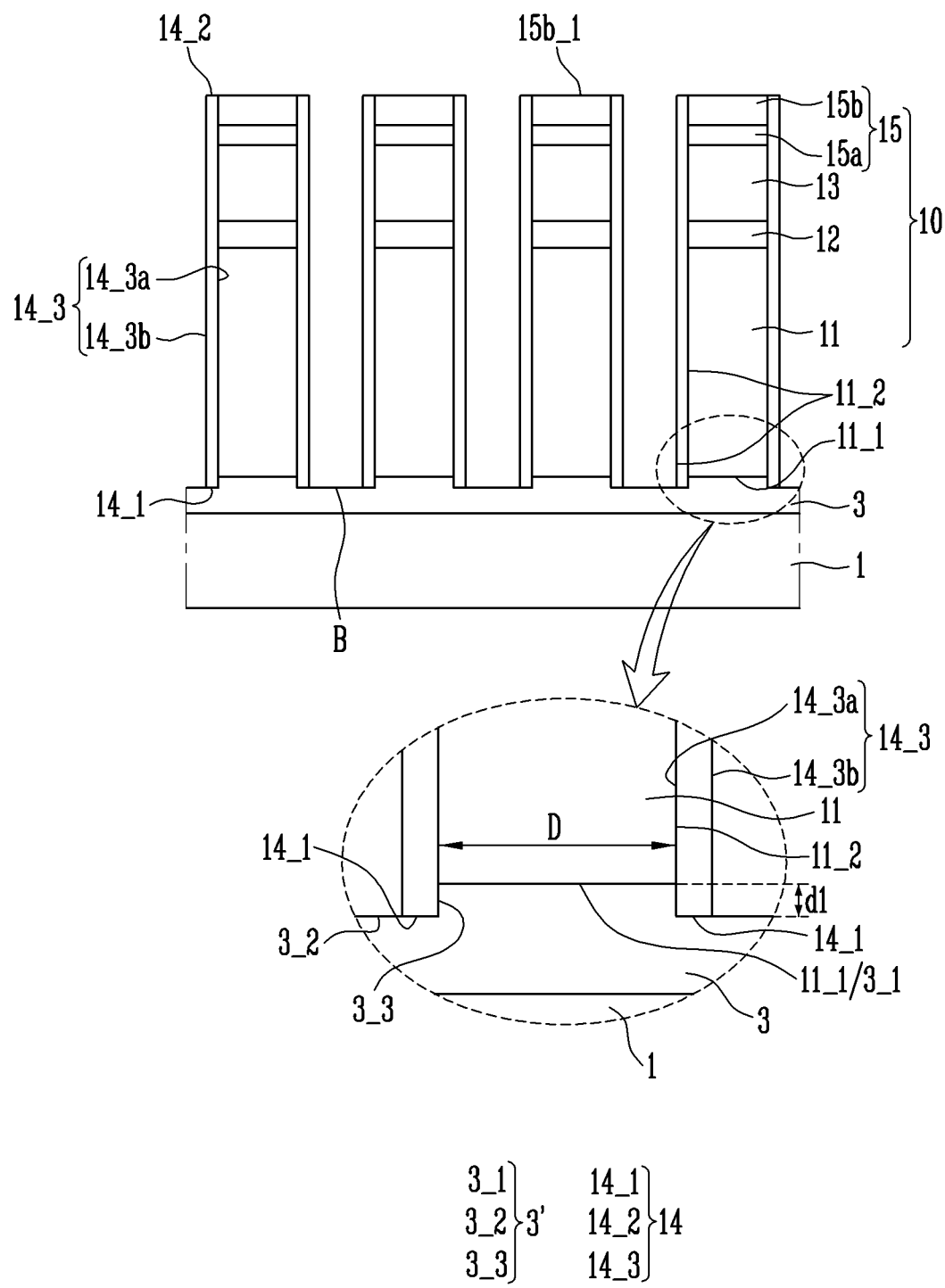
Figure 10K:
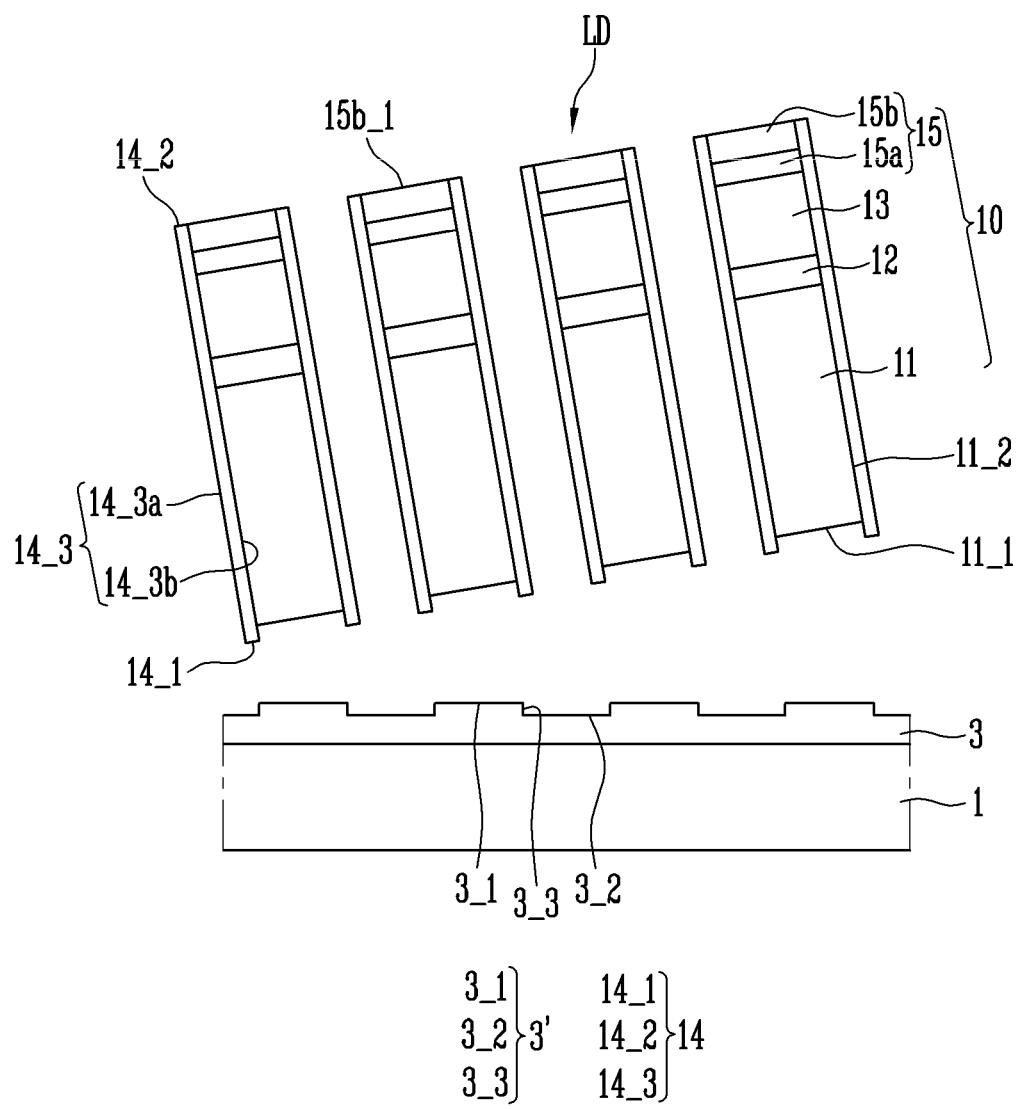
Figure 10L:
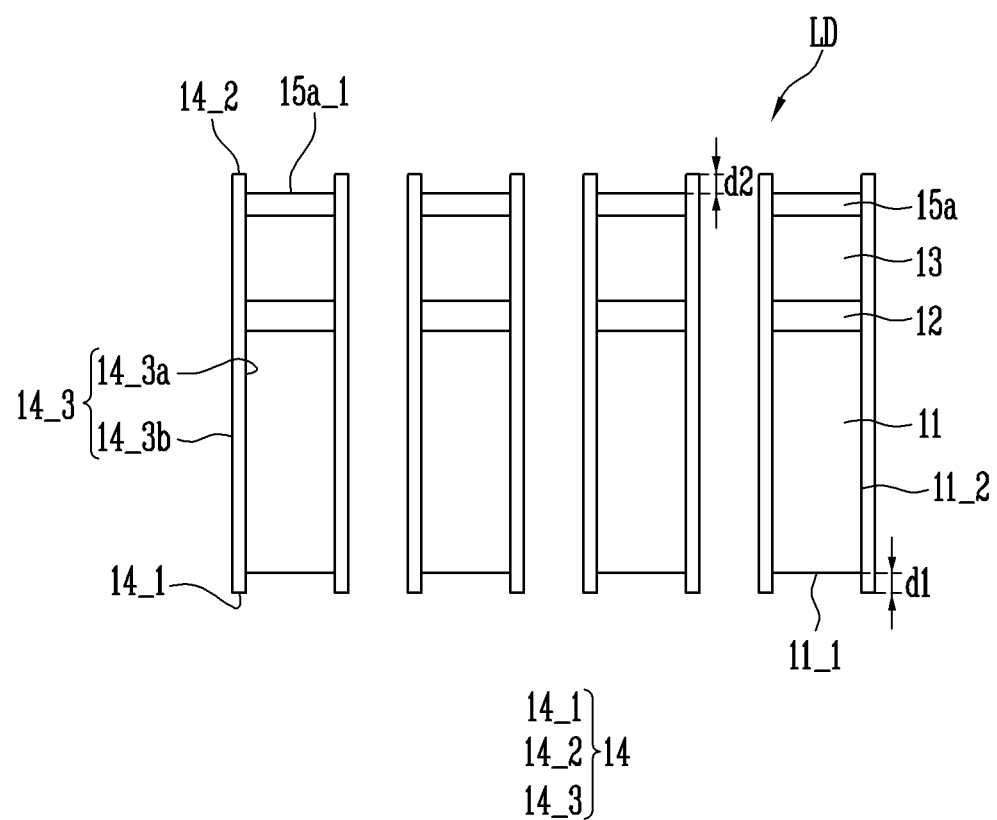

FIG. 9A is a perspective view illustrating a light emitting element in accordance with an embodiment of the present disclosure, and FIG. 9B is a sectional view taken along the line IV-IV' of FIG. 9A.

The light emitting element shown in FIGS. 9A and 9B may have substantially the same or similar configuration as the light emitting element of FIGS. 7A and 7B except that the lower surface of the insulating film protrudes downwards from the lower surface of the first conductive semiconductor layer 11.

Therefore, to avoid redundant explanation, the description of the light emitting element of FIGS. 9A and 9B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 9A and 9B, the light emitting element LD in accordance with an embodiment of the present disclosure may include an emissive stack pattern 10 formed by sequentially stacking a first conductive semiconductor layer 11, an active layer 12, a second conductive semiconductor layer 13, and a first electrode layer 15a in the longitudinal direction L. Furthermore, the light emitting element LD may further include an insulating film 14 provided on a surface of the emissive stack pattern 10.

The insulating film 14 may include the lower surface 14_1, the upper surface 14_2, and the side surface 14_3, and the side surface 14_3 of the insulating film 14 may include an inner side surface 14_3a and an outer side surface 14_3b.

In an embodiment of the present disclosure, the insulating film 14 may cover each of the outer periphery (or the outer circumference) 11_2 of the first conductive semiconductor layer 11, the outer periphery (or the outer circumference) of the active layer 12, the outer periphery (or the outer circumference) of the second conductive semiconductor layer 13, and the outer periphery (or the outer circumference) of the first electrode layer 15a. As the insulating film 14 covers the outer periphery (or the outer circumference) 11_2 of the first conductive semiconductor layer 11, the outer periphery (or the outer circumference) 11_2 of the first conductive semiconductor layer 11 may coincide with the inner side surface 14_3a of the insulating film 14 to come into contact with the inner side surface 14_3a. Thus, the perimeter of the outer periphery (or the outer circumference) 11_2 of the first conductive semiconductor layer 11 may be the same as the perimeter of the inner side surface 14_3a of the insulating film 14. In an embodiment of the present disclosure, the perimeter of the outer periphery (or the outer circumference) 11_2 of the first conductive semiconductor layer 11 may be the same as the perimeter of the lower surface 11_1 of the first conductive semiconductor layer 11. Therefore, the diameter of the lower surface 11_1 of the first conductive semiconductor layer 11 may be the same as the diameter D of the emissive stack pattern 10.

Furthermore, the insulating film 14 may not cover the upper surface 15a_1 of the first electrode layer 15a and the lower surface 11_1 of the first conductive semiconductor layer 11. Thus, at least a portion of the lower surface 11_1 of the first conductive semiconductor layer 11 and at least a portion of the upper surface 15a_1 of the first electrode layer 15a may be exposed. Here, the lower surface 11_1 of the first conductive semiconductor layer 11 and the upper surface 15a_1 of the first electrode layer 15a may be surfaces which are in contact with an external conductive material to be electrically connected thereto.

The upper surface 14_2 of the insulating film 14 may protrude upwards from the upper surface 15a_1 of the first electrode layer 15a in the longitudinal direction L of the light emitting element LD. Thus, the upper surface 14_2 of the insulating film 14 and the upper surface 15a_1 of the first electrode layer 15a may be disposed on different surfaces. Furthermore, the upper surface 15a_1 of the first electrode layer 15a may be positioned closer to the active layer 12 than the upper surface 14_2 of the insulating film 14. The upper surface 14_2 of the insulating film 14 and the upper surface 15a_1 of the first electrode layer 15a may be parallel to each other in a direction (e.g. horizontal direction) crossing the longitudinal direction L of the light emitting element LD while being spaced from each other by a distance d2 (e.g., a set distance or a predetermined distance d2).

The lower surface 14_1 of the insulating film 14 may protrude downwards from the lower surface 11_1 of the first conductive semiconductor layer 11 in the longitudinal direction L of the light emitting element LD. Thus, the lower surface 14_1 of the insulating film 14 and the lower surface 11_1 of the first conductive semiconductor layer 11 may be disposed on different surfaces. For example, the lower surface 11_1 of the first conductive semiconductor layer 11 may be positioned closer to the active layer 12 than the lower surface 14_1 of the insulating film 14. The lower surface 14_1 of the insulating film 14 and the lower surface 11_1 of the first conductive semiconductor layer 11 may be parallel to each other in the horizontal direction crossing the longitudinal direction L of the light emitting element LD while being spaced from each other by a distance d1 (e.g., a set distance or a predetermined distance d1).

In an embodiment of the present disclosure, the distance d2 between the upper surface 14_2 of the insulating film 14 and the upper surface 15a_1 of the first electrode layer 15a may be equal or similar to the distance d1 between the lower surface 14_1 of the insulating film 14 and the lower surface 11_1 of the first conductive semiconductor layer 11. However, the present disclosure is not limited thereto. In an embodiment, the distance d2 between the upper surface 14_2 of the insulating film 14 and the upper surface 15a_1 of the first electrode layer 15a may be larger than the distance d1 between the lower surface 14_1 of the insulating film 14 and the lower surface 11_1 of the first conductive semiconductor layer 11, and vice versa.

As described above, the light emitting element LD in accordance with an embodiment of the present disclosure may be shaped such that the upper surface 14_2 of the insulating film 14 protrudes upwards from the upper surface 15a_1 of the first electrode layer 15a in the longitudinal direction L, and the lower surface 14_1 of the insulating film 14 protrudes downwards from the lower surface 11_1 of the first conductive semiconductor layer 11. In other words, the length of the side surface 14_3 of the insulating film 14 with respect to the longitudinal direction L of the light emitting element LD may be longer than the length of the emissive stack pattern 10 including the first conductive semiconductor layer 11, the active layer 12, the second conductive semiconductor layer 13, and the first electrode layer 15*a*.

FIGS. 10A-10L are sectional views sequentially illustrating a method of manufacturing the light emitting element of FIGS. 9A and 9B.

The method of manufacturing the light emitting element illustrated in FIGS. 10A-10G may be substantially the same as the method of manufacturing the light emitting element illustrated in FIGS. 8A-8G. Therefore, to avoid redundant explanation, differences from the foregoing embodiments will be mainly described. Components which are not separately explained in the following description of the present embodiment comply with that of the foregoing embodiments. The same reference numeral will be used to designate the same component, and a similar reference numeral will be used to designate a similar component.

Referring to FIGS. 9A, 9B, and 10A-10G, the first conductive semiconductor layer 11, the active layer 12, the second conductive semiconductor layer 13, the first electrode layer 15*a*, and the second electrode layer 15*b* are sequentially formed on the substrate 1. In an embodiment of the present disclosure, the sacrificial layer 3 may be formed between the substrate 1 and the first conductive semiconductor layer 11.

The first conductive semiconductor layer 11, the active layer 12, the second conductive semiconductor layer 13, the first electrode layer 15*a*, and the second electrode layer 15*b* which are sequentially stacked on the substrate 1 form the emissive stack LD'. The second electrode layer 15*b* may contain material that has high resistance to etching.

Referring to FIGS. 9A, 9B, and 10A-10H, after the mask (not shown) having the plurality of openings is disposed on the emissive stack LD', the first etching process is performed to pattern the emissive stack LD' at the nano-scale or micro-scale interval, thus forming the plurality of emissive stack patterns 10.

In the first etching process, an area of the emissive stack LD' may be etched, thus forming the groove HM that causes an area B of the sacrificial layer 3 to be exposed to the outside. The groove HM may have a shape that is recessed from the upper surface 15*b*_1 of the second electrode layer 15*b* of each emissive stack pattern 10 to the area B of the sacrificial layer 3 in a vertical direction.

A portion of the sacrificial layer 3 may be concurrently (or simultaneously) removed, so that at least one or more uneven patterns 3' may be formed on a surface of the sacrificial layer 3. The uneven pattern 3' of the sacrificial layer 3 may include an uneven lower surface 3_2, an uneven upper surface 3_1, and an uneven side surface 3_3. The uneven upper surface 3_1 may be a surface coming into contact with the emissive stack pattern 10, and for example, may come into contact with the lower surface 11_1 of the first conductive semiconductor layer 11. The uneven lower surface 3_2 may be a surface overlapping the groove HM in the vertical direction, and the uneven side surface 3_3 is a connecting surface that is perpendicular to the uneven upper surface 3_1 and the uneven lower surface 3_2 and may extend to the outer periphery (or the outer circumference) 11_2 of the first conductive semiconductor layer 11.

Referring to FIGS. 9A, 9B, and 10A-10I, the insulating material layer 14' is formed on the emissive stack patterns 10 and the area B of the sacrificial layer 3. The insulating material layer 14' may include an upper insulating material layer 14*b*, a side insulating material layer 14*a*, and a lower insulating material layer 14*c*. The upper insulating material layer 14*b* may completely cover the upper surface 15*b*_1 of the second electrode layer 15*b*, the side insulating material layer 14*a* may cover each side surface of the emissive stack pattern 10, the uneven side surface 3_3 of the sacrificial layer 3, and a portion of the uneven lower surface 3_2 of the sacrificial layer 3, and the lower insulating material layer 14*c* may completely cover the area B of the exposed sacrificial layer 3, i.e., a remaining portion of the uneven lower surface 3_2 of the sacrificial layer 3.

Referring to FIGS. 9A, 9B, and 10A-10J, the second etching process is performed to form the insulating film 14.

Through the second etching process, the insulating film 14 including only the side insulating material layer 14*a* that covers the side surface of each emissive stack pattern 10 may be finally formed. In other words, through the second etching process, the upper insulating material layer 14*b* and the lower insulating material layer 14*c* may be removed, so that the upper surface 15*b*_1 of the second electrode layer 15*b* and the area B of the sacrificial layer 3, i.e. the uneven lower surface 3_2 may be exposed to the outside.

In an embodiment of the present disclosure, the uneven side surface 3_3 of the sacrificial layer 3 and a portion of the uneven lower surface 3_2 of the sacrificial layer 3 may be covered by the insulating film 14. Thus, the lower surface 14_1 of the insulating film 14 may be disposed on the same surface as the uneven lower surface 3_2 of the sacrificial layer 3, and may be positioned closer to the substrate 1 than the uneven upper surface 3_1 of the sacrificial layer 3.

Furthermore, the lower surface 14_1 of the insulating film 14 may be positioned closer to the substrate 1 than the lower surface 11_1 of the first conductive semiconductor layer 11 positioned on the same surface as the uneven upper surface 3_1 of the sacrificial layer 3. In other words, the lower surface 14_1 of the insulating film 14 may protrude closer to the substrate 1 than the lower surface 11_1 of the first conductive semiconductor layer 11. Here, the lower surface 14_1 of the insulating film 14 and the lower surface 11_1 of the first conductive semiconductor layer 11 may be parallel to each other while being spaced from each other by a distance d1 (e.g., a set distance or a predetermined distance d1).

The light emitting elements LD enclosed by the insulating film 14 may be formed on the substrate 1 by performing the second etching process.

Referring to FIGS. 9A, 9B, and 10A-10K, the light emitting elements LD are separated from the substrate 1 using the chemical lift-off (CLO) method. The chemical lift-off may be performed by removing the sacrificial layer 3. As the sacrificial layer 3 is removed by the chemical lift-off method, the lower surface 14_1 of the insulating film 14 may protrude downwards from the lower surface 11_1 of the first conductive semiconductor layer 11 in the longitudinal direction L of each light emitting element LD.

Through the above-described manufacturing process, each of the manufactured light emitting elements LD may be shaped such that the lower surface 11_1 of the first conductive semiconductor layer 11 and the upper surface 15*b*_1 of the second electrode layer 15*b* are exposed to the outside.

Referring to FIGS. 9A, 9B, and 10A-10L, a third etching process is performed to remove the second electrode layer 15*b* and thereby expose the upper surface 15*a*_1 of the first electrode layer 15*a*.

As the second electrode layer 15*b* is removed and thereby the upper surface 15*a*_1 of the first electrode layer 15*a* is exposed to the outside due to the third etching process, the upper surface 15*a*_1 of the first electrode layer 15*a* may be positioned closer to the substrate 1 than the upper surface 14_2 of the insulating film 14. In other words, the upper surface 14_2 of the insulating film 14 may protrude upwards from the upper surface 15a_1 of the first electrode layer 15a in the longitudinal direction L of each light emitting element LD.

The third etching process may be performed after the process of separating the light emitting elements LD from the substrate 1 through the chemical lift-off method, but the present disclosure is not limited thereto. In an embodiment, the third etching process may be performed before the process of separating the light emitting elements LD from the substrate 1 through the chemical lift-off method.

Figure 11A:
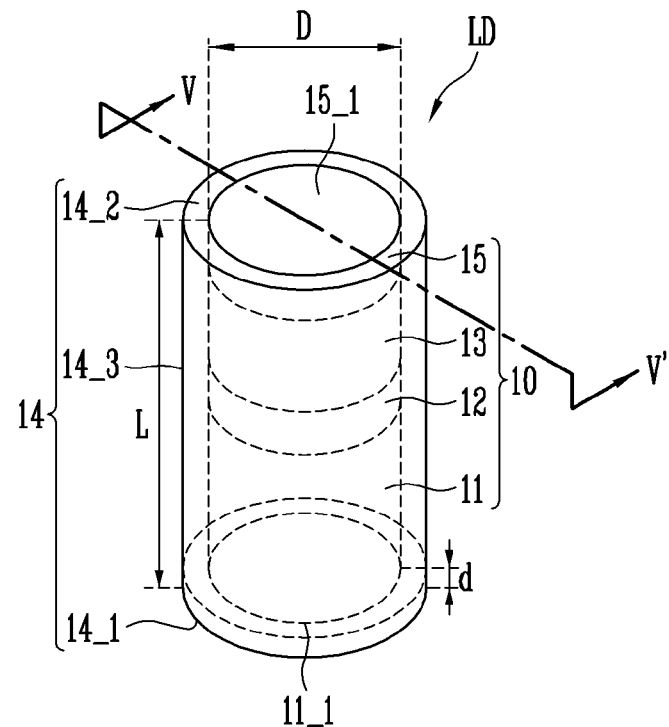
FIG. 11A is a perspective view illustrating a light emitting element in accordance with an embodiment of the present disclosure.
Figure 11B:
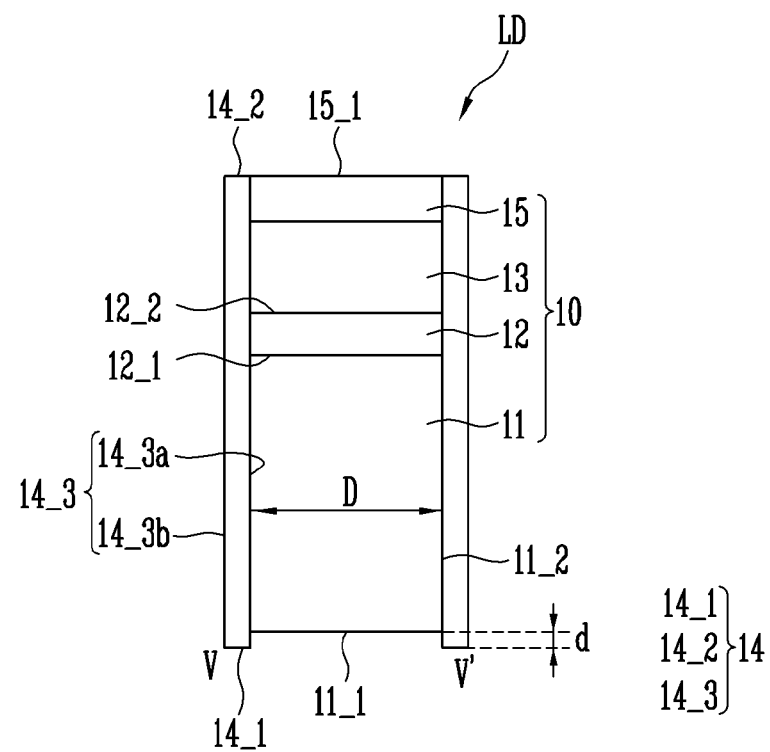
FIG. 11B is a sectional view taken along the line V-V' of FIG. 11A.

FIG. 11A is a perspective view illustrating a light emitting element in accordance with an embodiment of the present disclosure, and FIG. 11B is a sectional view taken along the line V-V' of FIG. 11A.

The light emitting element illustrated in FIGS. 11A and 11B may have substantially the same or similar configuration as the light emitting element of FIGS. 9A and 9B except that the upper surface 14_2 of the insulating film 14 and the upper surface 15_1 of the electrode layer 15 are disposed on the same surface.

Therefore, to avoid redundant explanation, the description of the light emitting element of FIGS. 11A and 11B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 11A and 11B, the light emitting element LD in accordance with an embodiment of the present disclosure may include an emissive stack pattern 10 formed by sequentially stacking a first conductive semiconductor layer 11, an active layer 12, a second conductive semiconductor layer 13, and an electrode layer 15 in the longitudinal direction L. Furthermore, the light emitting element LD may further include an insulating film 14 provided on a surface of the emissive stack pattern 10.

In an embodiment of the present disclosure, the insulating film 14 may cover each of the outer periphery (or the outer circumference) 11_2 of the first conductive semiconductor layer 11, the outer periphery (or the outer circumference) of the active layer 12, the outer periphery (or the outer circumference) of the second conductive semiconductor layer 13, and the outer periphery (or the outer circumference) of the first electrode layer 15. As the insulating film 14 covers the outer periphery (or the outer circumference) 11_2 of the first conductive semiconductor layer 11, the outer periphery (or the outer circumference) 11_2 of the first conductive semiconductor layer 11 may coincide with the inner side surface 14_3a of the insulating film 14. Thus, the perimeter of the outer periphery (or the outer circumference) 11_2 of the first conductive semiconductor layer 11 may be the same as the perimeter of the inner side surface 14_3a of the insulating film 14. In some embodiments of the present disclosure, the perimeter of the outer periphery (or the outer circumference) 11_2 of the first conductive semiconductor layer 11 may be the same as the perimeter of the lower surface 11_1 of the first conductive semiconductor layer 11. Therefore, the diameter of the lower surface 11_1 of the first conductive semiconductor layer 11 may be the same as the diameter D of the emissive stack pattern 10.

Furthermore, the insulating film 14 may not cover the upper surface 15_1 of the electrode layer 15 and the lower surface 11_1 of the first conductive semiconductor layer 11. Thus, at least a portion of the lower surface 11_1 of the first conductive semiconductor layer 11 and at least a portion of the upper surface 15_1 of the electrode layer 15 may be exposed.

In an embodiment of the present disclosure, the upper surface 14_2 of the insulating film 14 may be positioned on the same surface as the upper surface 15_1 of the electrode layer 15 in the longitudinal direction L of the light emitting element LD. The lower surface 14_1 of the insulating film 14 may protrude downwards from the lower surface 11_1 of the first conductive semiconductor layer 11 in the longitudinal direction L of the light emitting element LD. Thus, the lower surface 14_1 of the insulating film 14 and the lower surface 11_1 of the first conductive semiconductor layer 11 may be disposed on different surfaces. For example, the lower surface 11_1 of the first conductive semiconductor layer 11 may be positioned closer to the active layer 12 than the lower surface 14_1 of the insulating film 14.

As described above, the light emitting element LD in accordance with an embodiment of the present disclosure may be shaped such that the lower surface 14_1 of the insulating film 14 protrudes downwards from the lower surface 11_1 of the first conductive semiconductor layer 11 in the longitudinal direction L of the light emitting element LD. Thus, the length of the side surface 14_3 of the insulating film 14 with respect to the longitudinal direction L of the light emitting element LD may be longer than the length of the emissive stack pattern 10 including the first conductive semiconductor layer 11, the active layer 12, the second conductive semiconductor layer 13, and the electrode layer 15.

Figure 12A:
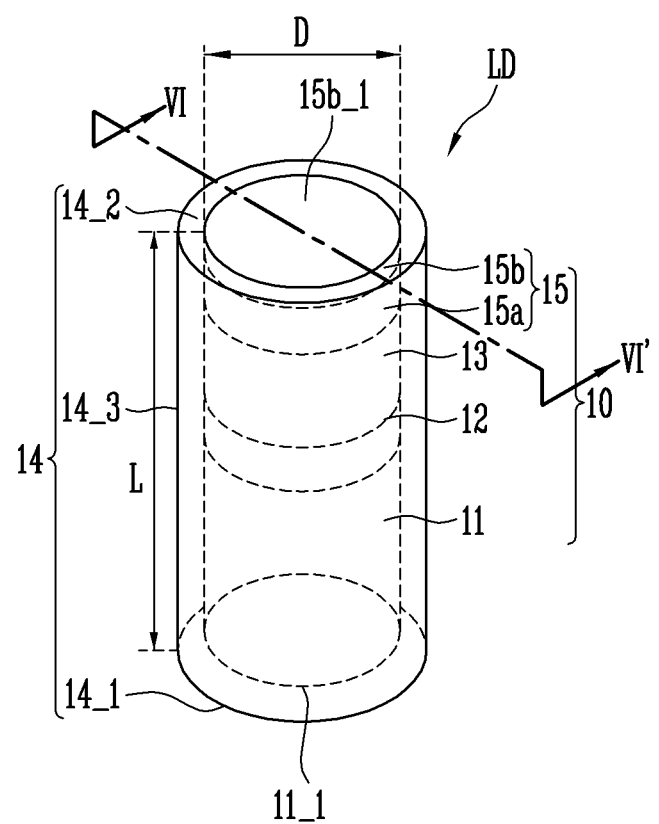
FIG. 12A is a perspective view illustrating a light emitting element in accordance with an embodiment of the present disclosure.
Figure 12B:
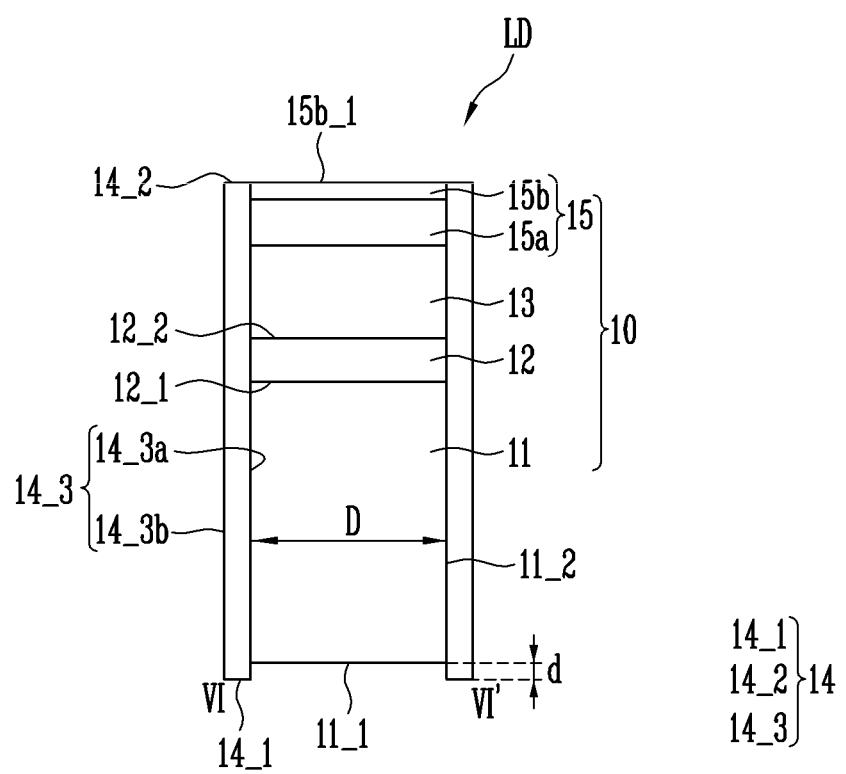
FIG. 12B is a sectional view taken along the line VI-VI' of FIG. 12A.

FIG. 12A is a perspective view illustrating a light emitting element in accordance with an embodiment of the present disclosure, and FIG. 12B is a sectional view taken along the line VI-VI' of FIG. 12A.

The light emitting element shown in FIGS. 12A and 12B may have substantially the same or similar configuration as the light emitting element of FIGS. 11A and 11B except that an additional electrode layer is disposed above the electrode layer on the second conductive semiconductor layer.

Therefore, to avoid redundant explanation, the description of the light emitting element of FIGS. 12A and 12B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 12A and 12B, the light emitting element LD in accordance with an embodiment of the present disclosure may include an emissive stack pattern 10 formed by sequentially stacking a first conductive semiconductor layer 11, an active layer 12, a second conductive semiconductor layer 13, and an electrode layer 15 in the longitudinal direction L. Furthermore, the light emitting element LD may further include an insulating film 14 provided on a surface of the emissive stack pattern 10.

The electrode layer 15 may include a first electrode layer 15a disposed on the second conductive semiconductor layer 13 and a second electrode layer 15b disposed on the first electrode layer 15a. In this case, the first conductive semiconductor layer 11 may be disposed on a first end (e.g. the bottom of the cylinder) of the light emitting element LD, and the second electrode layer 15b may be disposed on a second end (e.g. the top of the cylinder) of the light emitting element LD.

The first electrode layer 15a may include metal or a metal oxide. For example, Cr, Ti, Al, Au, Ni, ITO, IZO, ITZO, and an oxide or alloy thereof may be used alone or in combination with each other.

The second electrode layer 15b may cover the first electrode layer 15a to protect the first electrode layer 15a from the outside, thereby preventing damage to the first electrode layer 15a. In an embodiment, when the active layer 12 of the light emitting element LD emits blue-based and/or green-based light in the wavelength range of 400 nm to 580 nm, the second electrode layer 15b may be made of metal including Cr, Al, Ti, and Ni, and may have the thickness of 10 nm to 100 nm. In an embodiment, when the active layer 12 of the light emitting element LD emits red-based and/or infrared-based light in the wavelength range of 580 nm to 900 nm, the second electrode layer 15b may be made of a transparent metal oxide such as indium tin oxide (ITO).

In an embodiment of the present disclosure, the insulating film 14 may cover each of the outer periphery (or the outer circumference) 11_2 of the first conductive semiconductor layer 11, the outer periphery (or the outer circumference) of the active layer 12, the outer periphery (or the outer circumference) of the second conductive semiconductor layer 13, the outer periphery (or the outer circumference) of the first electrode layer 15a, and the outer periphery (or the outer circumference) of the second electrode layer 15b. As the insulating film 14 covers the outer periphery (or the outer circumference) 11_2 of the first conductive semiconductor layer 11, the outer periphery (or the outer circumference) 11_2 of the first conductive semiconductor layer 11 may coincide with the inner side surface 14_3a of the insulating film 14.

Furthermore, the insulating film 14 may not cover the upper surface 15b_1 of the second electrode layer 15b and the lower surface 11_1 of the first conductive semiconductor layer 11. Thus, at least a portion of the lower surface 11_1 of the first conductive semiconductor layer 11 and at least a portion of the upper surface 15_1 of the second electrode layer 15b may be exposed.

In an embodiment of the present disclosure, the upper surface 14_2 of the insulating film 14 may be positioned on the same surface as the upper surface 15b_1 of the second electrode layer 15b in the longitudinal direction L of the light emitting element LD. The lower surface 14_1 of the insulating film 14 may protrude downwards from the lower surface 11_1 of the first conductive semiconductor layer 11 in the longitudinal direction L of the light emitting element LD. Thus, the lower surface 14_1 of the insulating film 14 and the lower surface 11_1 of the first conductive semiconductor layer 11 may be disposed on different surfaces. For example, the lower surface 11_1 of the first conductive semiconductor layer 11 may be positioned closer to the active layer 12 than the lower surface 14_1 of the insulating film 14.

In an embodiment of the present disclosure, the length of the side surface 14_3 of the insulating film 14 with respect to the longitudinal direction L of the light emitting element LD may be longer than the length of the emissive stack pattern 10 including the first conductive semiconductor layer 11, the active layer 12, the second conductive semiconductor layer 13, and the electrode layer 15.

Figure 13:
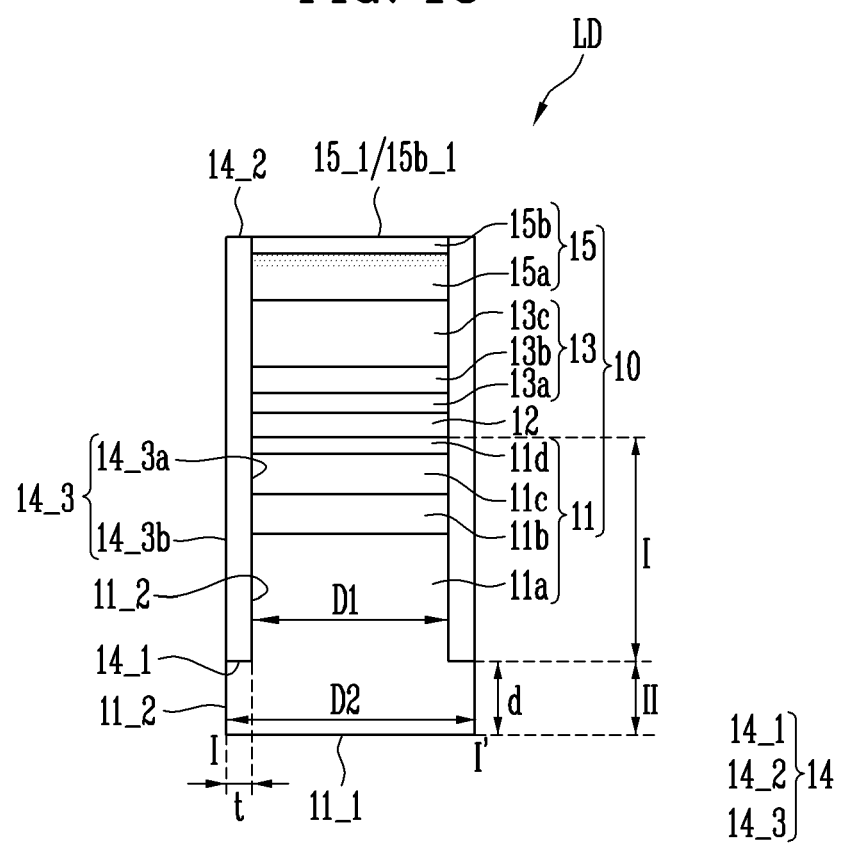
FIG. 13 is a sectional view corresponding to the line I-I' of FIG. 1A to illustrate a light emitting element in accordance with an embodiment of the present disclosure.

FIG. 13 is a sectional view corresponding to the line I-I' of FIG. 1A to illustrate a light emitting element in accordance with an embodiment of the present disclosure.

In order to avoid redundant explanation, the description of the light emitting element of FIG. 13 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A and 13, the light emitting element LD in accordance with an embodiment of the present disclosure may include an emissive stack pattern 10 formed by sequentially stacking a first conductive semiconductor layer 11, an active layer 12, a second conductive semiconductor layer 13, and an electrode layer 15 in the longitudinal direction L. Furthermore, the light emitting element LD may further include an insulating film 14 provided on a surface of the emissive stack pattern 10. In an embodiment of the present disclosure, when the emissive stack pattern 10 has a cylindrical shape, the light emitting element LD may also have a cylindrical shape corresponding to that of the emissive stack pattern 10.

In an embodiment of the present disclosure, the first conductive semiconductor layer 11 may be disposed on a first end (e.g. the bottom of the cylinder) of the light emitting element LD, and the electrode layer 15 may be disposed on a second end (e.g. the top of the cylinder) of the light emitting element LD. In other words, the light emitting element LD may include a lower surface 11_1 of the first conductive semiconductor layer 11 and an upper surface 15_1 of the electrode layer 15, which are positioned on the opposite ends of the light emitting element LD and are exposed to an outside. The lower surface 11_1 of the first conductive semiconductor layer 11 and the upper surface 15_1 of the electrode layer 15 may be surfaces which are in contact with an external conductive material to be electrically connected thereto.

The first conductive semiconductor layer 11 may be at least one n-type semiconductor layer doped with n-type impurities. The first conductive semiconductor layer 11 may supply electrons to the active layer 12. The first conductive semiconductor layer 11 may include a GaN layer doped with the n-type impurities, e.g. Si. However, without being limited thereto, the first conductive semiconductor layer 11 may include various semiconductor materials. The first conductive semiconductor layer 11 may be formed of any one of a GaIn layer, an AlGaN layer, an InAlGaN layer, an AlGaAs layer, a GaP layer, a GaAs layer, a GaAsP layer, and an AlGaInP layer.

In an embodiment of the present disclosure, the first conductive semiconductor layer 11 may be formed in a multilayer structure including the GaAs layer 11a, the GaIn layer 11b formed on the GaAs layer 11a, the AlGaInP layer 11c formed on the GaIn layer 11b, and the AlInP layer 11d formed on the AlGaInP layer 11c. However, the present disclosure is not necessarily limited to this. In an embodiment, the first conductive semiconductor layer 11 may be formed in a single layer structure including only one of the GaAs layer 11a, the GaIn layer 11b, the AlGaInP layer 11c, and the AlInP layer 11d. In an embodiment of the present disclosure, each of the GaAs layer 11a, the GaIn layer 11b, the AlGaInP layer 11c, and the AlInP layer 11d may be the n-type semiconductor layer.

In an embodiment of the present disclosure, each of the AlGaInP layer 11c and the AlInP layer 11d may be disposed under the active layer 12, may be a semiconductor layer larger than a band gap of the active layer 12, and may function as a cladding layer confining electrons or holes.

The active layer 12 may be disposed on the upper surface of the AlInP layer 11d of the first conductive semiconductor layer 11, and may include any one of a double hetero structure, a multi well structure, a single quantum well structure, a multi quantum well (MQW) structure, a quantum dot structure, and a quantum wire structure.

The active layer 12 may be formed in a well layer and a barrier layer, for example, a pair structure of at least one of AlGaN/AlGaN, InGaN/GaN, InGaN/InGaN, AlGaN/GaN, InAlGaN/GaN, As(InGaAs)/AlGaAs, and GaP(InGaP)/AlGaP, using a compound semiconductor material of Group III-V elements, but is not limited thereto. The well layer may be formed of a material having an energy band gap smaller than that of the barrier layer.

The second conductive semiconductor layer 13 may be provided on the active layer 12, and may supply holes to the active layer 12. The second conductive semiconductor layer 13 may include a semiconductor layer of a type different from that of the first conductive semiconductor layer 11. For example, the second conductive semiconductor layer 13 may include at least one p-type semiconductor layer. For example, the second conductive semiconductor layer 13 may include at least one semiconductor material from among InAlGaN, GaN, AlGaN, InGaN, AlN, and InN.

In an embodiment of the present disclosure, the second conductive semiconductor layer 13 may be formed in a multilayer structure including an AlInP layer 13a, a GaInP layer 13b formed on the AlInP layer 13a, and a GaP layer 13c formed on the GaInP layer 13b. However, the present disclosure is not necessarily limited to this. In an embodiment, the second conductive semiconductor layer 13 may be formed in a single layer structure including only one of the AlInP layer 13a, the GaInP layer 13b, and the GaP layer 13c. In an embodiment of the present disclosure, each of the AlInP layer 13a, the GaInP layer 13b, and the GaP layer 13c may be the p-type semiconductor layer.

In an embodiment of the present disclosure, each of the AlInP layer 13a and the GaInP layer 13b may be disposed above the active layer 12, may be a semiconductor layer larger than a band gap of the active layer 12, and may function as a cladding layer confining electrons or holes.

The GaP layer 13c disposed to be the uppermost layer of the second semiconductor layer 13 may be a transparent conductive layer doped with a second conductive dopant such as Mg. In the following embodiment, for convenience, the GaP layer 13c is referred to as the transparent conductive layer.

The transparent conductive layer 13c may include a low-concentration layer doped with Mg and having the thickness of several micrometers, and a high-concentration layer doped with carbon and having the thickness of several hundreds of nanometers, which are sequentially stacked. Such a transparent conductive layer 13c may act as a current spreading layer. The transparent conductive layer 13c may cause lattice mismatch with the p-type GaInP layer 13b positioned thereunder. Therefore, the transparent conductive layer 13c maintains a sufficient thickness to attenuate effects due to the lattice mismatch. The upper surface of the transparent conductive layer 13c may have sufficient surface roughness. The surface roughness may increase light extraction efficiency.

The electrode layer 15 may be provided on the second conductive semiconductor layer 13, and may include a first electrode layer 15a and a second electrode layer 15b.

The first electrode layer 15a may be disposed on the second conductive semiconductor layer 13 to perform ohmic contact with the second conductive semiconductor layer 13.

The second electrode layer 15b may be disposed on the first electrode layer 15a, and may act as an electrode that provides the current spreading effect along with the first electrode layer 15a, and provides low resistance and high transmissivity.

The first electrode layer 15a may include metal or a metal oxide. For example, Cr, Ti, Al, Au, Ni, ITO, IZO, ITZO, and an oxide or alloy thereof may be used alone or in combination with each other. In an embodiment of the present disclosure, the first electrode layer 15a may be a p type GaP layer in which Be is diffused, and its thickness may be 20 nm or less. The present disclosure is not limited thereto. The first electrode layer 15a may be formed through a heat treatment process with a layer including at least one of Au, AuBe, Ni, NiZn, NiBe, Pd, PdZn, and PdBe. The heat treatment may reduce contact resistance of the first electrode layer 15a, and increase transmittance thereof.

The second electrode layer 15b may cover the first electrode layer 15a to protect the first electrode layer 15a from the outside, thereby preventing damage to the first electrode layer 15a. The second electrode layer 15b may be formed of transparent metal oxide including at least one of ITO (Indium tin oxide), ZnO, AZO (Al—ZnO), GZO (Gallium-doped Zinc Oxide), and IGZO (In—Ga ZnO) to improve the current spreading effect from external conductive material (not shown) to the second conductive semiconductor layer 13. The thickness of the second electrode 15b may range from 10 nm to 100 nm, but the present disclosure is not limited thereto. In an embodiment of the present disclosure, the second electrode layer 15b may be made of a material having a lower refractive index than the refractive index of the transparent conductive layer 13c.

The insulating film 14 may include transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

The insulating film 14 includes a lower surface 14_1 that is parallel to the lower surface 11_1 of the first conductive semiconductor layer 11 in one direction crossing the longitudinal direction L of the light emitting element LD, an upper surface 14_2 that is opposite to the lower surface 14_1 in the longitudinal direction L, and a side surface 14_3 that covers a portion of a surface of the emissive stack pattern 10 in the longitudinal direction L. The lower surface 14_1 of the insulating film 14, the upper surface 14_2 of the insulating film 14, and the side surface 14_3 of the insulating film 14 may be continuously connected to each other.

In an embodiment of the present disclosure, the insulating film 14 may entirely enclose the outer periphery (or the outer circumference) of the electrode layer 15. In this case, the upper surface 14_2 of the insulating film 14 and the upper surface 15_1 of the electrode layer 15 may be provided on the same surface.

In an embodiment of the present disclosure, the insulating film 14 does not cover the lower surface 11_1 of the first conductive semiconductor layer 11 positioned on the first end (e.g. a bottom of the cylinder) of the light emitting element LD and a portion of the outer periphery (or the outer circumference) 11_2 of the first conductive semiconductor layer 11. The lower surface 11_1 of the first conductive semiconductor layer 11 and a portion of the outer periphery (or the outer circumference) 11_2 thereof which are not covered by the insulating film 14 may be exposed to an outside. A remaining portion of the outer periphery (or the outer circumference) 11_2 excluding the portion of the outer periphery (or the outer circumference) 11_2 of the first conductive semiconductor layer 11 may be covered by the insulating film 14. The portion of the outer periphery (or the outer circumference) 11_2 of the first conductive semiconductor layer 11 that is not covered by the insulating film 14 may coincide with the outer side surface 14_3*b* of the insulating film 14, and the remaining portion of the outer periphery (or the outer circumference) 11_2 of the first conductive semiconductor layer 11 that is covered by the insulating film 14 may coincide with the inner side surface 14_3*a* of the insulating film 14.

In an embodiment of the present disclosure, the length of the side surface 14_3 of the insulating film 14 with respect to the longitudinal direction L of the light emitting element LD may be shorter than the length of the emissive stack pattern 10 including the first conductive semiconductor layer 11, the active layer 12, the second conductive semiconductor layer 13, and the electrode layer 15. However, the present disclosure is not limited thereto. In an embodiment, the length of the side surface 14_3 of the insulating film 14 may be longer than the length of the emissive stack pattern 10 with respect to the longitudinal direction L of the light emitting element LD.

The lower surface 14_1 of the insulating film 14 and the lower surface 11_1 of the first conductive semiconductor layer 11 may be parallel to each other in the horizontal direction crossing the longitudinal direction L (e.g. vertical direction) while being spaced from each other by a distance d (e.g., a set distance or a predetermined distance d). In an embodiment of the present disclosure, the lower surface 11_1 of the first conductive semiconductor layer 11 may protrude downwards from the lower surface 14_1 of the insulating film 14. In this case, the lower surface 14_1 of the insulating film 14 may be disposed closer to the active layer 12 than the lower surface 11_1 of the first conductive semiconductor layer 11.

In an embodiment of the present disclosure, the first conductive semiconductor layer 11 may be divided into a first area I which is enclosed by the insulating film 14 and a second area II which is not enclosed by the insulating film 14.

In an embodiment of the present disclosure, a portion of the outer periphery (or the outer circumference) 11_2 of the first conductive semiconductor layer 11 coincides with the outer side surface 14_3*b* of the insulating film 14 in the second area II, and a remaining portion of the outer periphery (or the outer circumference) 11_2 of the first conductive semiconductor layer 11 coincides with the inner side surface 14_3*a* of the insulating film 14 in the first area I. Thus, the perimeter of the cylindrical first conductive semiconductor layer 11 may be different in the first area I and the second area II. In an embodiment of the present disclosure, the perimeter of the portion of the outer periphery (or the outer circumference) 11_2 of the first conductive semiconductor layer 11 may be the same as the perimeter C2 of the lower surface 11_1 of the first conductive semiconductor layer 11 in the second area II, and the perimeter of the remaining portion of the outer periphery (or the outer circumference) 11_2 of the first conductive semiconductor layer 11 may be the same as the perimeter C1 of the emissive stack pattern 10 covered by the insulating film 14 in the first area I. Thus, a diameter D2 of the first conductive semiconductor layer 11 in the second area II may be larger than a diameter D1 of the first conductive semiconductor layer 11 in the first area I.

As described above, when the insulating film 14 does not completely cover the outer periphery (or the outer circumference) 11_2 of the first conductive semiconductor layer 11 but exposes the lower surface 11_1 of the first conductive semiconductor layer 11 and a portion of the outer periphery (or the outer circumference) 11_2 thereof, the exposure area of the first conductive semiconductor layer 11 may be increased. If the exposure area of the first conductive semiconductor layer 11 increases, a contact area with the conductive material may be increased. Thus, the first conductive semiconductor layer 11 and the conductive material may be electrically and/or physically stably coupled to each other.

FIGS. 14A-14M are sectional views sequentially illustrating a method of manufacturing the light emitting element of FIG. 13.

Figure 2A:
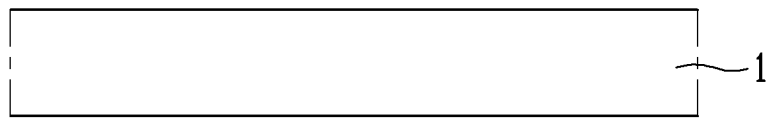
FIGS. 2A-2J are sectional views sequentially illustrating a method of manufacturing the light emitting element of FIGS. 1A to 1D.
Figure 2B:
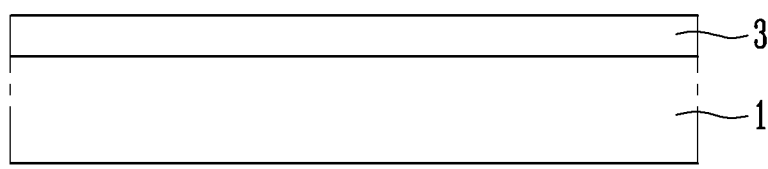
Figure 2C:
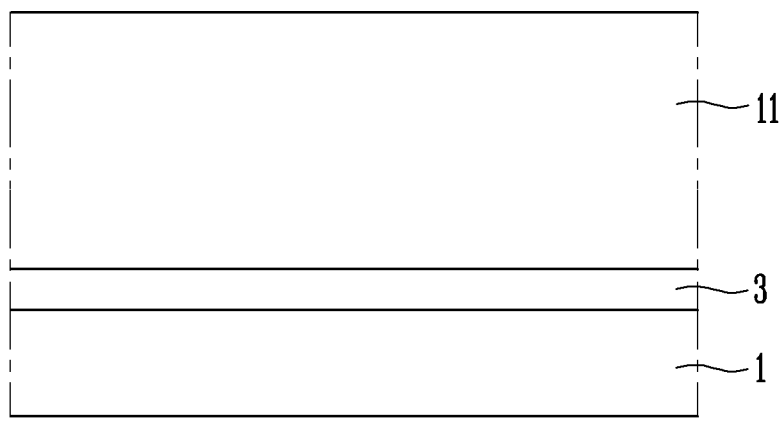
Figure 2D:
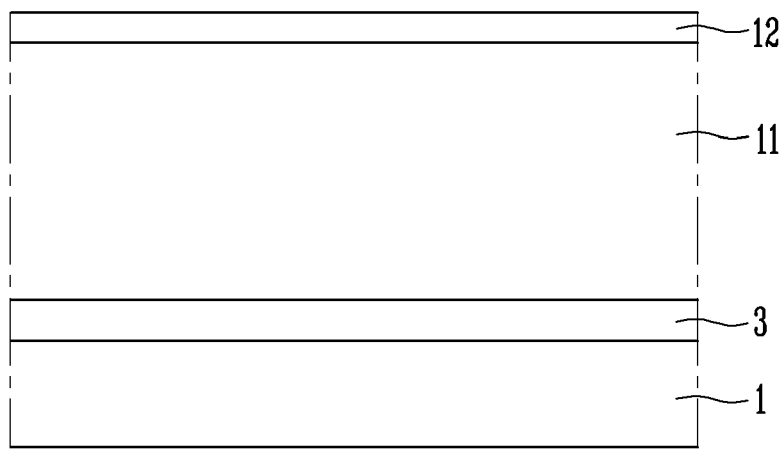
Figure 2E:
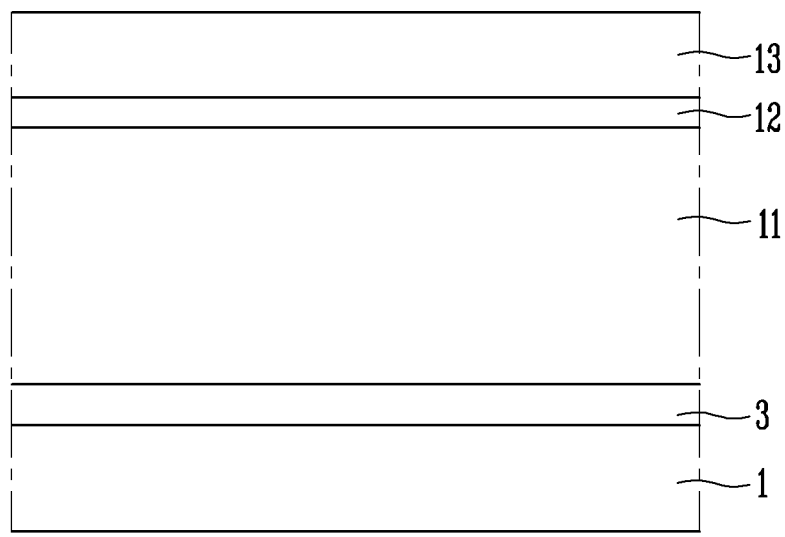
Figure 2F:
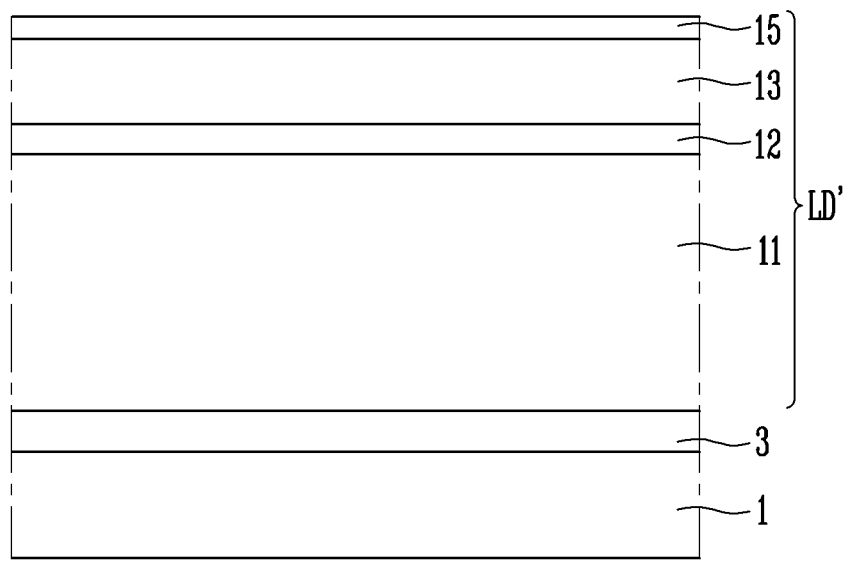
Figure 2G:
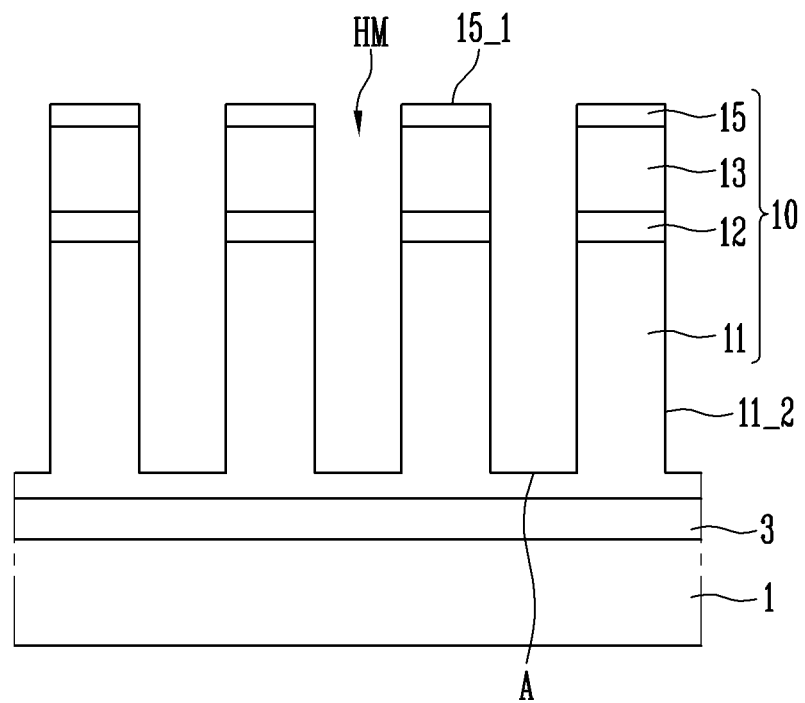
Figure 2H:
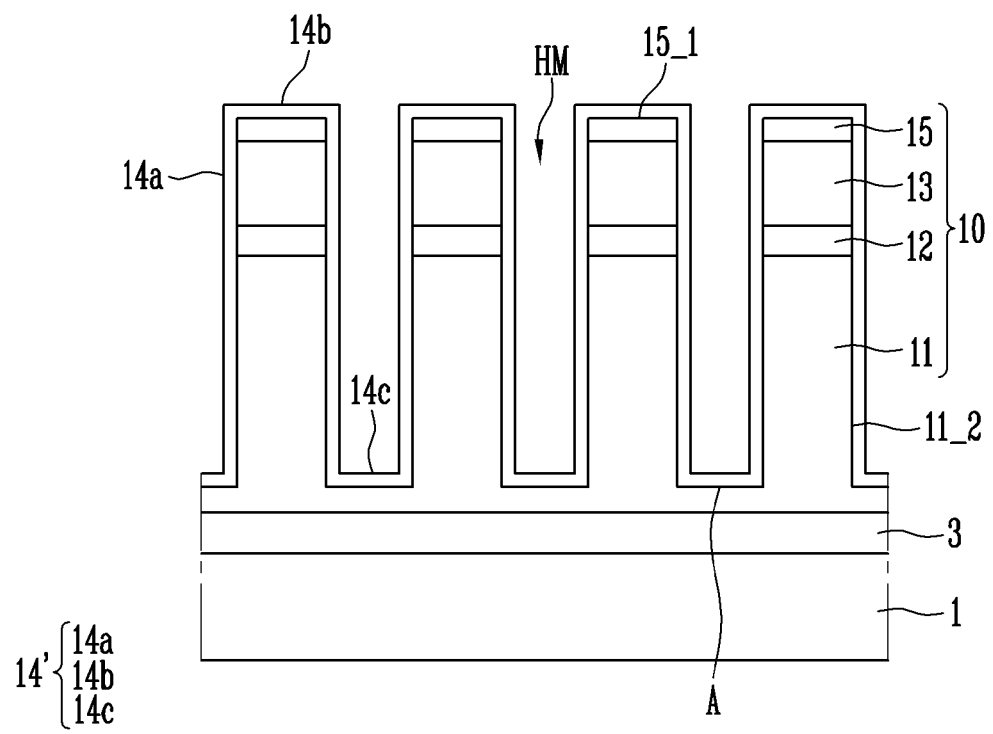
Figure 2I:
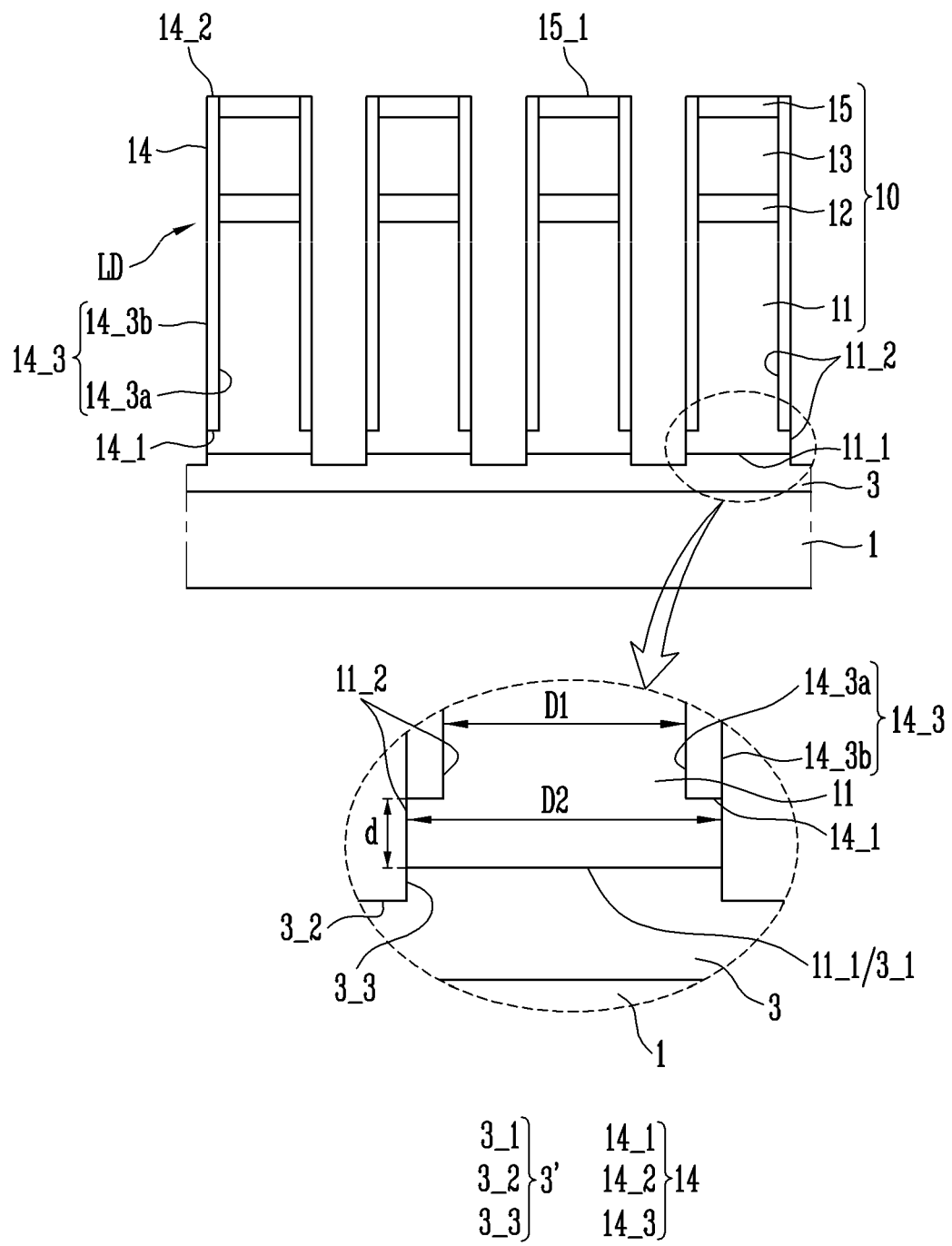
Figure 2J:
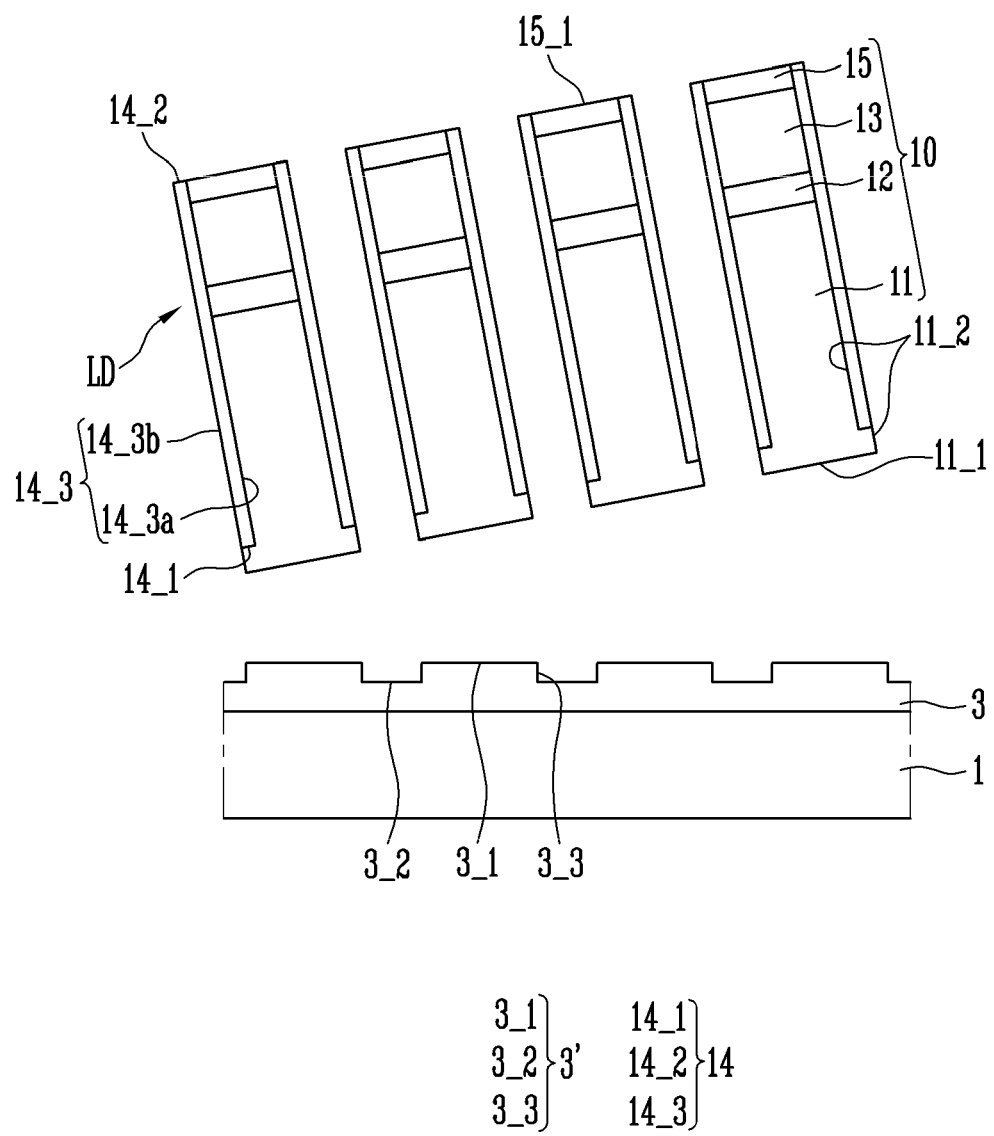
Figure 14A:
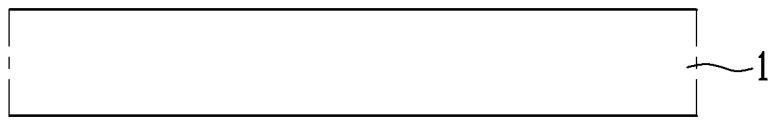
FIGS. 14A-14M are sectional views sequentially illustrating a method of manufacturing the light emitting element of FIG. 13.
Figure 14B:
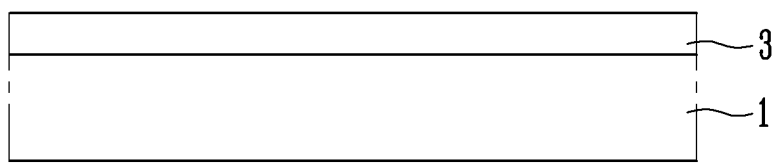
Figure 14C:
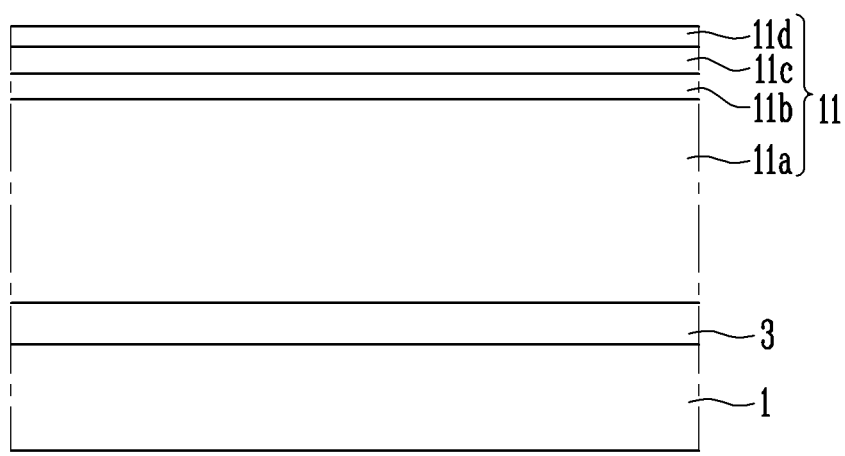
Figure 14D:
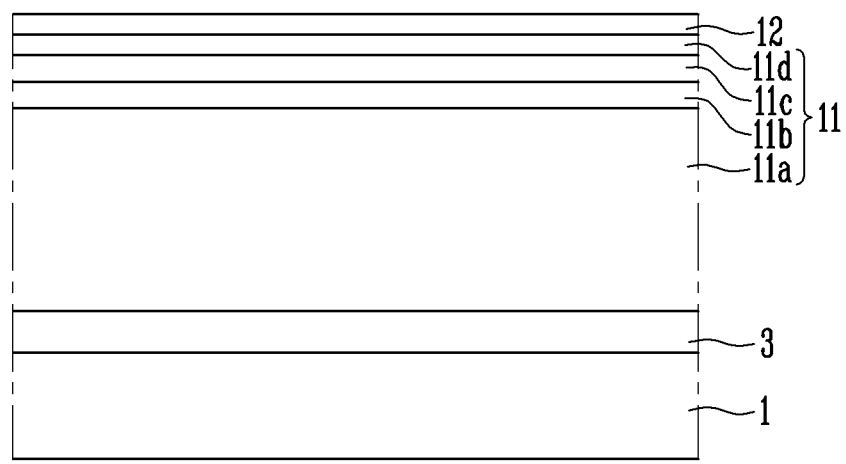
Figure 14E:
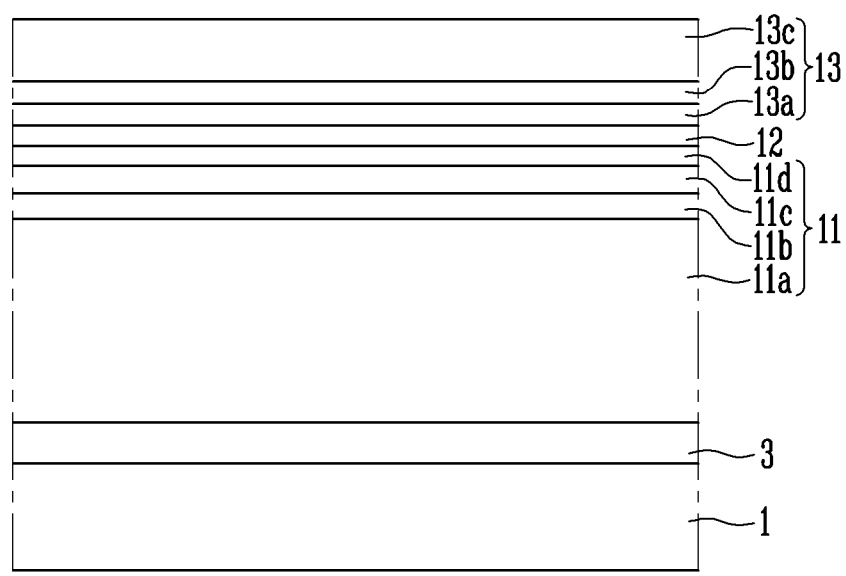
Figure 14F:
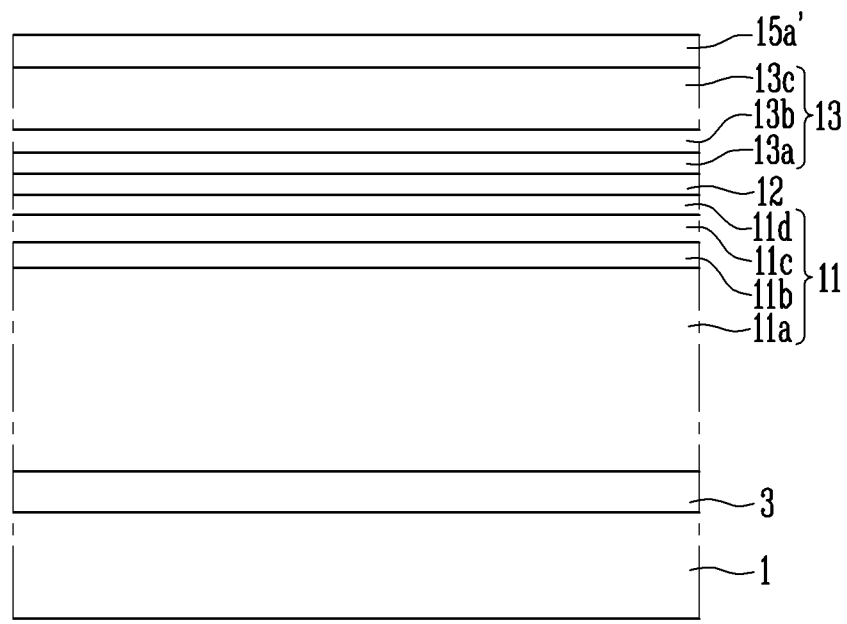
Figure 14G:
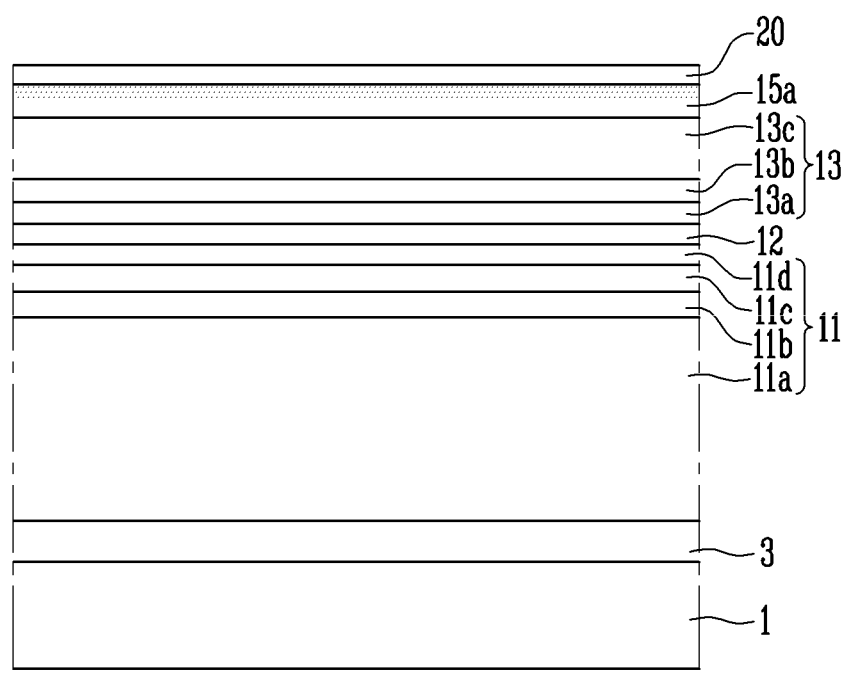
Figure 14H:
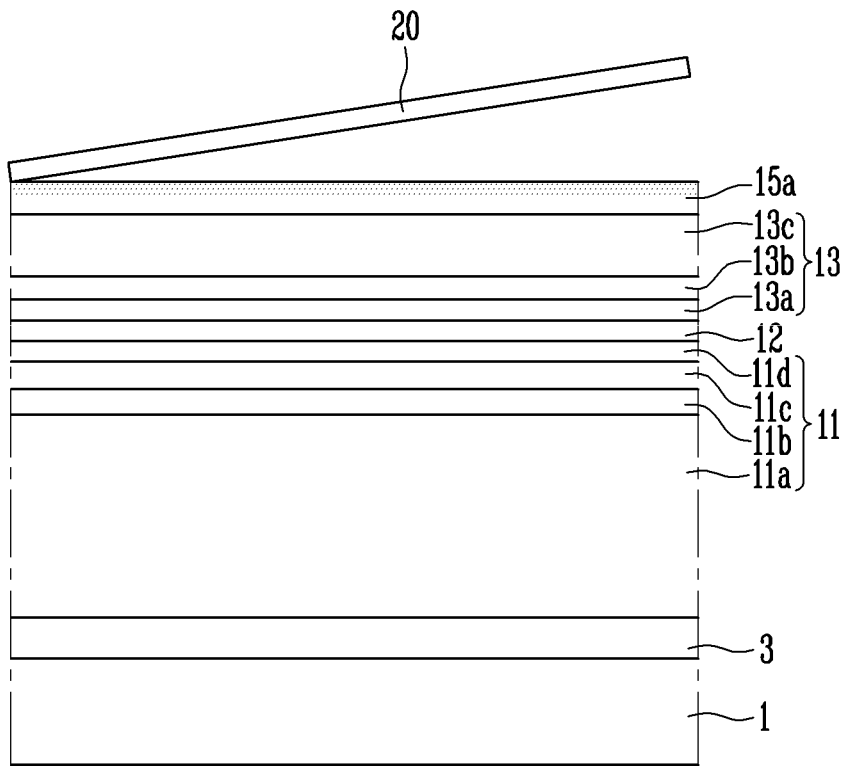
Figure 14I:
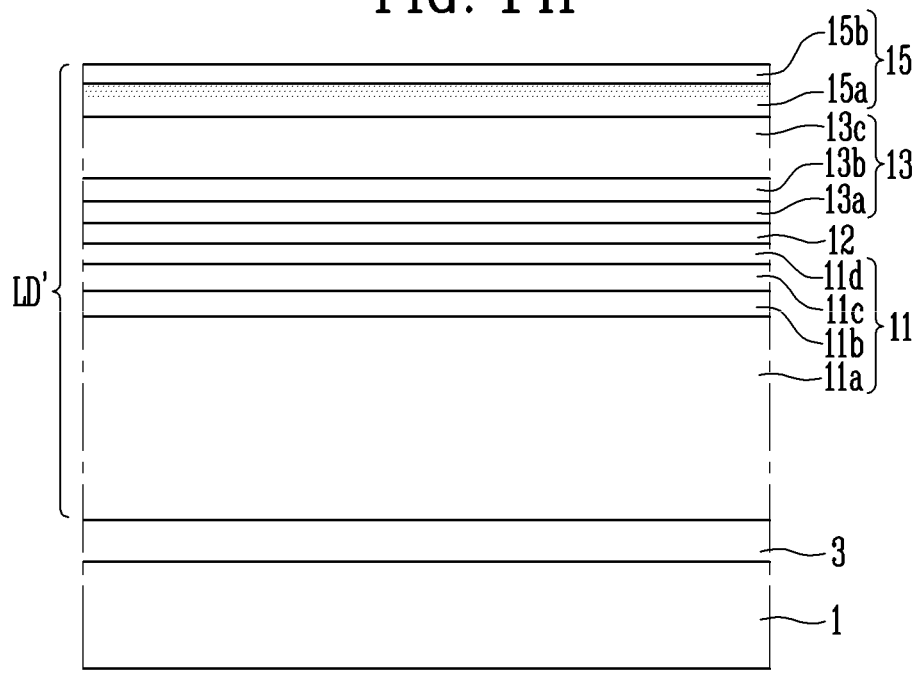
Figure 14J:
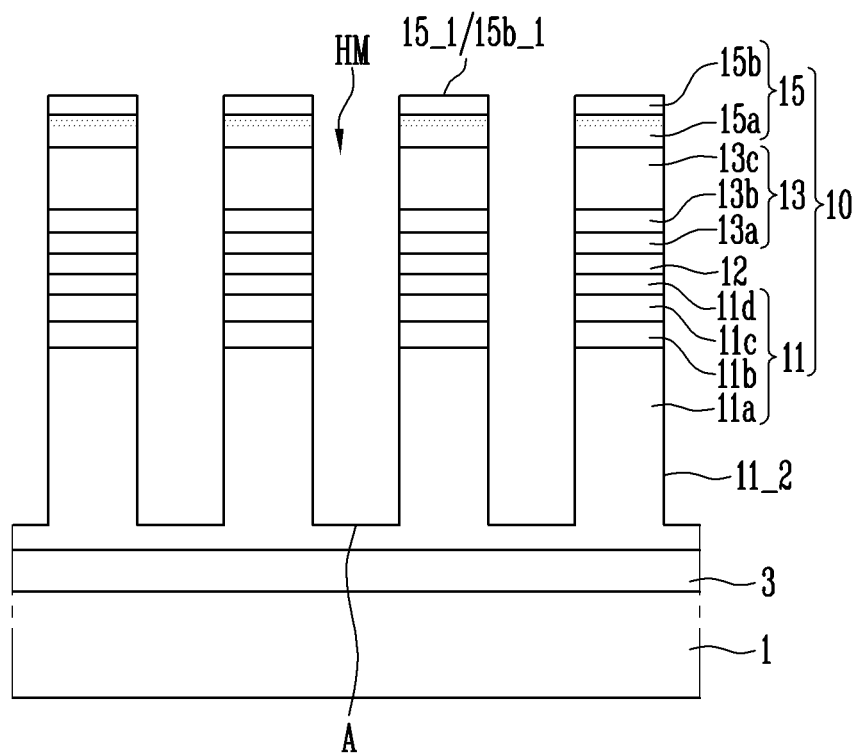
Figure 14K:
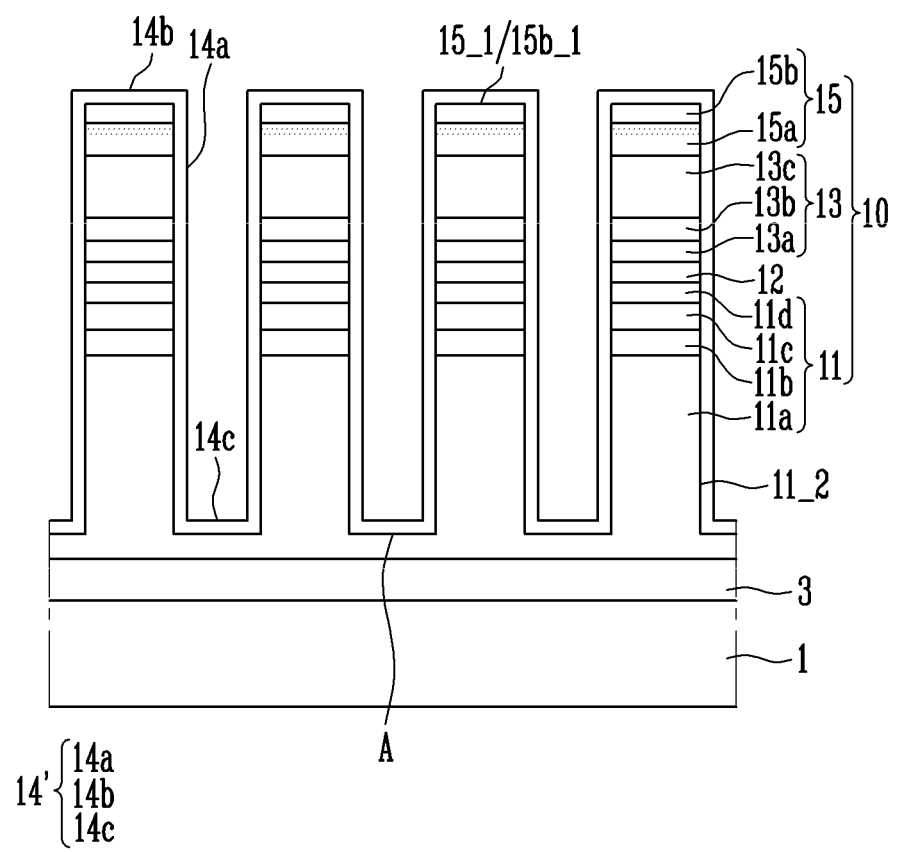
Figure 14L:
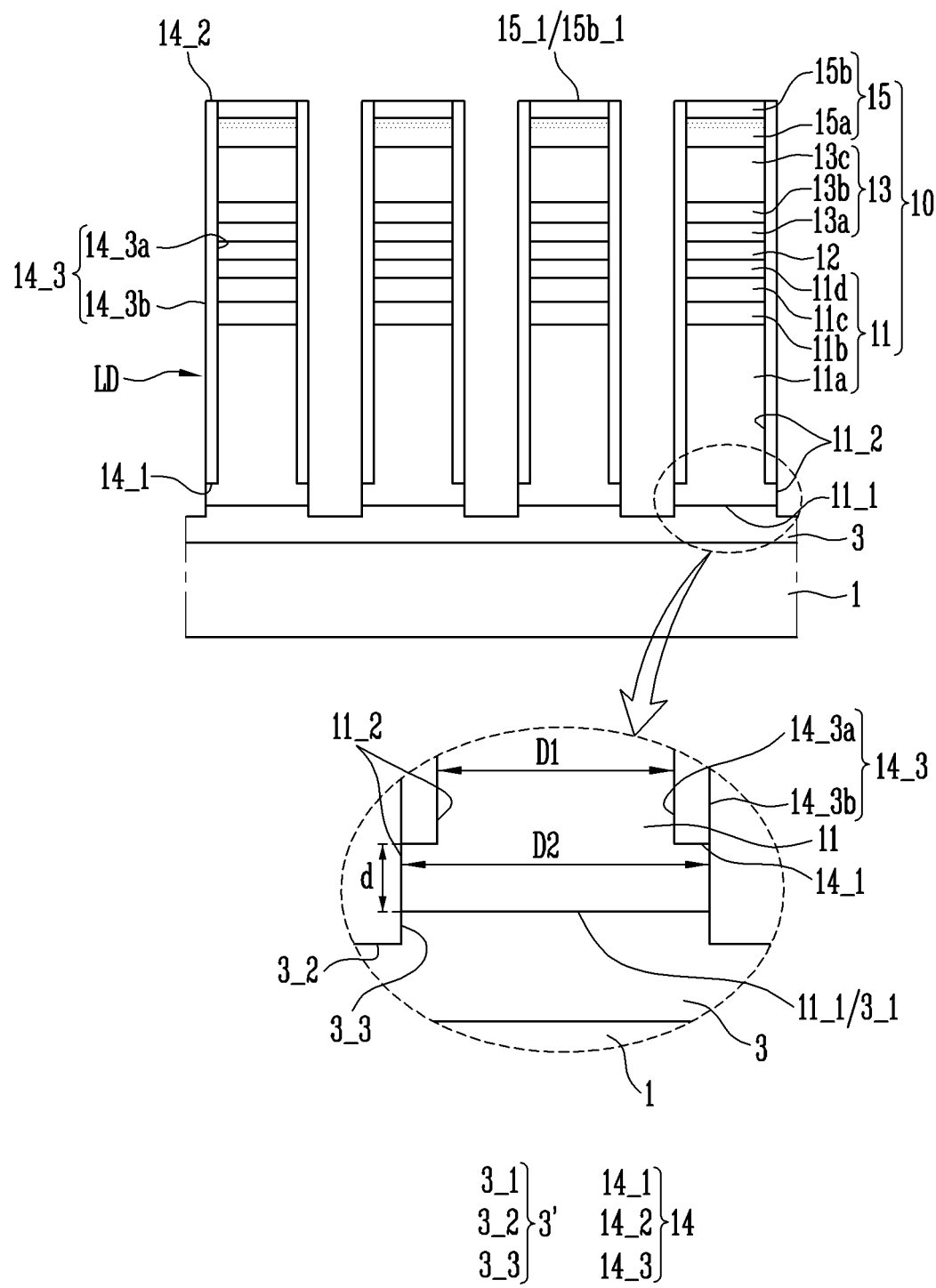
Figure 14M:
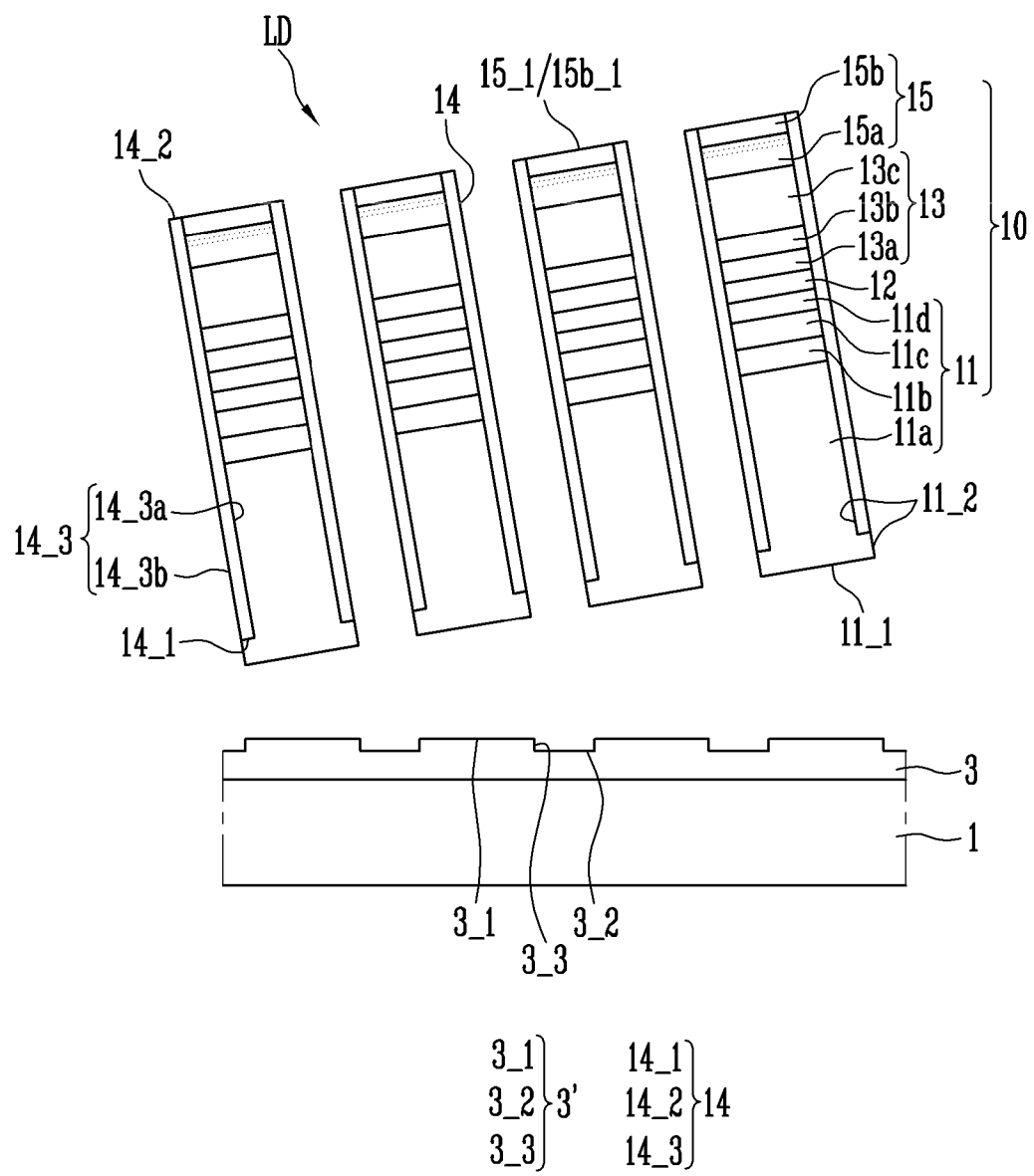

The method of manufacturing the light emitting element illustrated in FIGS. 14A-14C may be substantially equal or similar to the method of manufacturing the light emitting element of FIGS. 2A-2C. Therefore, to avoid redundant explanation, the description of the method of manufacturing the light emitting element of FIGS. 14A-14C will be focused on differences from that of the foregoing embodiments.

Referring to FIGS. 13, and 14A-14C, a sacrificial layer 3 is formed on a substrate 1, and a first conductive semiconductor layer 11 is formed on the sacrificial layer 3.

The substrate 1 may include a GaAs substrate made of GaAs. The sacrificial layer 3 may be formed of GaAs.

The first conductive semiconductor layer 11 may include a GaAs layer 11*a*, a GaIn layer 11*b*, an AlGaInP layer 11*c*, and an AlInP layer 11*d*, which are sequentially formed on the sacrificial layer 3. Each of the GaAs layer 11*a*, the GaIn layer 11*b*, the AlGaInP layer 11*c*, and the AlInP layer 11*d* may be the n-type semiconductor layer. In an embodiment of the present disclosure, the first conductive semiconductor layer 11 may be formed in a multi-layer structure including at least one n-type semiconductor layer.

Referring to FIGS. 13, and 14A-14D, the active layer 12 is formed on the first conductive semiconductor layer 11. The active layer 12 may be formed on the first conductive semiconductor layer 11 and may be an intrinsic semiconductor layer that is not doped with impurities. The active layer 12 may be formed in a single or multi quantum well structure.

In an embodiment of the present disclosure, the active layer 12 may include at least one of GaInP, AlGaInP, GaAs, AlGaAs, InGaAs, InGaAsP, InP, and InAs. Furthermore, the active layer 12 may emit light in a red or infrared band having a wavelength of 580 nm to 900 nm.

In an embodiment, the AlInP layer 11d positioned under the active layer 12 and corresponding to the uppermost layer of the first conductive semiconductor layer 11 may act as a cladding layer confining electrons or holes of the active layer 12. The AlInP layer 11*d* may be at least one n-type semiconductor layer larger than the band gap of the active layer 12 within a range that satisfies conditions for improving the luminous efficiency of the active layer 12.

Referring to FIGS. 13, and 14A-14E, the second conductive semiconductor layer 13 is formed on the active layer 12. The second conductive semiconductor layer 13 may be formed in a multi-layer structure including the AlInP layer 13*a*, the GaInP layer 13*b*, and the GaP layer 13*c* that are sequentially stacked on the active layer 12. Each of the AlInP layer 13*a*, the GaInP layer 13*b*, and the GaP layer 13*c* may be the p-type semiconductor layer. In an embodiment of the present disclosure, the second conductive semiconductor layer 13 may be formed to include at least one p-type semiconductor layer.

In an embodiment, the AlInP layer 13*a* positioned above the active layer 12 and corresponding to the lowermost layer of the second conductive semiconductor layer 13 may act as a cladding layer confining electrons or holes of the active layer 12. The AlInP layer 13a may be at least one p-type semiconductor layer larger than the band gap of the active layer 12 within a range that satisfies conditions for improving the luminous efficiency of the active layer 12.

Referring to FIGS. 13, and 14A-14F, a conductive layer 15a' is formed on the GaP layer 13c corresponding to the uppermost layer of the second conductive semiconductor layer 13. In an embodiment of the present disclosure, the conductive layer 15a' may be formed of the p-type GaP layer doped with Mg. The conductive layer 15a' may be epitaxially grown by an MOVPE method, but the present disclosure is not limited thereto.

Referring to FIGS. 13, and 14A-14G, an AuBe layer 20 is formed on the conductive layer 15a'. For example, the AuBe layer 20 is formed on an entire surface of the conductive layer 15a'. Here, the AuBe layer 20 may be an ohmic material layer.

Subsequently, the heat treatment process of the conductive layer 15a' and the AuBe layer 20 is performed. The heat treatment process may be, for example, an alloying process and may be performed at about 350° C. or less. Through this heat treatment process, the conductive layer 15' may be formed to be the first electrode layer 15a in which Be of the AuBe layer 20 is diffused.

Subsequently, referring to FIGS. 13, and 14A-14H, the AuBe layer 20 is removed by separating the AuBe layer 20 on the first electrode layer 15a. In this case, the separation of the AuBe layer 20 may be performed by a wet etching process, but the present disclosure is not limited thereto.

Referring to FIGS. 13, and 14A-14I, the second electrode layer 15b is formed on the first electrode layer 15a. The second electrode layer 15b covers the first electrode layer 15a to protect the first electrode layer 15a in the manufacturing process of the insulating film 14 that will be described below. In an embodiment of the present disclosure, the second electrode layer 15b may be formed of transparent metal oxide, and may have a thickness of a certain level or more. The first electrode layer 15a and the second electrode layer 15b that are sequentially stacked may be the electrode layer 15 that is in ohmic contact with the second conductive semiconductor layer 13.

As described above, the first conductive semiconductor layer 11, the active layer 12, the second conductive semiconductor layer 13, and the electrode layer 15 which are sequentially stacked on the substrate 1 may form an emissive stack LD'.

Referring to FIGS. 13, and 14A-14J, after the mask (not shown) having the plurality of openings is disposed above the emissive stack LD', the first etching process is performed to pattern the emissive stack LD' at the nano-scale or micro-scale interval, thus forming the plurality of emissive stack patterns 10.

In the first etching process, an area of the emissive stack LD' corresponding to the openings of the mask may be etched, thus forming the groove HM that causes the area A of the first conductive semiconductor layer 11 to be exposed to the outside. Here, the area A of the first conductive semiconductor layer 11 exposed to the outside by the groove HM may be the surface of the GaAs layer 11a.

The groove HM may have a shape that is recessed from the upper surface of each emissive stack pattern 10 to the area A of the first conductive semiconductor layer 11 in the vertical direction. Here, the upper surface of each emissive stack pattern 10 may be the upper surface 15_1 of the electrode layer 15. In an embodiment of the present disclosure, the upper surface 15_1 of the electrode layer 15 may be the upper surface 15b_1 of the second electrode layer 15b which is the uppermost layer of the electrode layer 15.

In an embodiment of the present disclosure, each of the emissive stack patterns 10 may have a nano-scale or micro-scale size.

Referring to FIGS. 13, and 14A-14K, the insulating material layer 14' is formed on the emissive stack patterns 10 and the area A of the first conductive semiconductor layer 11. The insulating material layer 14' may include an upper insulating material layer 14b, a side insulating material layer 14a, and a lower insulating material layer 14c.

The material used as the insulating material layer 14' may include any one selected from a group consisting of $SiO_2$, $Si_3N_4$, $Al_2O_3$ and $TiO_2$.

Referring to FIGS. 13, and 14A-14L, the second etching process is performed to form the insulating film 14.

Through the second etching process, the insulating film 14 including only the side insulating material layer 14a that covers the side surface of each emissive stack pattern 10 may be finally formed. Through the second etching process, the upper surface 15b_1 of the second electrode layer 15b may be exposed to the outside. In this case, the upper surface 14_2 of the insulating film 14 and the upper surface 15b_1 of the second electrode layer 15b may be provided on the same surface. In an embodiment of the present disclosure, the second etching process may be performed by the dry etching method.

Furthermore, through the second etching process, a portion of the sacrificial layer 3 may be removed, so that at least one or more uneven patterns 3' may be formed on a surface of the sacrificial layer 3 and a portion of the outer periphery 11_2 of the first conductive semiconductor layer 11 may be exposed to the outside.

A portion of the outer periphery (or the outer circumference) 11_2 of the first conductive semiconductor layer 11 exposed to the outside may coincide with the outer side surface 14_3b of the insulating film 14, and may extend to the outer side surface 14_3b of the insulating film 14. A remaining portion of the outer periphery (or the outer circumference) 11_2 of the first conductive semiconductor layer 11 covered by the insulating film 14 may coincide with the inner side surface 14_3a of the insulating film 14, and may come into contact with the inner side surface 14_3a of the insulating film 14. Thus, the portion of the outer periphery (or the outer circumference) 11_2 of the first conductive semiconductor layer 11 that is not covered by the insulating film 14 and the remaining portion of the outer periphery (or the outer circumference) 11_2 of the first conductive semiconductor layer 11 that is covered by the insulating film 14 may have different perimeters. For example, the perimeter of the portion of the outer periphery (or the outer circumference) 11_2 of the first conductive semiconductor layer 11 may be larger than the perimeter of the remaining portion of the outer periphery (or the outer circumference) 11_2 of the first conductive semiconductor layer 11. Thus, a diameter D2 of the first conductive semiconductor layer 11 that is not covered by the insulating film 14 and is exposed to the outside may be larger than a diameter D1 of the first conductive semiconductor layer 11 that is covered by the insulating film 14.

The uneven pattern 3' may include an uneven lower surface 3_2, an uneven upper surface 3_1, and an uneven side surface 3_3. The uneven upper surface 3_1 may be a surface coming into contact with the lower surface 11_1 of the first conductive semiconductor layer 11. The uneven lower surface 3_2 may be a surface that is exposed to the outside by removing a portion of the sacrificial layer 3 due to the second etching process. The uneven side surface 3_3 may be a connecting surface that is perpendicular to the uneven upper surface 3_1 and the uneven lower surface 3_2. Furthermore, the uneven side surface 3_3 may extend to a portion of the outer periphery (or the outer circumference) 11_2 of the first conductive semiconductor layer 11.

As a portion of each of the insulating material layer 14' and the sacrificial layer 3 is removed and thus a portion of the outer periphery (or the outer circumference) 11_2 of the first conductive semiconductor layer 11 is exposed to the outside by the second etching process, the lower surface 11_1 of the first conductive semiconductor layer 11 may be positioned closer to the substrate 1 than the lower surface 14_1 of the insulating film 14. Furthermore, the lower surface 14_1 of the insulating film 14 may be positioned closer to the active layer 12 than the lower surface 11_1 of the first conductive semiconductor layer 11. A distance difference d between the lower surface 14_1 of the insulating film 14 and the lower surface 11_1 of the first conductive semiconductor layer 11 may be within about 100 nm, but is not limited thereto.

In an embodiment, because a portion of the second electrode layer 15b may be removed by the etching gas that is used in the second etching process but the second electrode layer 15b has a thickness of a certain level or more, the second electrode layer may sufficiently cover the first electrode layer 15a disposed thereunder. Thereby, the first electrode layer 15a may not be affected by the etching gas that is used in the second etching process. In other words, as the second electrode layer 15b may be disposed on the first electrode layer 15a to protect the first electrode layer 15a, it is possible to prevent the first electrode layer 15a from being damaged by the etching gas.

The light emitting elements LD enclosed by the insulating film 14 may be formed on the substrate 1 by performing the second etching process.

Referring to FIGS. 13, and 14A-14M, the light emitting elements LD are separated from the substrate 1 using the chemical lift-off (CLO) method. The chemical lift-off may be performed by removing the sacrificial layer 3 including the uneven pattern 3'.

Through the above-described manufacturing process, each of the finally manufactured light emitting elements LD may be shaped such that the lower surface 11_1 of the first conductive semiconductor layer 11 and a portion of the outer periphery (or the outer circumference) 11_2 thereof are exposed to the outside.

Figure 15:
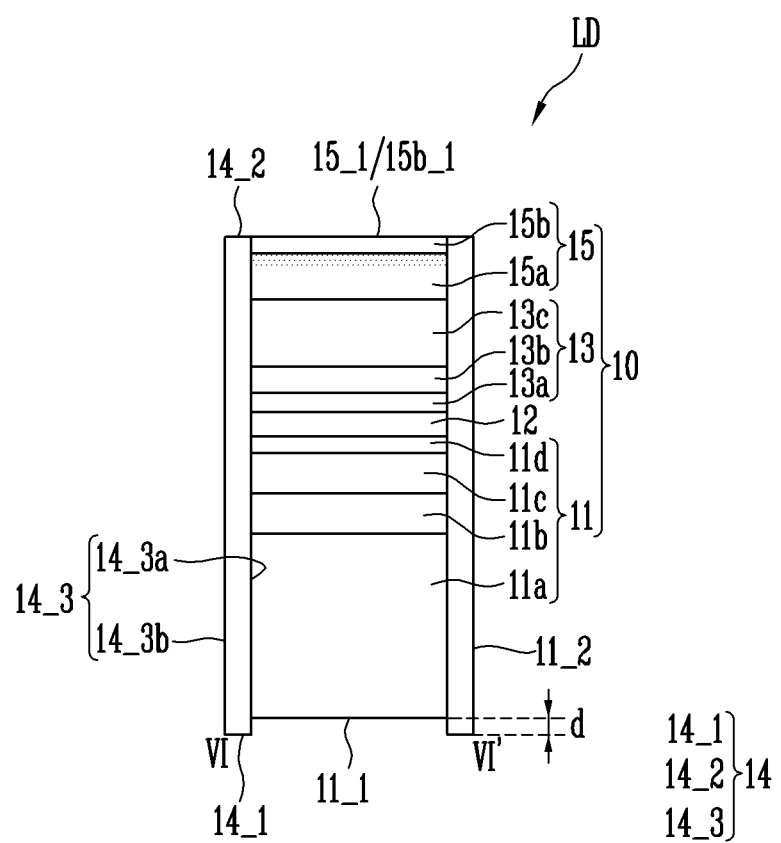
FIG. 15 is a sectional view corresponding to the line VI-VI' of FIG. 12A to illustrate a light emitting element in accordance with an embodiment of the present disclosure.

FIG. 15 is a sectional view corresponding to the line VI-VI' of FIG. 12A to illustrate a light emitting element in accordance with an embodiment of the present disclosure.

The light emitting element of FIG. 15 may be substantially equal or similar to the light emitting element of FIG. 13 except that the lower surface of the insulating film 14 protrudes downwards from the lower surface of the first conductive semiconductor layer 11.

Thus, in order to avoid redundant explanation, the description of the light emitting element of FIG. 15 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 12A and 15, the light emitting element LD in accordance with an embodiment of the present disclosure may include an emissive stack pattern 10 formed by sequentially stacking a first conductive semiconductor layer 11, an active layer 12, a second conductive semiconductor layer 13, and an electrode layer 15 in the longitudinal direction L. Furthermore, the light emitting element LD may further include an insulating film 14 provided on a surface of the emissive stack pattern 10.

In an embodiment of the present disclosure, the insulating film 14 may cover each of the outer periphery (or the outer circumference) 11_2 of the first conductive semiconductor layer 11, the outer periphery of the active layer 12, the outer periphery (or the outer circumference) of the second conductive semiconductor layer 13, and the outer periphery (or the outer circumference) of the electrode layer 15. As the insulating film 14 covers the outer periphery (or the outer circumference) 11_2 of the first conductive semiconductor layer 11, the outer periphery (or the outer circumference) 11_2 of the first conductive semiconductor layer 11 may coincide with the inner side surface 14_3a of the insulating film 14. Thus, the perimeter of the outer periphery (or the outer circumference) 11_2 of the first conductive semiconductor layer 11 may be the same as the perimeter of the inner side surface 14_3a of the insulating film 14. In an embodiment of the present disclosure, the perimeter of the outer periphery (or the outer circumference) 11_2 of the first conductive semiconductor layer 11 may be the same as the perimeter of the lower surface 11_1 of the first conductive semiconductor layer 11. Therefore, the diameter of the lower surface 11_1 of the first conductive semiconductor layer 11 may be the same as the diameter D of the emissive stack pattern 10.

Furthermore, the insulating film 14 may not cover the upper surface 15_1 of the electrode layer 15 and the lower surface 11_1 of the first conductive semiconductor layer 11. Here, the upper surface 15_1 of the electrode layer 15 may be the upper surface 15b_1 of the second electrode layer 15b included in the electrode layer 15.

The lower surface 14_1 of the insulating film 14 may protrude downwards from the lower surface 11_1 of the first conductive semiconductor layer 11 in the longitudinal direction L of the light emitting element LD. Thus, the lower surface 14_1 of the insulating film 14 and the lower surface 11_1 of the first conductive semiconductor layer 11 may be disposed on different surfaces. For example, the lower surface 11_1 of the first conductive semiconductor layer 11 may be positioned closer to the active layer 12 than the lower surface 14_1 of the insulating film 14. The lower surface 14_1 of the insulating film 14 and the lower surface 11_1 of the first conductive semiconductor layer 11 may be parallel to each other in the horizontal direction crossing the longitudinal direction L of the light emitting element LD while being spaced from each other by a distance d (e.g., a set distance or a predetermined distance d).

Figure 16:
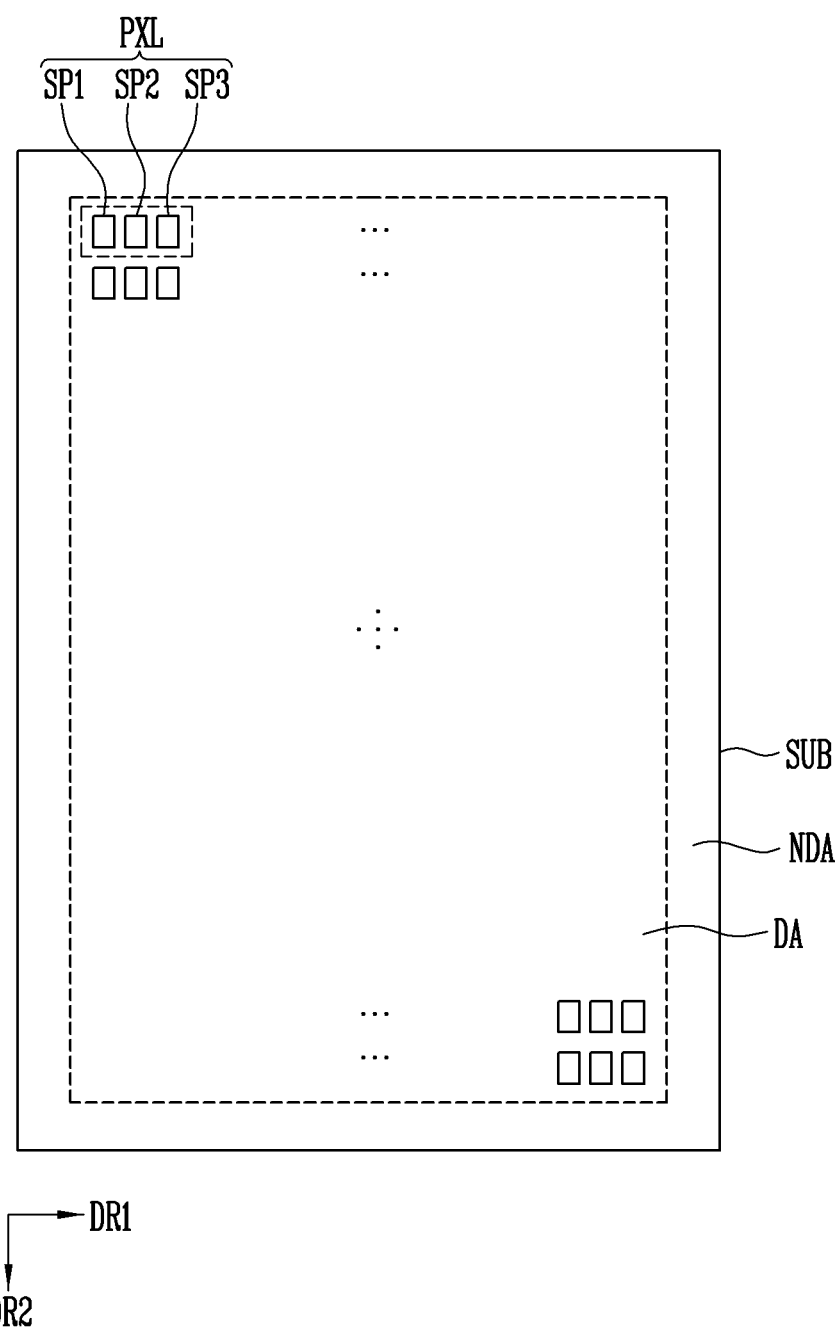
FIG. 16 is a schematic plan view illustrating a display device in accordance with an embodiment of the present disclosure, particularly the display device that uses the light emitting element shown in FIG. 1A as a light emitting source.

FIG. 16 is a schematic plan view illustrating a display device in accordance with an embodiment of the present disclosure, for example the display device that uses the light emitting element shown in FIG. 1A as a light emitting source.

For the sake of explanation, FIG. 16 schematically illustrates the structure of the display device, focused on a display area in which an image is displayed. In some embodiments, although not illustrated, at least one driving circuit (e.g., a scan driver and a data driver) and/or a plurality of signal lines may be further provided in the display device.

Referring to FIGS. 1A and 16, the display device in accordance with an embodiment of the present disclosure may include a substrate SUB, a plurality of pixels PXL provided on the substrate SUB and including at least one light emitting element LD, a driver (not shown) provided on the substrate SUB and driving the pixels PXL, and a line component (not shown) coupling the pixels PXL with the driver.

The display device may be classified into a passive-matrix type display device and an active-matrix type display device according to a method of driving the light emitting element LD. For example, in the case where the display device is implemented as the active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the present disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and a portion of the line component for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided on at least one side of the display area DA. In an embodiment of the present disclosure, the non-display area NDA may enclose the perimeter of the display area DA.

The substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The pixels PXL may be provided in the display area DA on the substrate SUB. Each pixel PXL refers to a smallest unit for displaying an image, and a plurality of pixels may be provided.

Each of the pixels PXL may include the light emitting element LD configured to be driven in response to a corresponding scan signal and a corresponding data signal. The light emitting element LD may have a small size corresponding to a micro scale or a nano scale and may be coupled in parallel to light emitting elements LD disposed adjacent thereto. The light emitting element LD may form a light source of each pixel PXL.

Furthermore, each of the pixels PXL may include a plurality of sub-pixels. For example, each pixel PXL may include a first sub-pixel SP1, a second sub-pixel SP2, and a third sub-pixel SP3. In an embodiment, the first, second, and third sub-pixels SP1, SP2, and SP3 may emit light of different colors. For instance, the first sub-pixel SP1 may be a red sub-pixel for emitting red light, the second sub-pixel SP2 may be a green sub-pixel for emitting green light, and the third sub-pixel SP3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 16 there is illustrated an embodiment where the pixels PXL are arranged in the display area DA in a stripe shape, the present disclosure is not limited thereto. For instance, the display area DA may have various well-known pixel arrangement shapes.

The driver may provide a signal to each pixel PXL through the line component and thus control the operation of each pixel PXL. In FIG. 16, the line component is omitted for the sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 17A:
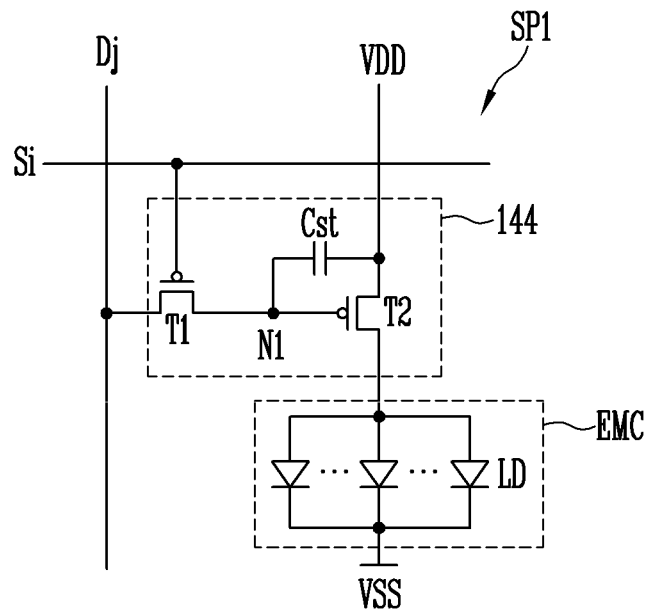
FIGS. 17A-17C are circuit diagrams illustrating various embodiments of a unit emission area of the display device of FIG. 16.
Figure 17B:
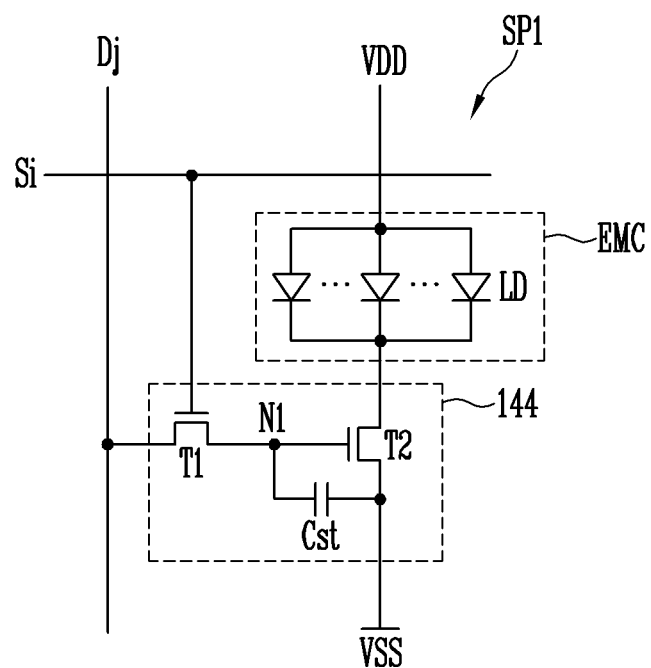
Figure 17C:
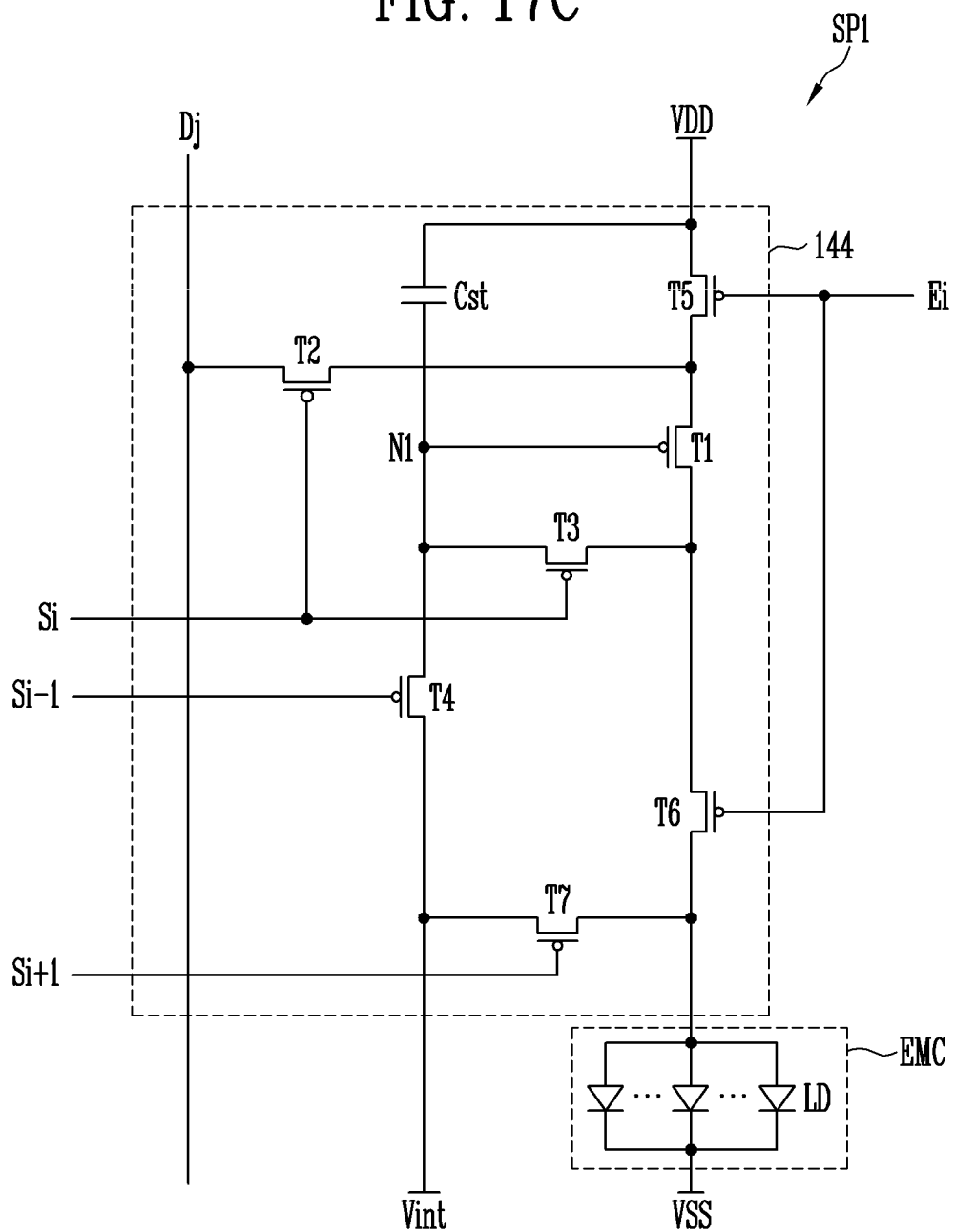

FIGS. 17A-17C are circuit diagrams illustrating various embodiments of a unit emission area of the display device of FIG. 16.

In FIGS. 17A-17C, each of the first to third sub-pixels may be configured as an active pixel. However, the type, structure and/or driving method of each of the first to third sub-pixels is not particularly limited. For example, each of the first to third sub-pixels may be configured as a pixel of a passive or active display device of various known structures.

In FIGS. 17A-17C, the first to third sub-pixels may have substantially the same or similar structure. Hereinafter, for convenience, the first sub-pixel among the first to third sub-pixels will be described as a representative.

First, referring to FIGS. 1A, 16, and 17A, the first sub-pixel SP1 may include a light emitting component EMC that generates light of a luminance corresponding to a data signal and a pixel driving circuit 144 that drives the light emitting component EMC.

In an embodiment, the light emitting component EMC may include a plurality of light emitting elements LD coupled parallel to each other between a first driving power supply VDD and a second driving power supply VSS. Here, the first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during a light emitting period of the first sub-pixel SP1. A first electrode (e.g., an anode electrode) of each of the light emitting elements LD may be coupled to a first driving power supply VDD via the pixel driving circuit 144, and a second electrode (e.g., a cathode electrode) of each of the light emitting elements LD may be coupled to a second driving power supply VSS.

Each of the light emitting elements LD may emit light at a luminance corresponding to driving current which is controlled by the pixel driving circuit 144.

Although FIGS. 17A-17C illustrate embodiments in which the light emitting elements LD are coupled in parallel to each other in the same direction (e.g. forward direction) between the first and second driving power supplies VDD and VSS, the present disclosure is not limited thereto. For example, in another embodiment, some of the light emitting elements LD may be coupled to each other in the forward direction between the first and second driving power supplies VDD and VSS, and the other light emitting elements LD may be coupled to each other in the reverse direction. One of the first and second driving power supplies VDD and VSS may be supplied in the form of AC voltage. In this case, the light emitting elements LD may alternately emit light by each group having the same coupling direction. Alternatively, in a further embodiment, the first sub-pixel SP1 may include only a single light emitting element LD.

In an embodiment of the present disclosure, the pixel driving circuit 144 may include a first transistor T1, a second transistor T2, and a storage capacitor Cst. However, the structure of the pixel driving circuit 144 is not limited to the embodiment illustrated in FIG. 17A.

A first electrode of the first transistor (e.g., a switching transistor) T1 is coupled to a data line Dj, and a second electrode thereof is coupled to the first node N1. Here, the first electrode and the second electrode of the first transistor T1 may be different electrodes. For example, if the first electrode is a source electrode, the second electrode may be a drain electrode. A gate electrode of the first transistor T1 is coupled to the scan line Si.

When a scan signal having a voltage (e.g., a low-level voltage) capable of turning on the first transistor T1 is supplied from the scan line Si, the first transistor T1 is turned on to electrically couple the data line Dj with the first node N1. Here, a data signal of a corresponding frame is supplied to the data line Dj, whereby the data signal is transmitted to the first node N1. The data signal transmitted to the first node N1 is charged in the storage capacitor Cst.

The first electrode of the second transistor T2 (e.g., a driving transistor) is coupled to the first driving power supply VDD, and the second electrode is electrically coupled to the first electrode of each of the light emitting elements LD. A gate electrode of the second transistor T2 is coupled to a first node N1. As such, the second transistor T2 may control the amount of driving current to be supplied to the light emitting elements LD in response to the voltage of the first node N1.

One electrode of the storage capacitor Cst is coupled to the first driving power supply VDD, and the other electrode thereof is coupled to the first node N1. The storage capacitor Cst charges a voltage corresponding to the data signal supplied to the first node N1, and maintains the charged voltage until a data signal of a subsequent frame is supplied.

For the sake of explanation, FIG. 17A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting element LD. However, the present disclosure is not limited thereto, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 17A the transistors, e.g., the first and second transistors T1 and T2, included in the pixel driving circuit 144 have been illustrated as being formed of P-type transistors, the present disclosure is not limited to this. In other words, at least one of the first and second transistors T1 and T2 included in the pixel driving circuit 144 may be changed to an N-type transistor.

Next, referring to FIGS. 1A, 16, and 17B, the first and second transistors T1 and T2 in accordance with an embodiment of the present disclosure may be formed of N-type transistors. The configuration and operation of the pixel driving circuit 144 illustrated in FIG. 17B, other than a change in connection positions of some components due to a change in the type of transistor, are similar to those of the pixel driving circuit 144 of FIG. 17A. Therefore, detailed descriptions pertaining to this will be omitted.

In an embodiment of the present disclosure, the configuration of the pixel driving circuit 144 is not limited to the embodiments illustrated in FIGS. 17A and 17B. For example, the pixel driving circuit 144 may be configured in the same manner as that of an embodiment shown in FIG. 17C.

Referring to FIGS. 1A, 16, and 17C, the pixel driving circuit 144 may be coupled to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be coupled to an i-th scan line Si and a j-th data line Dj of the display area DA.

In an embodiment, the pixel driving circuit 144 may also be coupled to at least one different scan line. For example, the first sub-pixel SP1 disposed on the i-th row of the display area DA may also be coupled to an i−1-th scan line Si−1 (e.g., a preceding scan line) and/or an i+1-th scan line Si+1 (e.g., a scan line of a subsequent stage).

In an embodiment, the pixel driving circuit 144 may be coupled not only to the first and second driving power supplies VDD and VSS but also to a third power supply. For example, the pixel driving circuit 144 may also be coupled to an initialization power supply Vint.

The pixel driving circuit 144 may include first to seventh transistors T1 to T7, and a storage capacitor Cst.

The first transistor (e.g., a driving transistor) T1 may include a first electrode, e.g., a source electrode, coupled to the first driving power supply VDD via the fifth transistor T5, and a second electrode, e.g., a drain electrode, coupled to one ends of light emitting elements LD via the sixth transistor T6. A gate electrode of the first transistor T1 may be coupled to a first node N1. The first transistor T1 controls driving current flowing between the first driving power supply VDD and the second driving power supply VSS via the light emitting elements LD in response to the voltage of the first node N1.

The second transistor (e.g., a switching transistor) T2 is coupled between the j-th data line Dj coupled to the first sub-pixel SP1 and the source electrode of the first transistor T1. A gate electrode of the second transistor T2 is coupled to the i-th scan line Si coupled to the first sub-pixel SP1.

When a scan signal having a gate-on voltage (e.g., a low-level voltage) is supplied from the i-th scan line Si, the second transistor T2 is turned on to electrically couple the j-th data line Dj to the source electrode of the first transistor T1. Hence, if the second transistor T2 is turned on, a data signal supplied from the j-th data line Dj is transmitted to the first transistor T1.

The third transistor T3 is coupled between the drain electrode of the first transistor T1 and the first node N1. A gate electrode of the third transistor T3 is coupled to the i-th scan line Si. When a scan signal having a gate-on voltage is supplied from the i-th scan line Si, the third transistor T3 is turned on to electrically couple the drain electrode of the first transistor T1 to the first node N1. Therefore, when the third transistor T3 is turned on, the first transistor T1 may be connected in the form of a diode (e.g., a diode-connected).

The fourth transistor T4 is coupled between the first node N1 and the initialization power supply Vint. A gate electrode of the fourth transistor T4 is coupled to a preceding scan line, e.g., an i−1-th scan line Si−1. When a scan signal of a gate-on voltage (e.g., a low-level voltage) is supplied to the i−1-th scan line Si−1, the fourth transistor T4 is turned on so that the voltage of the initialization power supply Vint is transmitted to the first node N1. Here, the initialization power supply Vint may have a voltage equal to or less than the minimum voltage of the data signal.

The fifth transistor T5 is coupled between the first driving power supply VDD and the source electrode of the first transistor T1. A gate electrode of the fifth transistor T5 is coupled to a corresponding emission control line, e.g., an i-th emission control line Ei. The fifth transistor T5 is turned off when an emission control signal having a gate-off voltage is supplied to the i-th emission control line Ei, and is turned on when an emission control signal having a gate-on voltage is supplied to the i-th emission control line Ei.

The sixth transistor T6 is coupled between the drain electrode of the first transistor T1 and first ends of the light emitting elements LD. A gate electrode of the sixth transistor T6 is coupled to the i-th emission control line Ei. The sixth transistor T6 is turned off when an emission control signal having a gate-off voltage is supplied to the i-th emission control line Ei, and is turned on when an emission control signal having a gate-on voltage is supplied to the i-th emission control line Ei.

The seventh transistor T7 is coupled between the first ends of the light emitting elements LD and the initialization power supply Vint. A gate electrode of the seventh transistor T7 is coupled to any one of scan lines of a subsequent stage, e.g., to the i+1-th scan line Si+1. When a scan signal having a gate-on voltage is supplied to the i+1-th scan line Si+1, the seventh transistor T7 is turned on so that the voltage of the initialization power supply Vint is supplied to the first ends of light emitting elements LD.

The storage capacitor Cst is coupled between the first driving power supply VDD and the first node N1. The storage capacitor Cst stores a voltage corresponding both to the data signal supplied to the first node N1 during each frame period and to the threshold voltage of the first transistor T1.

For convenience, all of the first to seventh transistors T1 to T7 are illustrated in FIG. 17C as the P-type transistor, but the present disclosure is not limited thereto. For example, at least one of the first to seventh transistors T1 to T7 included in the pixel driving circuit 144 may be changed to the N-type transistor, or all of the first to seventh transistors T1 to T7 may be changed to the N-type transistor.

Figure 18:
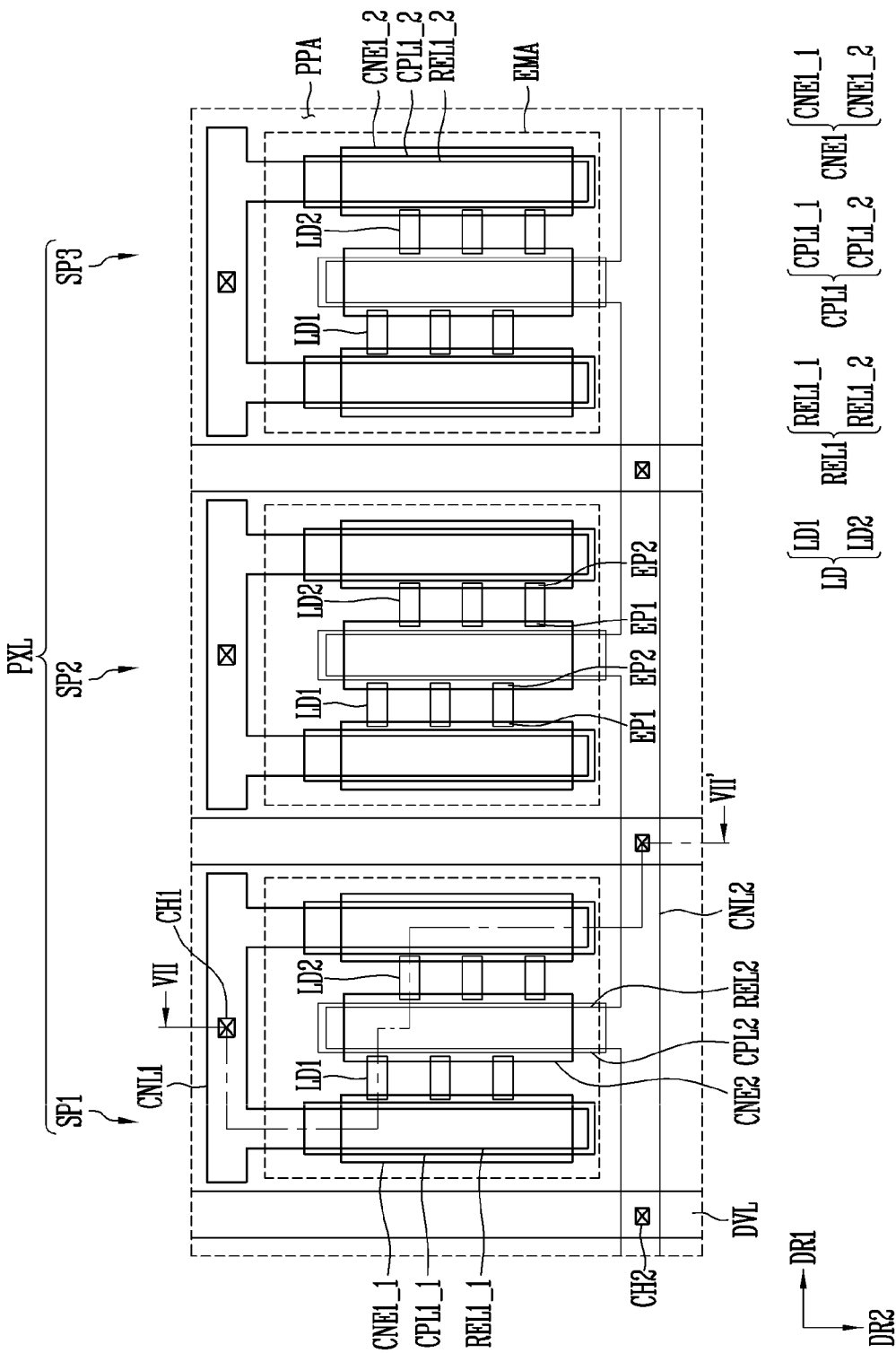
FIG. 18 is a plan view schematically illustrating first to third sub pixels included in one pixel from among the pixels shown in FIG. 16.
Figure 19:
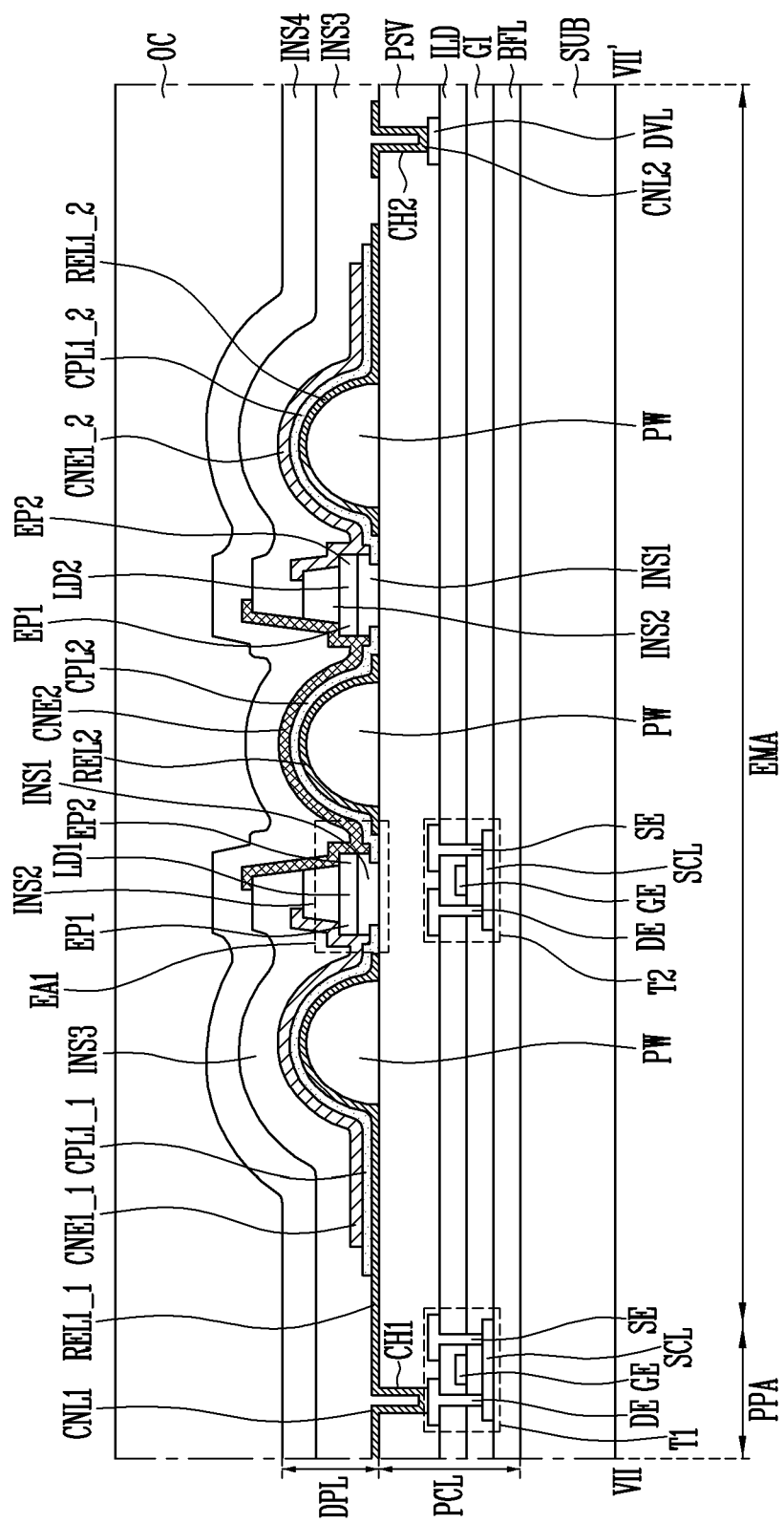
FIG. 19 is a sectional view taken along the line VII-VII' of FIG. 18.
Figure 20:
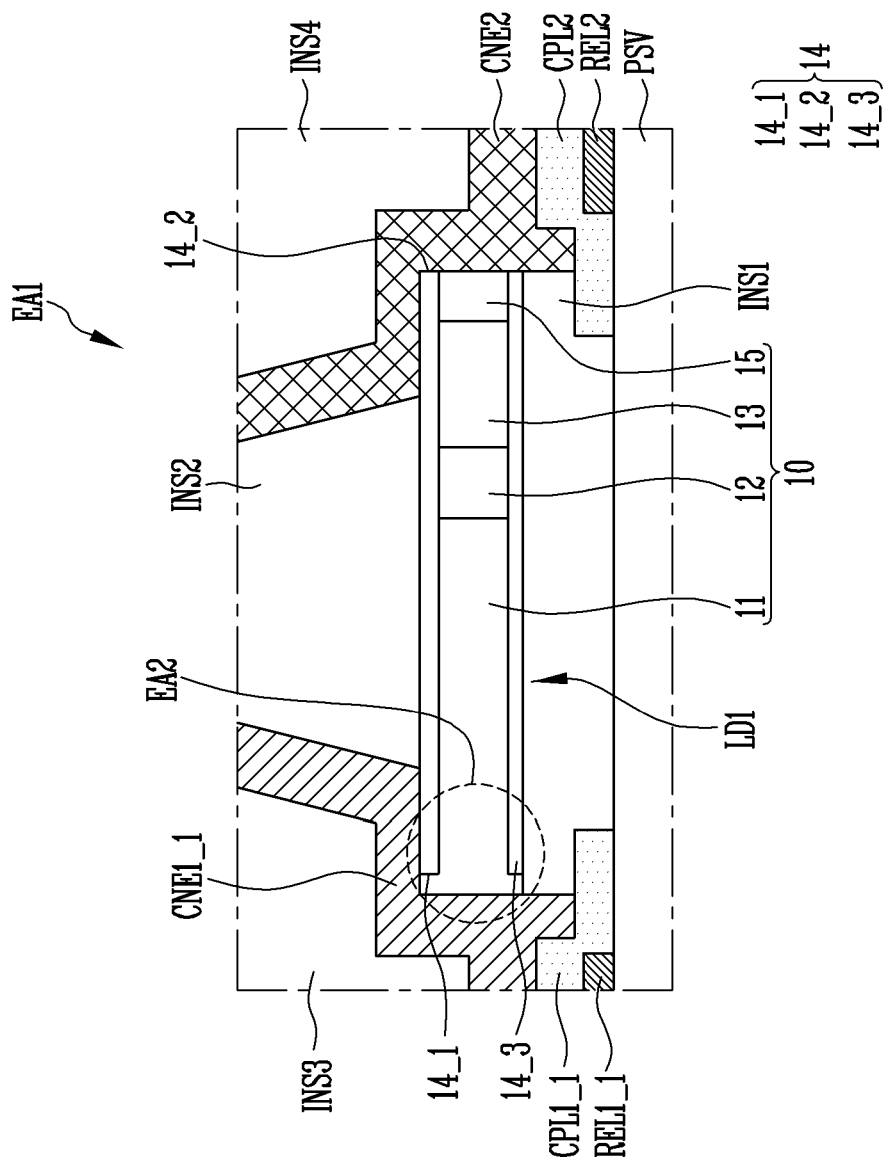
FIG. 20 is a schematically enlarged sectional view of area EA1 of FIG. 19.
Figure 21:
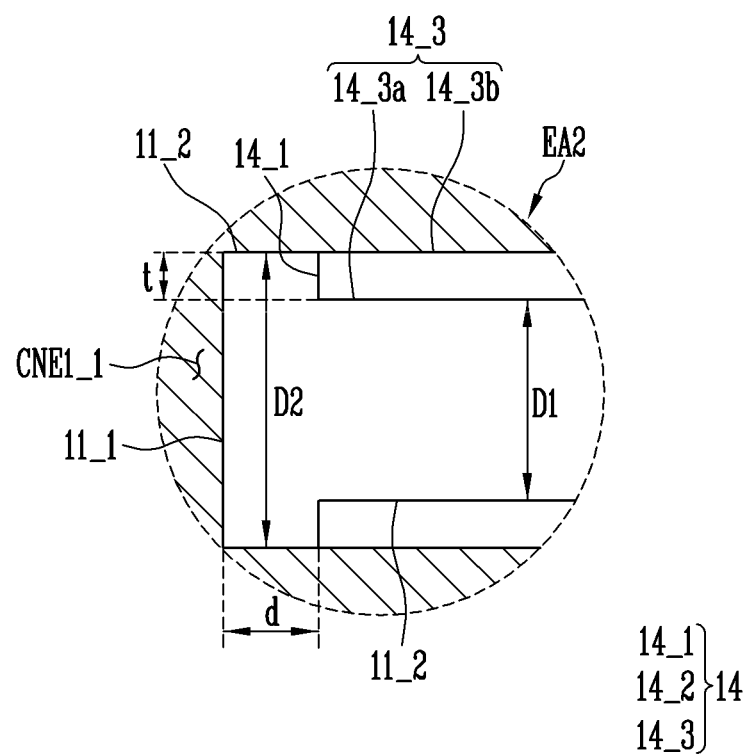
FIG. 21 is a schematically enlarged sectional view of area EA2 of FIG. 20.

FIG. 18 is a plan view schematically illustrating first to third sub pixels included in one pixel from among pixels shown in FIG. 16, FIG. 19 is a sectional view taken along the line VII-VII' of FIG. 18, FIG. 20 is a schematically enlarged sectional view of area EA1 of FIG. 19, and FIG. 21 is a schematically enlarged sectional view of area EA2 of FIG. 20.

For convenience, it is illustrated in FIG. 18 that a plurality of light emitting elements provided in each sub-pixel is aligned in a horizontal direction, but the arrangement of the light emitting elements is not limited thereto. For example, at least some of the light emitting elements may be aligned in a direction crossing the horizontal direction.

Furthermore, for convenience, illustration of transistors coupled to the light emitting elements, and signal lines coupled to the transistors has been omitted in FIG. 18.

In addition, it is illustrated in FIGS. 18-21 that one pixel structure is simplified, for example, each electrode is only a single electrode layer, but the present disclosure is not limited thereto.

Referring to FIGS. 1A, 16, and 18-21, the display device in accordance with an embodiment of the present disclosure may include a substrate SUB on which a plurality of pixels PXL is provided.

Each of the pixels PXL may include a first sub-pixel SP1, a second sub-pixel SP2, and a third sub-pixel SP3, which are provided on the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel.

Each of the first to third sub-pixels SP1 to SP3 may include an emission area EMA that emits light, and a peripheral area PPA that is positioned around the emission area EMA. In an embodiment of the present disclosure, the pixel area of each of the first to third sub-pixels SP1 to SP3 may include an emission area EMA and a peripheral area PPA of a corresponding sub-pixel.

In the pixel area of each of the first to third sub-pixels SP1 to SP3, the substrate SUB, a pixel circuit layer PCL, and a display element layer DPL may be provided.

The pixel circuit layer PCL of each of the first to third sub-pixels SP1 to SP3 may include a buffer layer BFL disposed on the substrate SUB, first and second transistors T1 and T2 disposed on the buffer layer BFL, and a driving voltage line DVL. Furthermore, the pixel circuit layer PCL of each of the first to third sub-pixels SP1 to SP3 may further include a passivation layer PSV provided on the first and second transistors T1 and T2 and the driving voltage line DVL.

The substrate SUB may include insulating material such as glass, an organic polymer, or crystal. Furthermore, the substrate SUB may be made of material having flexibility so as to be bendable or foldable, and have a single-layer or multi-layer structure.

The buffer layer BFL may be provided on the substrate SUB and prevent impurities from diffusing into the first or second transistor T1 or T2. The buffer layer BFL may be omitted depending on the material of the substrate SUB or processing conditions.

The first transistor T1 may be a driving transistor that is electrically coupled to some of the light emitting elements LD provided on the display element layer DPL of a corresponding sub-pixel to drive the light emitting elements LD, and the second transistor T2 may be a switching transistor that switches the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc. The channel area may be an intrinsic semiconductor, which is a semiconductor pattern which is not doped with impurities. Each of the source area and the drain area may be a semiconductor pattern doped with impurities.

The gate electrode GE may be provided on the semiconductor layer SCL with a gate insulating layer GI interposed therebetween.

The source electrode SE and the drain electrode DE may respectively come into contact with the source area and the drain area of the semiconductor layer SCL through corresponding contact holes which pass through an interlayer insulating layer ILD and the gate insulating layer GI.

The driving voltage line DVL may be provided on the interlayer insulating layer ILD, but the present disclosure is not limited thereto. In an embodiment, the driving voltage line may be provided on any one of insulating layers included in the pixel circuit layer PCL. The second driving power supply VSS (see FIG. 17A) may be applied to the driving voltage line DVL.

The passivation layer PSV may include a first contact hole CH1 that exposes a portion of the drain electrode DE of the first transistor T1, and a second contact hole CH2 that exposes a portion of the driving voltage line DVL.

The display element layer DPL of each of the first to third sub-pixels SP1 to SP3 may include a partition wall (or a bank) PW, first and second electrodes REL1 and REL2, first and second coupling lines CNL1 and CNL2, a plurality of light emitting elements LD, and first and second contact electrodes CNE1 and CNE2 provided on the passivation layer PSV.

The partition wall PW may be provided on the passivation layer PSV in the emission area EMA of each of the first to third sub-pixels SP1 to SP3. Although not illustrated in the drawings, a pixel defining layer (or dam portion) made of the same material as the partition wall PW may be formed and/or provided in the peripheral area PPA between adjacent sub-pixels to define the emission area EMA of each sub-pixel.

The partition wall PW may be spaced from the adjacent partition wall PW on the passivation layer PSV by an interval (e.g., a set interval or a predetermined interval). Two adjacent partition walls PW may be disposed on the passivation layer PSV to be spaced from each other by a length L or more of one light emitting element LD. As illustrated in FIG. 19, the partition wall PW may include a curved surface having a cross-section such as a semicircle or a semi-ellipse whose width is narrowed from one surface of the passivation layer PSV toward the top, but the present disclosure is not limited thereto.

In an embodiment, the partition wall PW may have a cross-section of a trapezoid whose width is narrowed from one surface of the passivation layer PSV toward the top. When viewed in a cross-section, the shape of the partition wall PW is not limited to the above-described embodiments, and may be variously changed within a range capable of improving the efficiency of light emitted from each of the light emitting elements LD. Two adjacent partition walls PW may be disposed on the same plane of the passivation layer PSV, and may have the same height.

Each of the light emitting elements LD may be formed of a light emitting diode which is made of material having an inorganic crystal structure and has a subminiature size, e.g., corresponding to a nano or micro scale.

Each of the light emitting elements LD may include an emissive stack pattern 10 formed by sequentially stacking a first conductive semiconductor layer 11, an active layer 12, a second conductive semiconductor layer 13, and an electrode layer 15 in the longitudinal direction L of each light emitting element LD.

Each of the light emitting elements LD may have a first end EP1 and a second end EP2 in the longitudinal direction L. In an embodiment of the present disclosure, the first conductive semiconductor layer 11 may be disposed on the first end EP1 of each light emitting element LD, and the electrode layer 15 may be disposed on the second end EP2 thereof. Here, each light emitting element LD may include a lower surface 11_1 of the first conductive semiconductor layer 11 and an upper surface 15_1 of the electrode layer 15, which are positioned on the opposite ends EP1 and EP2 of the light emitting element LD and are exposed to an outside, respectively.

Each light emitting element LD may further include an insulating film 14 provided on a surface of each emissive stack pattern 10. The insulating film 14 may be formed on the surface of each emissive stack pattern 10 to enclose an outer periphery (or the outer circumference) of at least the active layer 12. In addition, the insulating film 14 may further enclose an area of an outer periphery (or the outer circumference) of each of the first and second conductive semiconductor layers 11 and 13 and the electrode layer 15.

The insulating film 14 may not cover but may expose a portion of the first conductive semiconductor layer 11 and a portion of the electrode layer 15 that are positioned on both ends EP1 and EP2 of the light emitting element LD in the longitudinal direction L. The insulating film 14 includes a lower surface 14_1 that is parallel to the lower surface 11_1 of the first conductive semiconductor layer 11 in one direction crossing the longitudinal direction L of the light emitting element LD, an upper surface 14_2 that is opposite to the lower surface 14_1 in the longitudinal direction L, and a side surface 14_3 that covers a portion of a surface of the emissive stack pattern 10 in the longitudinal direction L. The lower surface 14_1 of the insulating film 14, the upper surface 14_2 of the insulating film 14, and the side surface 14_3 of the insulating film 14 may be continuously connected to each other. The insulating film 14 may include an inner side surface 14_3a and an outer side surface 14_3b.

In an embodiment of the present disclosure, the insulating film 14 may entirely enclose the outer periphery (or the outer circumference) of the electrode layer 15. In such a case, the upper surface 14_2 of the insulating film 14 and the upper surface 15_1 of the electrode layer 15 may be provided at the same surface.

In an embodiment of the present disclosure, the insulating film 14 does not cover the lower surface 11_1 of the first conductive semiconductor layer 11 positioned on the first end (e.g. a bottom of the cylinder) of the light emitting element LD and a portion of the outer periphery (or the outer circumference) 11_2 of the first conductive semiconductor layer 11. The lower surface 11_1 of the first conductive semiconductor layer 11 and a portion of the outer periphery (or the outer circumference) 11_2 thereof which are not covered by the insulating film 14 may be exposed to an outside. A remaining portion of the outer periphery (or the outer circumference) 11_2 excluding a portion of the outer periphery (or the outer circumference) 11_2 of the first conductive semiconductor layer 11 may be covered by the insulating film 14.

The portion of the outer periphery (or the outer circumference) 11_2 of the first conductive semiconductor layer 11 that is not covered by the insulating film 14 may coincide with the outer side surface 14_3b of the insulating film 14, and the remaining portion of the outer periphery (or the outer circumference) 11_2 of the first conductive semiconductor layer 11 that is covered by the insulating film 14 may coincide with the inner side surface 14_3a of the insulating film 14.

A second insulating layer INS2 covering a portion of the upper surface of each of the light emitting elements LD may be provided on each of the light emitting elements LD. A first insulating layer INS1 may be provided between each of the light emitting elements LD and the passivation layer PSV.

A first coupling line CNL1 may extend in the first direction DR1 in each of the first to third sub-pixels SP1 to SP3. The first coupling line CNL1 may be provided only in one corresponding sub-pixel so as to independently drive each of the first to third sub-pixels SP1 to SP3.

A second coupling line CNL2 may extend to be parallel to the extending direction of the first coupling line CNL1. The second coupling line CNL2 may be provided to the first to third sub-pixels SP1 to SP3 in common. Thus, the first to third sub-pixels SP1 to SP3 may be coupled to the second coupling line CNL2 in common.

Each of the first and second electrodes REL1 and REL2 may be provided in the emission area EMA of each of the first to third sub-pixels SP1 to SP3, and may extend in a second direction DR2 crossing the first direction DR1. The first and second electrodes REL1 and REL2 may be provided at the same plane, and may be spaced from each other by a distance (e.g., a set distance or a predetermined distance).

The first electrode REL1 may include a 1-1-th electrode REL1_1 and a 1-2-th electrode REL1_2 branched along the second direction DR2 from the first coupling line CNL1 extending in the first direction DR1. The 1-1-th electrode REL1_1, the 1-2-th electrode REL1_2, and the first coupling line CNL1 may be integrally provided to be electrically and/or physically coupled to each other.

The second electrode REL2 may extend in the second direction DR2, and may be electrically coupled to the second coupling line CNL2. In an embodiment of the present disclosure, the second electrode REL2 may be branched from the second coupling line CNL2 along the second direction DR2. Thus, the second electrode REL2 and the second coupling line CNL2 may be integrally provided to be electrically and/or physically coupled to each other.

Each of the first and second electrodes REL1 and REL2 may function as an alignment electrode for aligning the light emitting elements LD in the emission area EMA of each of the first to third sub-pixels SP1 to SP3.

Before the light emitting elements LD are aligned in the emission area EMA of each of the first to third sub-pixels SP1 to SP3, a first alignment voltage may be applied through the first coupling line CNL1 to the first electrode REL1, and a second alignment voltage may be applied through the second coupling line CNL2 to the second electrode REL2. The first alignment voltage and the second alignment voltage may have different voltage levels. As alignment voltages (e.g., set alignment voltages or predetermined alignment voltages) having different voltage levels are applied to the first electrode REL1 and the second electrode REL2, respectively, an electric field may be formed between the first electrode REL1 and the second electrode REL2. The light emitting elements LD may be aligned on the passivation layer PSV between the first electrode REL1 and the second electrode REL2 by the electric field.

When viewed on a plane, the second electrode REL2 may be provided between the 1-1-th electrode REL1_1 and the 1-2-th electrode REL1_2, and may be spaced from the 1-1-th electrode REL1_1 and the 1-2-th electrode REL1_2 by a distance (e.g., a set distance or a predetermined distance). The 1-1-th electrode REL1_1, the 1-2-th electrode REL1_2, and the second electrode REL2 may be alternately disposed on the passivation layer PSV.

After the light emitting elements LD are aligned in the emission area EMA of each of the first to third sub-pixels SP1 to SP3, each of the first and second electrodes REL1 and REL2 may function as a driving electrode for driving the light emitting elements LD.

The first and second electrodes REL1 and REL2 may be made of a material having a reflectance (e.g., a set reflectance or a predetermined reflectance) to allow light emitted from both ends EP1 and EP2 of each of the light emitting elements LD to proceed in a direction (e.g. front direction) in which an image of the display device is displayed.

In an embodiment of the present disclosure, the first and second electrodes REL1 and REL2, the first coupling line CNL1, and the second coupling line CNL2 may be provided at the same layer, and may be made of the same material.

Each of the first and second electrodes REL1 and REL2, the first coupling line CNL1, and the second coupling line CNL2 may be made of a conductive material having a reflectance (a set reflectance or a predetermined reflectance). The conductive material may include metal such as Ag, Mg, Al, Pt, Pd, Au, Ni, Nd, Ir, Cr, Ti, or an alloy of them, a conductive oxide such as an indium tin oxide (ITO), an indium zinc oxide (IZO), a zinc oxide (ZnO), or an indium tin zinc oxide (ITZO), or a conductive polymer such as Poly(3,4-ethylenedioxythiophene) (PEDOT).

The material of each of the first and second electrodes REL1 and REL2, the first coupling line CNL1, and the second coupling line CNL2 is not limited to the above-described materials.

Although each of the first and second electrodes REL1 and REL2, the first coupling line CNL1, and the second coupling line CNL2 may be formed of a single layer, but the present disclosure is not limited thereto. It may have a multi-layer structure formed by stacking two or more layers each including metal, a conductive oxide, or a conductive polymer.

Each of the first and second electrodes REL1 and REL2, the first coupling line CNL1, and the second coupling line CNL2 may be formed of a multi-layer structure so as to reduce or minimize a voltage drop due to signal delay when a signal is transmitted to both ends EP1 and EP2 of each of the light emitting elements LD.

Because the first and second electrodes REL1 and REL2 have a shape corresponding to that of the partition wall PW, light emitted from both ends EP1 and EP2 of each of the light emitting elements LD may be reflected by the first and second electrodes REL1 and REL2 to further proceed to the front of the display device. Therefore, the efficiency of light emitted from each of the light emitting elements LD may be enhanced.

In an embodiment of the present disclosure, the partition wall PW and the first and second electrodes REL1 and REL2 may serve as a reflective member that causes light emitted from each of the light emitting elements LD to proceed to the front of the display device, thus improving the light emission efficiency of the light emitting elements LD.

Any one of the first and second electrodes REL1 and REL2 may be an anode electrode, and the other one may be a cathode electrode. In an embodiment of the present disclosure, the first electrode REL1 may be an anode electrode, and the second electrode REL2 may be a cathode electrode.

In an embodiment of the present disclosure, the light emitting elements LD may be divided into a plurality of first light emitting elements LD1 aligned between the 1-1-th electrode REL1_1 and the second electrode REL2, and a plurality of second light emitting elements LD2 aligned between the second electrode REL2 and the 1-2-th electrode REL1_2.

In an embodiment of the present disclosure, the first coupling line CNL1 may be electrically coupled to the drain electrode DE of the first transistor T1 through the first contact hole CH1 of the passivation layer PSV. Because the first coupling line CNL1 is provided integrally with the first electrode REL1, a signal of the first transistor T1 applied to the first coupling line CNL1 may be transmitted to the first electrode REL1.

The first electrode REL1 may be disposed adjacent to one of both ends EP1 and EP2 of each of the light emitting elements LD, and may be electrically coupled to each of the light emitting elements LD through the first contact electrode CNE1. Thus, the signal of the first transistor T1 applied to the first electrode REL1 may be transmitted to each of the light emitting elements LD through the first contact electrode CNE1.

In an embodiment of the present disclosure, the second coupling line CNL2 may be electrically coupled to the driving voltage line DVL through the second contact hole CH2 of the passivation layer PSV. Because the second coupling line CNL2 is provided integrally with the second electrode REL2, the second driving power supply VSS of the driving voltage line DVL applied to the second coupling line CNL2 may be transmitted to the second electrode REL2.

The second electrode REL2 may be disposed adjacent to a remaining one of both ends EP1 and EP2 of each of the light emitting elements LD, and may be electrically coupled to each of the light emitting elements LD through the second contact electrode CNE2. Thus, the second driving power supply VSS applied to the second electrode REL2 may be transmitted to each of the light emitting elements LD.

A first contact electrode CNE1 may be provided on the first electrode REL1 to stably electrically and/or physically couple the first electrode REL1 and one of both ends EP1 and EP2 of each of the light emitting elements LD. The first contact electrode CNE1 may be made of a transparent conductive material so that light emitted from each of the light emitting elements LD and reflected to the front of the display device by the first electrode REL1 may proceed to the front without significant loss.

When viewed on a plane, the first contact electrode CNE1 may cover the first electrode REL1 and overlap with the first electrode REL1. Furthermore, the first contact electrode CNE1 may partially overlap with one of both ends EP1 and EP2 of each of the light emitting elements LD.

In an embodiment of the present disclosure, the first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

A third insulating layer INS3 may be provided on the first contact electrode CNE1 to cover the first contact electrode CNE1. The third insulating layer INS3 may prevent the first contact electrode CNE1 from being exposed to the outside, thus preventing the first contact electrode CNE1 from being corroded.

The third insulating layer INS3 may be an inorganic insulating layer made of inorganic material or an organic insulating layer made of organic material. Although the third insulating layer INS3 may be formed of a single layer as shown in the drawing, the present disclosure is not limited thereto. For example, the third insulating layer INS3 may be formed of a multi-layer structure. When the third insulating layer INS3 is formed of the multi-layer structure, the third insulating layer INS3 may have a structure formed by alternately stacking a plurality of inorganic insulating layers or a plurality of organic insulating layers. For example, the third insulating layer INS3 may have a structure formed by sequentially stacking the first inorganic insulating layer, the organic insulating layer, and the second inorganic insulating layer.

A second contact electrode CNE2 may be provided on the second electrode REL2. When viewed on a plane, the second contact electrode CNE2 may cover the second electrode REL2 and overlap with the second electrode REL2. Furthermore, the second contact electrode CNE2 may overlap with the second end EP2 of each of the first light emitting elements LD1 and the first end EP1 of each of the second light emitting elements LD2. The second contact electrode CNE2 may be made of the same material as that of the first contact electrode CNE1, but the present disclosure is not limited thereto.

A fourth insulating layer INS4 may be provided on the second contact electrode CNE2 to cover the second contact electrode CNE2. The fourth insulating layer INS4 may prevent the second contact electrode CNE2 from being exposed to the outside, thus preventing the second contact electrode CNE2 from being corroded. The fourth insulating layer INS4 may be formed of either of an inorganic insulating layer or an organic insulating layer.

An overcoat layer OC may be provided on the fourth insulating layer INS4. The overcoat layer OC may be a planarization layer that reduces steps generated by the partition wall PW disposed under the overcoat layer, the first and second electrodes REL1 and REL2, and the first and second contact electrodes CNE1 and CNE2 disposed under the overcoat layer. The overcoat layer OC may be an encapsulation layer to prevent oxygen and moisture from penetrating into the light emitting elements LD. In an embodiment, the overcoat layer OC may be omitted.

A voltage (e.g., a set voltage or a predetermined voltage) may be applied to both ends EP1 and EP2 of each of the light emitting elements LD through the first electrode REL1 and the second electrode REL2. Thus, each of the light emitting elements LD may emit light while electron-hole pairs are combined in the active layer 12 of each of the light emitting elements LD. Here, the active layer 12 may emit light having a wavelength range of 400 nm to 900 nm.

As described above, in an embodiment of the present disclosure, a portion of the first end EP1 among both ends EP1 and EP2 of each of the light emitting elements LD may be exposed to the outside. To be more specific, a portion of the outer periphery (or the outer circumference) 11_2 of the first conductive semiconductor layer 11 disposed on the first end EP1 of each of the light emitting elements LD and the lower surface 11_1 thereof are not covered by the insulating film 14, so that the lower surface 11_1 of the first conductive semiconductor layer 11 and a portion of the outer periphery (or the outer circumference) 11_2 thereof may be exposed. Here, the lower surface 11_1 of the first conductive semiconductor layer 11 and the portion of the outer periphery (or the outer circumference) 11_2 thereof may be a continuous coupling surface. For example, the portion of the outer periphery (or the outer circumference) 11_2 of the first conductive semiconductor layer 11 may coincide with the outer side surface 14_3b of the insulating film 14, and a remaining portion of the outer periphery (or the outer circumference) 11_2 of the first conductive semiconductor layer 11 covered by the insulating film 14 may coincide with the inner side surface 14_3a of the insulating film 14. Thus, the perimeter of the portion of the outer periphery (or the outer circumference) 11_2 of the first conductive semiconductor layer 11 may be larger than the perimeter of a remaining portion of the outer periphery (or the outer circumference) 11_2 of the first conductive semiconductor layer 11, and the first conductive semiconductor layer 11 may be implemented to have different diameters depending on whether the first conductive semiconductor layer is covered by the insulating film 14 or not.

When the lower surface 11_1 of the first conductive semiconductor layer 11 of each of the light emitting elements LD and a portion of the outer periphery (or the outer circumference) 11_2 thereof are exposed, an exposure area of the first conductive semiconductor layer 11 may be increased. If the exposure area of the first conductive semiconductor layer 11 is increased, an effective contact area between the first conductive semiconductor layer 11 of each light emitting element LD and the first contact electrode CNE1 may be further secured.

For example, as illustrated in FIGS. 20 and 21, because a portion of the outer periphery (or the outer circumference) 11_2 of the first conductive semiconductor layer 11 is exposed together with the lower surface 11_1 of the first conductive semiconductor layer 11, the first contact electrode CNE1 may also come into contact with a portion of the outer periphery (or the outer circumference) 11_2 of the first conductive semiconductor layer 11, so that the effective contact area between the first conductive semiconductor layer 11 and the first contact electrode CNE1 may be further secured.

The effective contact area of each light emitting element LD may reduce or minimize the contact failure of a corresponding light emitting element LD, and may reduce contact resistance of the first conductive semiconductor layer 11. Thereby, the element characteristics of each light emitting element LD may be improved, so that light emission efficiency of light emitted from each light emitting element LD may be improved.

While various example embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims and their equivalents.

The invention claimed is:

1. A light emitting element, comprising:
a first semiconductor layer;
an active layer on a surface of the first semiconductor layer;
a second semiconductor layer on the active layer;
an insulating film to enclose an outer periphery of each of the first semiconductor layer, the active layer, and the second semiconductor layer; and
an electrode layer on the second semiconductor layer,
wherein the first semiconductor layer comprises a first area that is covered by the insulating film, and a second area that is not covered by the insulating film,
wherein a perimeter of the outer periphery of the first semiconductor layer in the first area and a perimeter of an outer periphery of the first semiconductor layer in the second area are different from each other,
wherein the perimeter of the outer periphery of the first semiconductor layer in the second area is substantially equal to a perimeter of an outer periphery of the insulating film in the first area,
wherein the electrode layer comprises a first electrode layer on the second semiconductor layer, and a second electrode layer on the first electrode layer,
wherein the first electrode layer and the second electrode layer comprise different materials, and
wherein the first electrode layer comprises an ohmic layer in which Be is diffused, and the second electrode layer comprises a transparent metal oxide.

2. The light emitting element according to claim 1,
wherein the first semiconductor layer, the active layer, the second semiconductor layer, and the electrode layer are sequentially stacked to form an emissive stack pattern,
wherein the insulating film comprises an inner side surface that corresponds to a surface of the emissive stack pattern, and an outer side surface that is opposite to the inner side surface and does not correspond to the surface of the emissive stack pattern, and
wherein the outer periphery of the first semiconductor layer in the first area coincides with the inner side surface of the insulating film, and the outer periphery of the first semiconductor layer in the second area coincides with the outer side surface of the insulating film.

3. The light emitting element according to claim 2, wherein the perimeter of the outer periphery of the first semiconductor layer in the second area is larger than the perimeter of the outer periphery of the first semiconductor layer in the first area.

4. The light emitting element according to claim 3,
wherein a second surface of the first semiconductor layer that is opposite to a first surface of the first semiconductor layer and having no the active layer protrudes downwards from a lower end of the insulating film to be exposed to an outside, and
wherein the lower end of the insulating film is closer to the active layer than the second surface of the first semiconductor layer.

5. The light emitting element according to claim 4, wherein an upper end that is opposite to the lower end of the insulating film is positioned at a same surface as a first surface of the electrode layer on which the second semiconductor layer is not provided.

6. The light emitting element according to claim 5,
wherein the upper end that is opposite to the lower end of the insulating film protrudes upwards from the first surface of the electrode layer on which the second semiconductor layer is not provided, and
wherein the first surface of the electrode layer is closer to the active layer than the upper end of the insulating film.

7. The light emitting element according to claim 4, wherein the first semiconductor layer comprises at least one n-type semiconductor layer, and the second semiconductor layer comprises at least one p-type semiconductor layer.

8. The light emitting element according to claim 1, wherein the first electrode layer comprises a transparent metal oxide.

9. The light emitting element according to claim 1, wherein the active layer is configured to emit light having a wavelength of 400 nm to 900 nm, and comprises at least one of GaInP, AlGaInP, GaAs, AlGaAs, InP, and InAs.

10. A display device, comprising:
a substrate comprising a display area and a non-display area; and
a plurality of pixels at the display area of the substrate, and including a plurality of sub-pixels, respectively,
wherein each of the sub-pixels comprises a pixel circuit layer comprising at least one transistor, and a display element layer comprising a unit emission area to emit light,
wherein the display element layer comprises at least one light emitting element on the substrate and to emit the light, first and second electrodes spaced from each other with the light emitting element being interposed therebetween, a first contact electrode electrically coupling the first electrode and a first end of the light emitting element, and a second contact electrode electrically coupling the second electrode and a second end of the light emitting element,
wherein the light emitting element comprises:
a first semiconductor layer;
an active layer on a surface of the first semiconductor layer;
a second semiconductor layer on the active layer;
an insulating film configured to enclose an outer periphery of each of the first semiconductor layer, the active layer, and the second semiconductor layer; and
an electrode layer on the second semiconductor layer,
wherein the first semiconductor layer comprises a first area that is covered by the insulating film, and a second area that is not covered by the insulating film,
wherein a perimeter of the outer periphery of the first semiconductor layer in the first area and a perimeter of an outer periphery of the first semiconductor layer in the second area are different from each other,
wherein the perimeter of the outer periphery of the first semiconductor layer in the second area is substantially equal to a perimeter of an outer periphery of the insulating film in the first area,
wherein the electrode layer comprises a first electrode layer on the second semiconductor layer, and a second electrode layer on the first electrode layer,
wherein the first electrode layer and the second electrode layer comprise different materials, and
wherein the first electrode layer comprises an ohmic layer in which Be is diffused, and the second electrode layer comprises a transparent metal oxide.

* * * * *